United States Patent [19]

Saito et al.

[11] Patent Number: 5,371,380

[45] Date of Patent: Dec. 6, 1994

[54] SI- AND/OR GE-CONTAINING NON-SINGLE CRYSTALLINE SEMICONDUCTOR FILM WITH AN AVERAGE RADIUS OF 3.5 Å OR LESS AS FOR MICROVOIDS CONTAINED THEREIN AND A MICROVOID DENSITY 1 X 10(19) (CM-3) OR LESS

[75] Inventors: Keishi Saito; Tatsuyuki Aoike; Mitsuyuki Niwa; Toshimitsu Kariya; Yuzo Koda, all of Nagahama, Japan

[73] Assignee: Canon Kabushiki Kaisha, Tokyo, Japan

[21] Appl. No.: 188,731

[22] Filed: Jan. 31, 1994

Related U.S. Application Data

[63] Continuation of Ser. No. 45,788, Apr. 14, 1993, abandoned.

[30] Foreign Application Priority Data

Apr. 15, 1992 [JP] Japan .................................. 4-119844
Apr. 15, 1992 [JP] Japan .................................. 4-119846

[51] Int. Cl.$^5$ ............................................. H01L 45/00
[52] U.S. Cl. ........................................ 257/52; 257/53; 257/55; 257/56; 257/57; 257/65; 257/62; 257/63; 257/66; 136/258
[58] Field of Search ......................... 257/52, 53, 55, 56, 257/57, 58, 59, 62, 63, 64, 65, 66; 136/258, 261, 262

[56] References Cited

U.S. PATENT DOCUMENTS 4,615,298 10/1986 Yamazaui ..................... 118/723 R
4,698,494 10/1987 Kato et al. ..................... 250/214.1

FOREIGN PATENT DOCUMENTS 5948922 3/1984 Japan .
4249377 9/1992 Japan .
4268721 9/1992 Japan .
4318980 11/1992 Japan .

OTHER PUBLICATIONS

Mahan et al., "Small Angle X-Ray Scattering from Microvoids in the A-SiCiH Alloy," IEEE Transactions on Electron Devices, vol. 36, No. 12, Dec. 1989, pp. 2859-2862.

Mahan et al., "Characterization of Microvoids in Device-Quality Hydrogenated Amorphous Silicon by Small-Angle X-Ray Scattering and Infrared Measurements,"Physical Review B, vol. 40, No. 17, 15 Dec. 1989, pp. 12024-12027.

Pankove, Ed., *Semiconductors and Semimetals*, vol. 21, Part C, Chapter 6, 1984, Academic Press, New York, pp. 207-237.

*Primary Examiner*—William Mintel
*Attorney, Agent, or Firm*—Fitzpatrick, Cella, Harper & Scinto

[57] ABSTRACT

A non-single crystalline semiconductor containing at least one kind of atoms selected from the group consisting of silicon atoms (Si) and germanium atoms (Ge) as a matrix, and at least one kind of atoms selected from the group consisting of hydrogen atoms (H) and halogen atoms (X), wherein said non-single crystalline semiconductor has an average radius of 3.5 Å or less and a density of $1 \times 10^{19}$ (cm$^{-3}$) or less as for microvoids contained therein. The non-single crystalline semiconductor excels in semiconductor characteristics and adhesion with other materials and are effectively usable as a constituent element of various semiconductor devices.

61 Claims, 11 Drawing Sheets

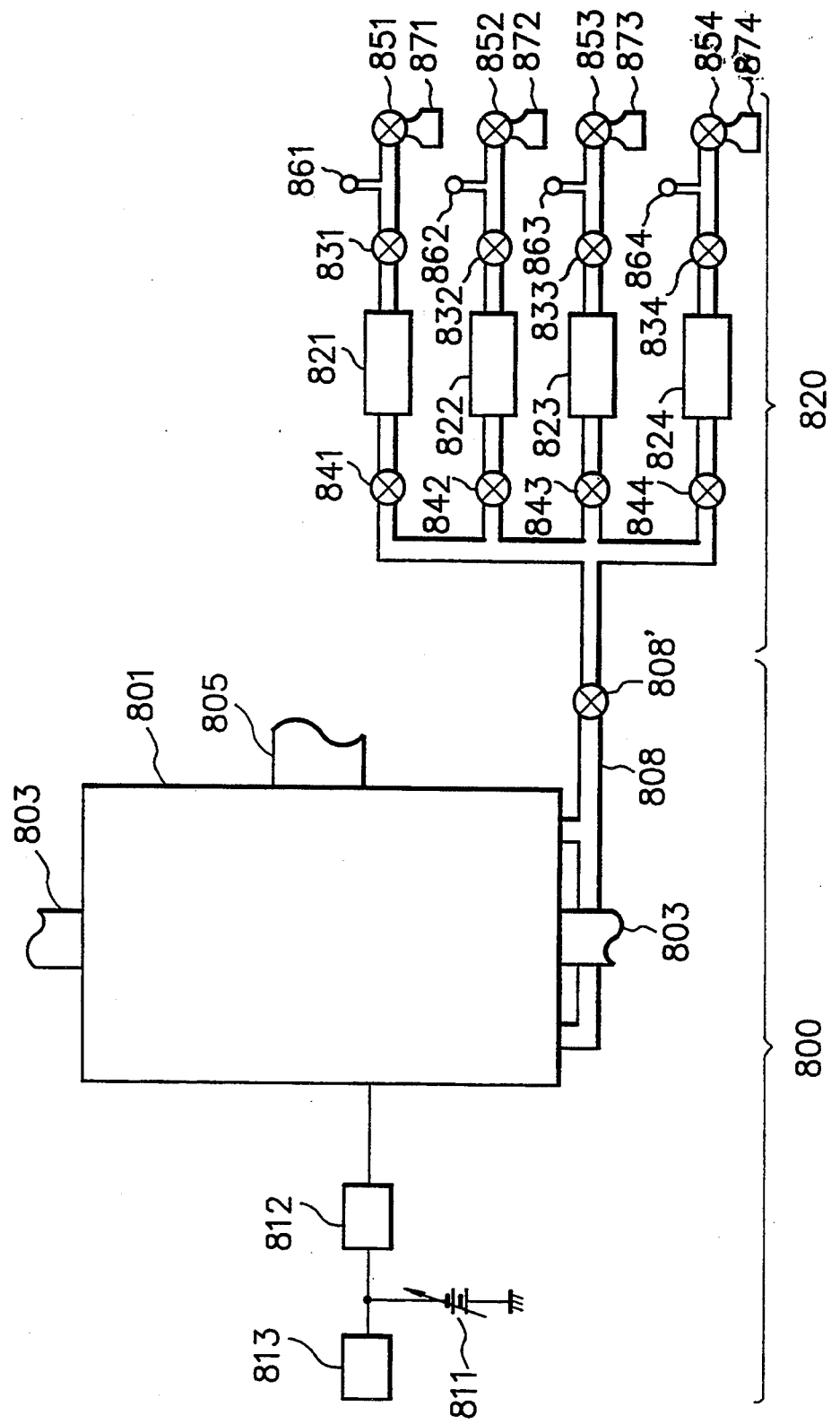

SI- AND/OR GE-CONTAINING NON-SINGLE CRYSTALLINE SEMICONDUCTOR FILM WITH AN AVERAGE RADIUS OF 3.5 A OR LESS AS FOR MICROVOIDS CONTAINED THEREIN AND A MICROVOID DENSITY 1 X 10(19) (CM-3) OR LESS

This application is a continuation of application Ser. No. 08/045,788 filed Apr. 14, 1993, now abandoned.

BACKGROUND OF THE INVENTION

1. Field of The Invention

The present invention relates to an improved non-single crystalline semiconductor material containing silicon atoms (Si) or/and germanium atoms (Ge) as a matrix and at least one kind of atoms selected from hydrogen atoms (H) and halogen atoms (X) and which has an average radius of 3.5 Å or less as for mirovoids contained therein and has a microvoid density of $1 \times 10^{19}$ (cm$^{-3}$) or less. The non-single crystalline semiconductor material according to the present invention includes an amorphous silicon semiconductor material (which includes a microcrystalline silicon semiconductor material), a polycrystalline silicon semiconductor material, an amorphous germanium semiconductor material (which includes a microcrystalline germanium semiconductor material), a polycrystalline germanium semiconductor material, an amorphous silicon germanium semiconductor material (which includes a microcrystalline silicon germanium semiconductor material), and a polycrystalline silicon germanium semiconductor material, each containing at least either hydrogen atoms (H) or halogen atoms (X) and having an average radius of 3.5 Å or less as for mirovoids contained therein and a microvoid density of $1 \times 10^{19}$ (cm$^{-3}$) or less.

Any of these non-single crystalline semiconductor materials according to the present invention excels in semiconductor characteristics and adhesion with other materials and is effectively usable as a constituent element of various semiconductor devices such as solar cells, photosensors, thin film transistors, electrophotographic light-receiving devices, and the like.

2. Related Background Art

Silicon-containing non-single crystalline semiconductor materials such as hydrogenated amorphous silicon materials (hereinafter referred to as "a-Si:H") and hydrogenated polycrystalline silicon materials (hereinafter referred to as "poly-Si:H"), germanium-containing non-single crystalline semiconductor materials such as hydrogenated amorphous germanium materials (hereinafter referred to as "a-Ge:H") and hydrogenated polycrystalline germanium materials (hereinafter referred to as "poly-Ge:H"), and other non-single crystalline semiconductor materials containing silicon and Germanium atoms such as hydrogenated amorphous silicon Germanium materials (hereinafter referred to as "a-SiGe:H") and hydrogenated polycrystalline silicon Germanium materials (hereinafter referred to as "poly-SiGe:H") have been used as photoelectric conversion elements or semiconductor elements of various electronic devices such as solar cells, thin film transistors, photosensors, electrophotographic light receiving devices, and the like.

Solar cells made of these non-single crystalline semiconductor materials have recently received much public attention because they supply clean energy without causing $CO_2$ buildup as in the case of thermal power generation. However, none of these solar cells are satisfactory particularly in terms of resistance to light degradation and photoelectric conversion efficiency in order for them to be continuously usable as a daily power source. In view of this, there is an increased demand for providing a high quality Si- or/and Ge-containing non-single crystalline semiconductor material which is effectively usable as the semiconductor active layer of solar cells, which serves to absorb incident light and generates photocarriers causing a photoelectromotive force.

Incidentally, A. H. Mahan et al. have reported that as for the conventional solar cells and thin film transistors prepared using amorphous silicon semiconductor films, their constituent amorphous silicon semiconductor contains spherical microvoids of an average radius of 4 to 6 Å and a microvoid density of more than $2 \times 10^{19}$ (cm$^{-3}$) (see, A. H. Mahan et al., *IEEE TRANSACTIONS ON ELECTRON DEVICES*, vol. 36, No. 12, December 1989, pp. 2859-2862; or A. H. Mahan et al., *PHYSICAL REVIEW B*, vol. 40, No. 17, December 1989-I, pp. 12024-12027). In these papers A. H. Mahan et al. mention that those microvoids are related to band-tail states or recombination centers (levels in the vicinity of the center of the band gap, in other words), that those microvoids contain hydrogen atoms (H) in a bonded states therein, and that such hydrogen atoms (H) in a bonded states are mobile within the microvoids, and this would be a factor of causing light degradation at the amorphous silicon film.

It should be noted that A. H. Mahan et al. have not discussed anything about germanium-containing non-single crystalline semiconductors.

The present inventors have examined microvoids contained in the conventional non-single crystalline silicon semiconductor and the conventional non-single crystalline germanium semiconductor using a commercially available scanning tunneling microscope (STM). As a result, it has been found that the microvoids contained in the non-single crystalline silicon semiconductor are either circular or elliptic in shape and of 1 to 3 atoms in depth and that the microvoids contained in the non-single crystalline germanium semiconductor are either circular or elliptic in shape and of 1 to 4 atoms in depth. And in view of the situation of atom arrangement at the peripheries of the microvoids, it has been found that a stress would be present at the peripheries of the microvoids in any of the two cases.

Further, the present inventors have examined the microvoids present in the conventional non-single crystalline germanium semiconductor by means of the small angle X-ray scattering method (SAXS). As a result, it has been found that the microvoids contained have an average radius exceeding 4 Å and are of $2 \times 10^{19}$ (cm$^{-3}$) or more in density.

From these findings, it is considered that the conventional non-single crystalline silicon semiconductors and the conventional non-single crystalline germanium semiconductors are accompanied by distortions which are deviations from crystal bonds for a considerable number of the silicon atom bonds or the germanium atom bonds. And it is considered that such distortions result in causing the foregoing problems relating to resistance to light degradation and photoelectric conversion efficiency in the case of a solar cell prepared using the conventional non-single crystalline silicon semiconductors or the conventional non-single crystalline germanium semiconductors.

The present inventors have found the following facts through experiments. That is, either a non-single crystalline silicon semiconductor film or a non-single crystalline germanium semiconductor film accompanied by such distortions as above described is not satisfactory in doping efficiency because the distortions prevent a dopant of n-type or p-type from being activated upon doping the film with said dopant. In the case of doping said non-single crystalline silicon semiconductor film or non-single crystalline germanium semiconductor film with said dopant, the dopant is often trapped within the microvoids present in the film wherein the dopant is bonded without being activated. Such non-single crystalline silicon semiconductor film or non-single crystalline germanium semiconductor film which (1) is accompanied by the distortions or (2) contains such microvoids in which the dopant is trapped and bonded without being activated, is poor in charge mobility.

SUMMARY OF THE INVENTION

The present invention aims at providing an improved, high quality silicon- or/and germanium-containing non-single crystalline semiconductor which is free of the foregoing problems which are found in the conventional non-single crystalline semiconductor.

Another object of the present invention is to provide an improved, high quality silicon- or/and germanium-containing non-single crystalline semiconductor which contains few microvoids and which is effectively usable as a semiconductor active layer of various semiconductor devices.

A further object of the present invention is to provide an improved, high quality silicon- or/and germanium-containing non-single crystalline semiconductor which excels in doping efficiency, wherein a desirable doping can be effectively attained without an impurity (a dopant) being diffused in an undesirable state.

A further object of the present invention is provide an improved, high quality silicon- or/and germanium-containing non-single crystalline semiconductor which exhibits an excellent adhesion with other members when used in the preparation of a stacked structure, wherein a junction which exhibits superior characteristics is provided.

A further object of the present invention is to provide an improved, high quality silicon- or/and germanium-containing non-single crystalline semiconductor which allows charges to effectively travel therein.

A further object of the present invention is to provide an improved, high quality silicon- or/and germanium-containing non-single crystalline semiconductor which stably exhibits satisfactory semiconductor characteristics without causing dielectric breakdown even in the case where it is in a thin film state.

A further object of the present invention is to provide an improved semiconductor device provided with a photoelectric conversion element or semiconductor element comprised of the above improved, high quality silicon-or/and germanium-containing non-single crystalline semiconductor.

BRIEF DESCRIPTION OF THE DRAWINGS

FIG. 13 is a schematic explanatory view of a microwave plasma CVD apparatus which is suitable for the production of an electrophotographic light receiving device provided with a light receiving layer comprising a germanium-containing non-single crystalline semiconductor according to the present invention or a conventional electrophotographic light receiving device provided with a light receiving layer comprising a conventional germanium-containing non-single crystalline semiconductor.

DESCRIPTION OF THE INVENTION

Figure 1:
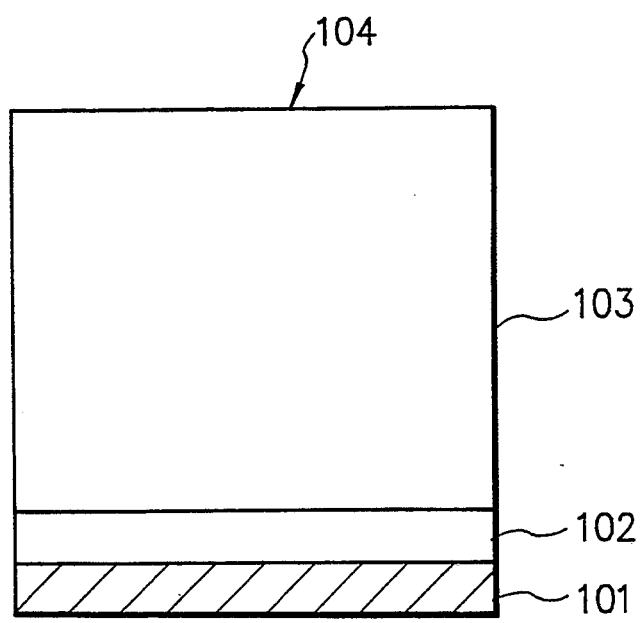
FIG. 1 is a schematic cross-section view illustrating the configuration of an electrophotographic light receiving device in which a non-single crystalline semiconductor according to the present invention is used.

The present invention has been accomplished as a result of extensive studies by the present inventors in order to eliminate the foregoing problems in the prior art and in order to attain the above objects.

The present invention provides improved, high quality non-single crystalline semiconductors each containing silicon atoms (Si) or/and germanium atoms (Ge) as a matrix and at least one kind of atoms selected from hydrogen atoms (H) and halogen atoms (X), having an average radius of 3.5 Å or less as for mirovoids contained therein, and having a microvoid density of $1 \times 10^{19}$ (cm$^{-3}$) or less, which excel in semiconductor characteristics and adhesion with other materials and are effectively usable as a constituent element of various semiconductor devices such as solar cells, photosensors, thin film transistors, electrophotographic light-receiving devices, and the like.

The improved, high quality non-single crystalline semiconductors according to the present invention includes the following embodiments.

(1) An improved non-single crystalline semiconductor containing silicon atoms (Si) as a matrix and at least one kind of atoms selected from hydrogen atoms (H) and halogen atoms (X) and which has an average radius of 3.5 Å or less as for mirovoids contained therein and has a microvoid density of $1 \times 10^{19}$ (cm$^{-3}$) or less (this non-single crystalline semiconductor will be hereinafter referred to as "non-single crystalline Si(H,X) semiconductor").

The non-single crystalline Si(H,X) semiconductor includes a-Si(H,X) semiconductor (which includes uc-Si(H,X) semiconductor) and poly-Si(H,X) semiconductor, each having an average radius of 3.5 Å or less for mirovoids contained therein and a microvoid density of $1 \times 10^{19}$ (cm$^{-3}$) or less.

(2) An improved non-single crystalline semiconductor containing Germanium atoms (Ge) as a matrix and at least one kind of atoms selected from hydrogen atoms (H) and halogen atoms (X) and which has an average radius of 3.5 Å or less as for microvoids contained therein and has a microvoid density of $1 \times 10^{19}$ (cm$^{-3}$) or less (this non-single crystalline semiconductor will be hereinafter referred to as "non-single crystalline Ge(H,X) semiconductor").

The non-single crystalline Ge(H,X) semiconductor includes a-Ge(H,X) semiconductor (which includes uc-Ge(H,X) semiconductor) and poly-Ge(H,X) semiconductor, each having an average radius of 3.5 Å or less as for microvoids contained therein and a microvoids density of $1 \times 10^{19}$ (cm$^{-3}$) or less.

(3) An improved non-single crystalline semiconductor containing silicon atoms (Si) and Germanium atoms (Ge) as a matrix and at least one kind of atoms selected from hydrogen atoms (H) and halogen atoms (X) and which has an average radius of 3.5 Å or less as for microvoids contained therein and has a microvoid density of $1 \times 10^{19}$ (cm$^{-3}$) or less (this non-single crystalline semiconductor will be hereinafter referred to as "non-single crystalline SiGe(H,X) semiconductor").

The non-single crystalline SiGe(H,X) semiconductor includes a-SiGe(H,X) semiconductor (which includes uc-SiGe(H,X) semiconductor) and poly-SiGe(H,X) semiconductor, each having an average radius of 3.5 Å or less as for microvoids contained therein and a microvoid density of $1 \times 10^{19}$ (cm$^{-3}$) or less.

The present invention also provides semiconductor devices in which any of the above-described non-single crystalline Si(H,X) semiconductor, non-single crystalline Ge(H,X) semiconductor and non-single crystalline SiGe(H,X) semiconductor is used.

Such semiconductor device includes an electrophotographic light receiving member, a stacked semiconductor device, and a thin film transistor.

A typical example of the electrophotographic light receiving member comprises a substrate and a light receiving layer disposed on said substrate, characterized in that said light receiving layer comprises one of the above-described non-single crystalline Si(H,X) semiconductor, non-single crystalline Ge(H,X) semiconductor and non-single crystalline SiGe(H,X) semiconductor.

A typical example of the stacked semiconductor device comprises a substrate having a conductive surface, a stacked semiconductor active layer disposed on said conductive surface of the substrate, said stacked semiconductor active layer comprising an n-type or p-type semiconductor layer, an i-type semiconductor layer and a p-type or n-type semiconductor layer being stacked in this order from the substrate side, and a transparent electrode disposed on said stacked semiconductor active layer, characterized in that at least one of the three semiconductor layers of said stacked semiconductor active layer comprises one of the above-described non-single crystalline Si(H,X) semiconductor, non-single crystalline Ge(H,X) semiconductor and non-single crystalline SiGe(H,X) semiconductor.

A typical example of the thin film transistor comprises a substrate, a semiconductor active layer, an insulating layer, a Gate electrode, a source electrode and a drain electrode, characterized in that said semiconductor active layer comprises one of the above-described non-single crystalline Si(H,X) semiconductor, non-single crystalline Ge(H,X) semiconductor and non-single crystalline SiGe(H,X) semiconductor.

In the following, description will be made of each of the foregoing non-single crystalline semiconductors (1) to (3) according to the present invention.

The non-single crystalline Si(H,X) semiconductor (1) according to the present invention has various advantages such that it contains few microvoids; it can be efficiently doped with a dopant in a desirable state and at an improved doping efficiency without causing undesirable dispersion of the dopant; it exhibits an excellent adhesion with other members when used in the preparation of a stacked structure wherein a junction which exhibits superior characteristics is established; it stably exhibits desirable semiconductor characteristics even in a thin film state without being deteriorated even upon repeated use with the irradiation of light over a long period of time; it excels in hole mobility; it allows charges to effectively travel therein; and it is effectively usable as a semiconductor active layer of various semiconductor devices.

Now, in a preferred embodiment of the a-Si(H,X) semiconductor having an average radius of 3.5 Å or less as for microvoids contained therein and a microvoid density of $1 \times 10^{19}$ (cm$^{-3}$) or less according to the present invention, it contains the hydrogen atoms (H) in an amount preferably in the range of from 1 to 30 atomic %, more preferably in the range of from 5 to 25 atomic % in such a state that the area ratio [SiH$_2$]/[SiH] (in terms of Gaussian distribution) between the Si—H bond (a peak at 2000 cm$^{-1}$ in IR spectrum) and the Si—H$_2$ bond (a peak at 2070–2100 cm$^{-1}$ in IR spectrum) is 1/20 or less. This a-Si semiconductor may contain halogen atoms (X) in an amount preferably in the range of from 0.1 to 10 atomic % or more preferably, in the range of from 0.1 to 5 atomic %. As the X (halogen atom), fluorine is the most desirable.

In a preferred embodiment of the poly-Si(H,X) semiconductor having an average radius of 3.5 Å or less as for microvoids contained therein and a microvoid density of $1\times10^{19}$ (cm$^{-3}$) or less according to the present invention, it contains the hydrogen atoms (H) in an amount preferably in the range of from 0.1 to 10 atomic %, more preferably in the range of from 0.1 to 5 atomic % in such a state that the area ratio [SiH$_2$]/[SiH] (in terms of Gaussian distribution) between the Si—H bond (a peak at 2000 cm$^{-1}$ in IR spectrum) and the Si—H$_2$ bond (a peak at 2070–2100 cm$^{-1}$ in IR spectrum) is 1/10 or less. This poly-Si semiconductor may contain halogen atoms (X) in an amount preferably in the range of from 0.1 to 5 atomic % or more preferably, in the range of from 0.1 to 3 atomic %. As the X (halogen atom), fluorine is the most desirable.

In any of the above a-Si(H,X) semiconductor and poly-Si(H,X) semiconductor according to the present invention, because the microvoides contained are of an average radius of 3.5 Å or less, the possibility of causing Si—H—Si bond is increased due to the hydrogen atoms (H) contained in a specific amount within the microvoids and because of this, dangling bonds of the silicon atoms (Si) are adequately compensated by the hydrogen atoms, resulting in relaxing the film structure wherein an improved smoothness is provided at the surface and an improved interface is provided while preventing occurrence of an interfacial level and interfacial distortion when stacked. In addition, because the microvoids are of a density of $1\times10^{19}$ (cm$^{-3}$) or less, the number of dangling bonds of the silicon atoms is extremely small and film distortion hardly occurs wherein the microvoids present at the surface or at the interface when stacked are of a density of $2\times10^{11}$ (cm$^{-2}$) or less.

Thus, the above a-Si(H,X) semiconductor and poly-Si(H,X) semiconductor according to the present invention have a small average radius and a small density as for the microvoids contained therein and have a small proportion of Si—H$_2$ bonds present therein, and because of this, they are small in variance in terms of semiconductor characteristics, and constraints are increased and variances are decreased when they are doped with a dopant wherein the possibility for the dopant to be tetrahedrally coordinated is increased, resulting in improving the doping efficiency of the dopant.

This situation is surpassing the conventional non-single crystalline silicon semiconductor.

The non-single crystalline Ge(H,X) semiconductor (2) and the non-single crystalline SiGe(H,X) semiconductor (3) according to the present invention respectively have various advantages such that they contain few microvoids; they can be efficiently doped with a dopant in a desirable state and at an improved doping efficiency without causing an undesirable dispersion of the dopant; they exhibit an excellent adhesion with other members when used in the preparation of a stacked structure wherein a junction which exhibits superior characteristics is established; they stably exhibit desirable semiconductor characteristics even in a thin film state without being deteriorated even upon repeated use with the irradiation of light over a long period of time; they excel in hole mobility; they allow charges to effectively travel therein; and they are effectively usable as a semiconductor active layer of various semiconductor devices.

Now, in a preferred embodiment of the a-Ge(H,X) semiconductor having an average radius of 3.5 Å or less as for microvoids contained therein and a microvoid density of $1\times10^{19}$ (cm$^{-3}$) or less according to the present invention, it contains the hydrogen atoms (H) in an amount preferably in the range of from 1 to 30 atomic %, more preferably in the range of from 5 to 25 atomic % in such a state that the area ratio [GeH$_2$]/[GeH] (in terms of Gaussian distribution) between the Ge—H bond (a peak at 1880 cm$^{-1}$ in IR spectrum) and the Ge—H$_2$ bond (a peak at 1980 cm$^{-1}$ in IR spectrum) is 1/20 or less. This a-Ge semiconductor may contain halogen atoms (X) in an amount preferably in the range of from 0.1 to 10 atomic % or more preferably, in the range of from 0.1 to 5 atomic %. As the X (halogen atom), fluorine is the most desirable.

In a preferred embodiment of the poly-Ge(H,X) semiconductor having an average radius of 3.5 Å or less as for microvoids contained therein and a microvoid density of $1\times10^{19}$ (cm$^{-3}$) or less according to the present invention, it contains the hydrogen atoms (H) in an amount preferably in the range of from 0.1 to 10 atomic %, more preferably in the range of from 0.1 to 5 atomic % in such a state that the area ratio [GeH$_2$]/[GeH] (in terms of Gaussian distribution) between the Ge—H bond (a peak at 1880 cm$^{-1}$ in IR spectrum) and the Ge—H$_2$ bond (a peak at 1980 cm$^{-1}$ in IR spectrum) is 1/10 or less. This poly-Ge semiconductor may contain halogen atoms (X) in an amount preferably in the range of from 0.1 to 5 atomic % or more preferably, in the range of from 0.1 to 3 atomic %. As the X (halogen atom), fluorine is the most desirable.

In any of the above a-Ge(H,X) semiconductor and poly-Ge(H,X) semiconductor according to the present invention, because the microvoids contained are of an average radius of 3.5 Å or less, the possibility of causing Ge—H—Ge bond is increased due to the hydrogen atoms (H) contained in a specific amount within the microvoids and because of this, dangling bonds of the germanium atoms (Ge) are adequately compensated by the hydrogen atoms, resulting in relaxing the film structure wherein an improved smoothness is provided at the surface and an improved interface is provided while preventing occurrence of an interfacial level and interfacial distortion when stacked. In addition, because the microvoids contained are of a density of $1\times10^{19}$ (cm$^{-3}$) or less, the number of dangling bonds of the germanium atoms is extremely small and film distortion hardly occurs wherein the microvoids present at the surface or at the interface when stacked are of a density of $2\times10^{11}$ (cm$^{-2}$) or less.

Thus, the above a-Ge(H,X) semiconductor and poly-Ge(H,X) semiconductor according to the present invention have a small average radius and a small density as for the microvoids contained therein and have a small proportion of Si—H$_2$ bonds present therein, and because of this, they are small in variance in terms of semiconductor characteristics, and constraints are increased and variances are decreased when they are doped with a dopant wherein the possibility for the dopant to be tetrahedrally coordinated is increased, resulting in improving the doping efficiency of the dopant.

This situation is surpassing the conventional non-single crystalline germanium semiconductor.

In a preferred embodiment of the a-SiGe(H,X) semiconductor having an average radius of 3.5 Å or less as for microvoids contained therein and a microvoid density of $1 \times 10^{19}$ (cm$^{-3}$) or less according to the present invention, it contains the hydrogen atoms (H) in an amount preferably in the range of from 1 to 30 atomic %, more preferably in the range of from 5 to 25 atomic % in such a state that the area ratio [GeH$_2$]/[GeH] (in terms of Gaussian distribution) between the Ge—H bond (a peak at 1880 cm$^{-1}$ in IR spectrum) and the Ge—H$_2$ bond (a peak at 1980 cm$^{-1}$ in IR spectrum) is 1/20 or less and that the area ratio [SiH$_2$]/[SiH] (in terms of Gaussian distribution) between the Si—H bond (a peak at 2000 cm$^{-1}$ in IR spectrum) and the Si—H$_2$ bond (a peak at 2100 cm$^{-1}$ in IR spectrum) is 1/20 or less. This a-SiGe semiconductor may contain halogen atoms (X) in an amount preferably in the range of from 0.1 to 10 atomic % or more preferably, in the range of from 0.1 to 5 atomic %. As the X (halogen atom), fluorine is the most desirable.

In a preferred embodiment of the poly-SiGe(H,X) semiconductor having an average radius of 3.5 Å or less as for microvoids contained therein and a microvoid density of $1 \times 10^{19}$ (cm$^{-3}$) or less according to the present invention, it contains the hydrogen atoms (H) in an amount preferably in the range of from 0.1 to 10 atomic %, more preferably in the range of from 0.1 to 5 atomic % in such a state that the area ratio [GeH$_2$]/[GeH] (in terms of Gaussian distribution) between the Ge—H bond (a peak at 1880 cm$^{-1}$ in IR spectrum) and the Ge—H$_2$ bond (a peak at 1980 cm$^{-1}$ in IR spectrum) is 1/10 or less and that the area ratio [SiH$_2$]/[SiH] (in terms of Gaussian distribution) between the Si—H bond (a peak at 2000 cm$^{-1}$ in IR spectrum) and the Si—H$_2$ bond (a peak at 2070 to 2100 cm$^{-1}$ in IR spectrum) is 1/10 or less. This poly-SiGe semiconductor may contain halogen atoms (X) in an amount preferably in the range of from 0.1 to 5 atomic % or more preferably, in the range of from 0.1 to 3 atomic %. As the X (halogen atom), fluorine is the most desirable.

In any of the above a-SiGe(H,X) semiconductor and poly-SiGe(H,X) semiconductor according to the present invention, because the microvoids contained therein is of an average radius of 3.5 Å or less, the possibility of causing Si—H—Si and Si—H—Ge bonds is increased due to the hydrogen atoms (H) contained in a specific amount within the microvoids and because of this, dangling bonds of the silicon atoms (Si) or/and dangling bonds of the germanium atoms (Ge) are adequately compensated by the hydrogen atoms, resulting in relaxing the film structure wherein an improved smoothness is provided at the surface and an improved interface is provided while preventing occurrence of an interfacial level and interfacial distortion when stacked. In addition, because the microvoids contained are of a density of $1 \times 10^{19}$ (cm$^{-3}$) or less, the number of dangling bonds of the silicon and germanium atoms is extremely small and film distortion is hardly occurred wherein the microvoids present at the surface or at the interface when stacked are of a density of $2 \times 10^{11}$ (cm$^{-2}$) or less. Further in addition, any of the a-SiGe(H,X) semiconductor and poly-SiGe(H,X) is in a state that the forbidden band width is desirably controlled.

Thus, the above a-SiGe(H,X) semiconductor and poly-SiGe(H,X) semiconductor according to the present invention have a small average radius and a small density as for the microvoids contained and have a small proportion of Si—H$_2$ bonds and Ge—H$_2$ bonds present therein, and because of this, they are small in variance in terms of semiconductor characteristics, and constraints are increased and variances are decreased when they are doped with a dopant wherein the possibility for the dopant to be tetrahedrally coordinated is increased, resulting in improving the doping efficiency of the dopant.

This situation is surpassing the conventional non-single crystalline germanium semiconductor.

Any of the foregoing non-single crystalline semiconductors (1) to (3) according to the present invention may be formed by a film-forming method by a microwave plasma CVD process in which direct current (DC) bias and high frequency bias (hereinafter referred to as RF bias) are concurrently applied together with the application of microwave energy upon film formation, wherein heavy hydrogen gas is used together with film-forming raw material gas.

A typical embodiment of this film-forming method for forming such a non-single crystalline semiconductor (that is, a non-single crystalline semiconductor film) comprises the steps of:

(a) placing a substrate having a conductive substrate on which a film is to be formed into a film-forming chamber of a microwave plasma CVD apparatus equipped with a DC power application mechanism and a RF power application mechanism, (b) heating the surface of the substrate to a temperature of 25° to 650° C. and maintaining it at this temperature, (c) introducing film-forming raw material gas (that is, Si-imparting raw material gas or/and Ge-imparting raw material gas and heavy hydrogen gas into the film-forming chamber while regulating their flow rates at respective predetermined values, (d) adjusting the inner pressure of the film-forming chamber at a vacuum of 0.1 to 10 mTorr, and (e) applying microwave energy with a frequency of 100 MHz to 10 GHz into the film-forming chamber, simultaneously with this, applying DC bias with a voltage of 10 to 200 V into the film-forming chamber through the substrate and also applying RF bias with a frequency of 500 kHz to 50 MHz into the film-forming chamber at a predetermined power versus the flow rate of the raw material gas, i.e., at $5 \times 10^{-2}$ to 400 W/sccm, wherein plasma is produced to cause the formation of a desired semiconductor film on the conductive surface of the substrate.

The application of the DC bias is desired to be conducted such that the substrate side becomes negative in polarity.

The heavy hydrogen gas may be introduced into the film-forming chamber either independently from or together with the film-forming raw material gas.

In the film-forming method above described, (i) the microwave energy applied into the film-forming chamber containing the film-forming raw material gas and heavy hydrogen gas therein, the inner pressure of which being maintained at 0.1 to 10 mTorr, serves to cause plasma discharge which is continuously maintained, wherein active species A generated from the film-forming raw material as a result of decomposition are of relatively long mean free path, and film formation is conducted in a state free of occurrence of polymerization due to vapor phase reaction; (ii) the RF bias applied serves to bias the substrate side to be negative in polarity against a counter electrode whereby controlling the distribution of charges in the plasma, wherein positive ions are accelerated and collided with the surface of the substrate whereby promoting relaxation reaction at the surface of the substrate; (iii) the DC bias applied serves to control the distribution of charges in the plasma with relatively small energy and to make energy of positive ions directed toward the substrate greater, whereby the relaxation reaction at the surface of the substrate is further promoted; (iv) simultaneous application of the RF bias and the DC bias serves to prevent occurrence of abnormal discharge in the film-forming chamber; and (v) the heavy hydrogen gas is excited with the action of the microwave energy applied to generate active species (D) while radiating ultraviolet ray, the intensity of the ultraviolet ray being stronger than that radiated by $H_2$ gas, wherein the ultraviolet ray behaves to activate the active species A and it is absorbed by a film deposited on the surface of the substrate whereby weak bonds present in the film are disconnected while promoting the relaxation reaction at the surface of the substrate in combination with the above effects by the RF bias and the DC bias. Because of these effects (i) to (v), the above film-forming method makes it possible to obtain any of the foregoing non-single crystalline semiconductors (1) to (3) according to the present invention.

Now, heavy hydrogen gas used upon film formation by way of the microwave plasma CVD process using the RF bias and the DC bias plays an important role in order to obtain a desired non-single crystalline Si(H,X), Ge(H,X) or SiGe(H,X) semiconductor having an average radius of 3.5 Å or less as for microvoids contained therein and a microvoid density of $1 \times 10^{19}$ (cm$^{-3}$) or less according to the present invention. That is, as above described, when the heavy hydrogen gas is contacted with microwave energy applied in the film-forming chamber, it is excited with the action of the microwave energy to produce active species (D) while radiating ultraviolet ray with a relatively strong intensity, and the ultraviolet ray radiated behaves to activate the active species A generated as a result of the decomposition of the film-forming raw material gas (that is, the Si-imparting raw material gas or/and the Ge-imparting raw material gas) with the action of microwave energy applied and it is absorbed by a film deposited on the substrate by way of mutual chemical reaction among the active species A and the active species (D) wherein weak bonds present in the film are disconnected due to the action of the ultraviolet ray absorbed, whereby the film becomes dense in texture to provide such a non-single crystalline Si(H,X), Ge(H,X) or SiGe(H,X) semiconductor having an average radius of 3.5 Å or less as for microvoids contained therein and a microvoid density of $1 \times 10^{19}$ (cm$^{-3}$) or less.

Incidentally, heavy hydrogen gas is of an atomic weight which is greater than that of $H_2$ gas, and because of this, the non-single crystalline Si(H,X), Ge(H,X) or SiGe(H,X) semiconductor having an average radius of 3.5 Å or less as for microvoids contained therein and a microvoid density of $1 \times 10^{19}$ (cm$^{-3}$) or less according to the present invention is superior to other non-single crystalline semiconductors formed using $H_2$ gas in terms of deterioration upon light irradiation which is caused due to the hydrogen atoms (H) contained.

As for the amount of the heavy hydrogen to be introduced into the film-forming chamber, it is properly determined in the range of from 0.5 to 100 in volume ratio versus the volumetric amount of the film-forming raw material gas introduced into the film-forming chamber.

As the Si-imparting raw material as the film-forming raw material used, there can be mentioned gaseous or easily gasifiable silicon hydrides such as $SiH_4$, $Si_2H_6$, $Si_3H_8$, $Si_4H_{10}$, etc. Among these silicon hydrides, $SiH_4$ and $Si_2H_6$ are the most appropriate in view of easiness in layer forming work and good efficiency in supplying Si atoms.

As the Ge-imparting raw material as the film-forming raw material used, there can be mentioned gaseous or easily gasifiable germanium hydrides such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc., halogen-substituted silicon hydrides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc., and germanium halides such as $GeF_4$, $GeCl_4$, $GeBr_4$, $GeI_4$, $GeF_2$, $GeCl_2$, $GeBr_2$, $GeI_2$, etc.

In the case of forming a non-single crystalline Si:H:X, Ge:H:X or SiGe:H:X semiconductor incorporated with halogen atoms (X) having an average radius of 3.5 Å or less as for microvoids contained therein and a microvoid density of $1 \times 10^{19}$ (cm$^{-3}$) or less according to the present invention, an appropriate raw material capable of imparting halogen atoms (X) is used in addition to the foregoing film-forming raw material (that is, the Si-imparting raw material or/and the Ge-imparting raw material) and the heavy hydrogen gas. As such halogen-imparting raw material, there can be mentioned gaseous or easily gasifiable halogen compounds such as gaseous halogen, halides, interhalogen compounds, and halogen-substituted silane derivatives. Specifically, they can include halogen gas of fluorine, chlorine, bromine or iodine; interhalogen compounds such as BrF, $BrF_3$, $BrF_5$, ClF, $ClF_3$, IBr, ICl, $IF_3$, $IF_7$, and the like; and silicon halides such as $SiF_4$, $Si_2F_6$, $SiCl_4$, $SiBr_4$, and the like.

The use of the gaseous or easily gasifiable silicon halides as above described is particularly advantageous since the non-single crystalline Si:H:X semiconductor can be formed with no additional use of the Si-imparting raw material.

Similarly, the use of the gaseous or easily gasifiable germanium halides as above described is particularly advantageous since the non-single crystalline Ge:H:X semiconductor can be formed with no additional use of the Ge-imparting raw material.

In the case of forming such a non-single crystalline Si:H:X, Ge:H:X or SiGe:H:X semiconductor incorporated with halogen atoms (X) having an average radius of 3.5 Å or less as for microvoids contained therein and a microvoid density of $1 \times 10^{19}$ (cm$^{-3}$) or less, typically, a mixture of a gaseous silicon halide as the Si-imparting raw material or/and a gaseous germanium halide as the Ge-imparting raw material and heavy hydrogen gas is introduced into the film-forming chamber in a predetermined mixing ratio and at a predetermined flow rate, and the gases thus introduced are exposed to the action of glow discharge to thereby cause gas plasma resulting in forming said non-single crystalline semiconductor on the substrate.

As above described, any of the foregoing non-single crystalline semiconductors (1) to (3) according to the present invention may be made to be of a desired conduction type by incorporating a given valence electron controlling agent (that is, a commonly called dopant)

thereinto. Such dopant can include elements belonging to Group III and elements belonging to Group V of the Periodic Table.

In order to obtain such non-single crystalline semiconductor doped with atoms of a selected element as the dopant, a gaseous or easily gasifiable raw material capable of imparting such dopant is introduced into the film-forming chamber upon the film formation in accordance with the film-forming method.

Specifically, the gaseous or easily gasifiable raw material capable of imparting atoms of an element of Group III of the Periodic Table can include, for example, boron hydrides such as $B_2H_6$, $B_4H_{10}$, $B_5H_9$, $B_5H_{11}$, $B_6H_{10}$, $B_6H_{12}$, and $B_6H_{14}$; boron halides such as $BF_3$, $BCl_3$, and $BBr_3$; and other than these, $AlCl_3$, $GaCl_3$, $InCl_3$, and $TlCl_3$.

The gaseous or easily gasifiable raw material capable of imparting atoms of an element of Group V of the Periodic Table can include, for example, phosphorous hydrides such as $Ph_3$, and $P_2H_4$; phosphorous halides such as $PH_4I$, $PF_3$, $PF_5$, $PCl_3$, $PCl_5$, $PBr_3$, $PBr_5$, and $PI_3$; and other than these, $AsH_3$, $AsF_3$, $AsCl_3$, $AsBr_3$, $AsF_5$, $SbH_3$, $SbF_5$, $SbCl_3$, $SbCl_5$, $BiH_3$, $BiCl_3$, and $BiBr_3$.

As for the microwave energy employed in the foregoing film-forming method, it is desired to be of a frequency of 100 MHz to 10 GHz as above described. In the most preferable embodiment, it is of a frequency of 2.45 GHz.

As above described, in the foregoing film-forming method which provides a desired non-single crystalline Si(H,X), Ge(H,X) or SiGe(H,X) semiconductor having an average radius of 3.5 Å or less as for microvoids contained therein and a microvoid density of $1 \times 10^{19}$ (cm$^{-3}$) or less according to the present invention, it is essential to employ the DC bias and the RF bias in combination in addition to the microwave energy.

As for DC bias, it is desired to be applied with a voltage of 10 to 200 V upon film formation. In a preferred embodiment, the DC bias is applied such that the substrate side becomes negative in polarity.

As for the RF bias, it is desired to be of a frequency of 500 kHz to 50 MHz. In the most preferable embodiment, it is of a frequency of 13.56 MHz. As for the power of the RF bias applied, it is desired to be $5 \times 10^{-2}$ to 400 W versus the flow rate (sccm) of the film-forming raw material gas (that is, the Si-imparting raw material gas or/and the Ge-imparting raw material gas).

In the foregoing film-forming method which provides a desired non-single crystalline Si(H,X), Ge(H,X) or SiGe(H,X) semiconductor having an average radius of 3.5 Å or less as for microvoids contained therein and a microvoid density of $1 \times 10^{19}$ (cm$^{-3}$) or less according to the present invention, the inner pressure of the film-forming chamber upon film formation is one of the very important factors. It is adjusted to be in the range of from 0.1 mTorr to 10 mTorr. In addition to this, the power of the microwave energy with a frequency of 100 MHz to 10 GHz to be applied is also a very important factor. It is adjusted to be in the range of from 1 W to 10 W versus the flow rate (sccm) of the film-forming raw material gas (that is, the Si-imparting raw material gas or/and the Ge-imparting raw material gas).

Further, in the foregoing film-forming method which provides a desired non-single crystalline Si(H,X), Ge(H,X) or SiGe(H,X) semiconductor having an average radius of 3.5 Å or less as for microvoids contained therein and a microvoid density of $1 \times 10^{19}$ (cm$^{-3}$) or less according to the present invention, the temperature of the substrate upon film formation is an important factor since it governs the crystallinity (amorphous or polycrystalline property) of a semiconductor (that is, a film) to be formed. In general, it should be determined chiefly depending upon the deposition rate for the film formed and the crystallinity desired for the film formed. Specifically, in the case of forming an amorphous semiconductor (film) (that is, a-Si(H,X), a-Ge(H,X) or a-SiGe(H,X) semiconductor (film)) having an average radius of 3.5 Å or less as for microvoids contained therein and a microvoid density of $1 \times 10^{19}$ (cm$^{-3}$) or less at a relatively low deposition rate of some angstroms (Å), it is desired to be set at a relatively low temperature in the range of from 25° to 400° C. In the case of forming said amorphous semiconductor (film) at a relatively high deposition rate which is higher than the above deposition rate, it is desired to set at a relatively high temperature in the range of from 250° to 650° C.

In the case of forming a polycrystalline semiconductor (film) (that is, poly-Si(H,X), poly-Ge(H,X) or poly-SiGe(H,X) semiconductor (film)) having an average radius of 3.5 Å or less as for microvoids contained therein and a microvoid density of $1 \times 10^{19}$ (cm$^{-3}$) or less at a relatively low deposition rate of some angstroms (Å), it is desired to be set at a relatively high temperature in the range of from 200° to 600° C.

The present invention will be explained with reference to the following experiments. It should be noted that these experiments are not intended to limit the scope of the invention.

Experiment 1 and Comparative Experiment 1

Experiment 1

There were prepared nine non-single crystalline Si:H semiconductor samples (Sample Nos. ES 1-1 to ES 1-9), which are different from each other with regard to the amount of a dopant contained or the kind of a dopant contained wherein Sample No. ES 1-5 contains no dopant (see, Table 1), by practicing the foregoing film-forming method using a microwave plasma CVD apparatus of the constitution shown in FIG. 5. Each of these samples was examined with respect to doping efficiency, microvoids contained, and crystallinity.

Firstly, description will be made of the microwave plasma CVD apparatus shown in FIG. 5.

Figure 5:
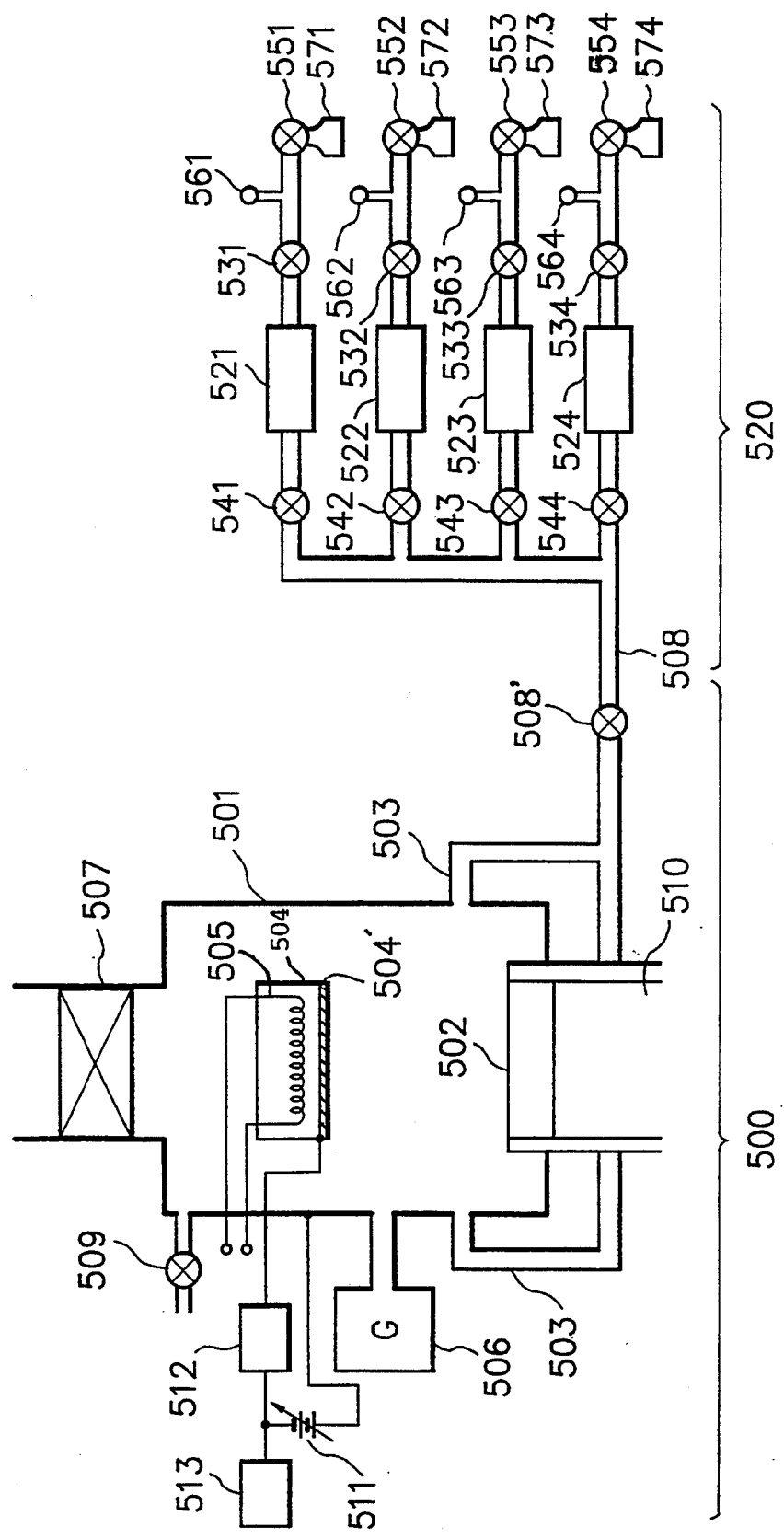
FIG. 5 is a schematic explanatory view of a microwave plasma CVD apparatus which is suitable for the formation of a non-single crystalline semiconductor according to the present invention.

The microwave plasma CVD apparatus shown in FIG. 5 comprises a raw material gas supply system 520 and a film formation system 500.

The film formation system 500 includes a deposition chamber 501 which contains a substrate holder 504 equipped with an electric heater 505. Reference numeral 504' indicates a substrate on which a film is to be formed, which is positioned on the surface of the substrate holder 504. Reference numeral 510 indicates a waveguide extending from a microwave power source (not shown). The waveguide 510 is connected to a microwave transmissive window 502 hermetically mounted at a lower wall of the deposition chamber 501. Reference numeral 503 indicates a gas feed pipe which is connected to a circular gas feed pipe (not shown) arranged in the deposition chamber 501. The circular gas feed pipe is arranged such that it is situated along the inner face of the circumferential of the deposition chamber 501 and that it circumscribes a discharge space between the substrate 504' and the microwave transmissive window 502 in the deposition chamber 501. The circular gas feed pipe arranged in the deposition chamber 501 is provided with a plurality of gas liberation holes (not shown) capable of introducing a raw material gas into the discharge space. The gas feed pipe 503 is extending from a gas transportation conduit 508 which is extending from the gas supply system 520.

The deposition chamber 501 is provided with an exhaust pipe equipped a conductance valve 507. The exhaust pipe is connected to a vacuum pump (not shown). Reference numeral 509 indicates a leak valve provided at a leak pipe connected to the deposition chamber 501. Reference numeral 513 indicates a RF power source which is electrically connected through a matching box to the substrate holder 504. Reference numeral 511 indicates a direct current (DC) power source which is electrically connected to the deposition chamber 501. The deposition chamber 501 is provided with a vacuum gage 506.

The gas supply system 520 includes gas reservoirs 571, 572, 573, and 574 which are charged with raw material gases, particularly, $SiH_4$ gas of 99.99% in purity in the gas reservoir 571, heavy hydrogen gas (hereinafter referred to as "$D_2$ gas") of 99.6% in purity in the gas reservoir 572, $PH_3$ gas (purity: 99.999%) diluted with $H_2$ gas to 10% (hereinafter referred to as "$PH_3/H_2$ gas (10%)") or $PH_3$ gas (purity: 99.999%) diluted with $H_2$ gas to 10 ppm (hereinafter referred to as "$PH_3/H_2$ gas (10 ppm)") in the gas reservoir 573, and $B_2H_6$ gas (purity: 99.999%) diluted with $H_2$ gas to 10% (hereinafter referred to as "$B_2H_6/H_2$ gas (10%)") or $B_2H_6$ gas (purity: 99.999%) diluted with $H_2$ gas to 10 ppm (hereinafter referred to as "$B_2H_6/H_2$ gas (10 ppm)") in the gas reservoir 574.

Each of the gas reservoirs 571, 572, 573 and 574 is connected to the gas transportation conduit 508 through a pipe way provided with a valve 551, 552, 553 or 554, a pressure gage 561, 562, 563 or 564, an inlet valve 531, 532, 533 or 534, a mass flow controller 521, 522, 523 or 524, and an exit valve 541, 542, 543 or 544. The gas transportation conduit 508 is provided with a sub-valve 508'.

Now, the microwave plasma CVD apparatus shown in FIG. 5 is operated before film formation starts. That is, prior to the entrance of raw material gases into the deposition chamber 501, it is confirmed that the valves 551 through 554 and the leak valve 509 are closed and that the inlet valves 531 through 534, the exit valves 541 through 544, and the sub-valve 508' are opened. Then, the conductance valve 507 for the exhaust pipe is opened to evacuate the inside of the deposition chamber 501 and gas piping while operating the vacuum pump (not shown). Then, upon observing that the reading on the vacuum gage 506 became about $1 \times 10^{-4}$ Torr, the sub-valve 508' and the exit valves 541 through 544 are closed.

The nine non-single crystalline Si:H semiconductor samples (Sample Nos. ES 1-1 to ES 1-9) were prepared in the following manner using the microwave plasma CVD apparatus shown in FIG. 5.

Firstly, there were provided nine SUS 304 stainless steel plates of 1 inch (width)$\times$1.5 inches (length) in size and 1 mm in thickness each having a mirror ground surface as the substrate 504'. On each of the stainless steel plates was formed a 0.1 $\mu$m thick Cr film by means of a conventional electron beam evaporation technique. Each of the stainless steel plates each having the Cr thin film thereon as the substrate 504' was subjected to film formation.

Preparation of Sample No. ES 1-1

The substrate 504' comprising the above stainless steel plate having the Cr thin film thereon was fixed to the surface of the substrate holder 504. The inside of the deposition chamber 501 was evacuated to a vacuum of about $1 \times 10^{-4}$ Torr by operating the vacuum pump in the manner as above described. The substrate 504' was heated to and maintained at 400° C. by actuating the heater 505. Then, the valves 551, 552 and 554 and the exit valves 541, 542 and 544 were opened. Then, the inlet valves 531, 532 and 534 and the sub-valve 508' were gradually opened to introduce $SiH_4$ gas, $D_2$ gas and $B_2H_6/H_2$ gas (10%) into the deposition chamber 501 through the gas feed pipe 503 and the above described circular gas feed pipe (not shown), when the $SiH_4$ gas and the $D_2$ gas were regulated at respective flow rates of 5 sccm and 100 sccm by means of the mass flow controllers 521 and 522, and the $B_2H_6/H_2$ gas (10%) was regulated at 5 sccm (see, Table 1) by means of the mass flow controller 524. The inner pressure of the deposition chamber 501 was controlled to and maintained at a vacuum of 2 mTorr by adjusting the opening of the conductance valve 507 while reading the vacuum gage 506. After the flow rate of each of the above raw material gases became stable at the above respective flow rates, the DC power source 511 was switched on to apply a DC bias voltage of $-100$ V to the deposition chamber 501, simultaneously with this, the RF power source 513 was switched on to apply a RF power of 1 $mW/cm^3$ to the substrate 504' through the matching box 512. At the same time, the microwave power source (not shown) was switched on to apply a microwave power of 70 $mW/cm^3$ into the deposition chamber 501 through the wave guide 510 and the microwave transmissive window 502. As a result, discharge was occurred in the deposition chamber 501, wherein the $SiH_4$ gas, $D_2$ gas and $B_2H_6/H_2$ gas (10%) were decomposed to cause plasma, resulting in forming a non-single crystalline Si:H:B semiconductor film on the Cr thin film of the substrate 504'. The film formation was continued until the non-single crystalline Si:H:B semiconductor film became 3 $\mu$m thick.

Thereafter, the microwave power source, the RF power source and the DC power source were switched off. And the exit valves 541, 542 and 544 and the sub-valve 508' were closed. After the substrate 504' was cooled to room temperature, it was taken out from the deposition chamber 501.

The above film-forming conditions are shown in Tables 1 and 2.

On the surface of the resultant, there was formed a 0.1 um thick Cr film as an upper electrode by means of a conventional electron beam evaporation technique.

Thus, there was obtained a non-single crystalline Si:H:B semiconductor sample (Sample No. ES 1-1).

Preparation of Sample No. ES 1-2

The procedures of preparing the Sample No. ES 1-1 were repeated, except that the flow rate of the $B_2H_6/H_2$ gas (10%) was changed to 0.5 sccm (see, Table 1), to thereby obtain a non-single crystalline Si:H:B semiconductor sample (Sample No. ES 1-2).

Preparation of Sample No. ES 1-3

The procedures of preparing the Sample No. ES 1-1 were repeated, except that the $B_2H_6/H_2$ gas (10%) was replaced by $B_2H_6/H_2$ gas (10 ppm) and the $B_2H_6/H_2$ gas (10 ppm) was introduced into the deposition chamber 501 at a flow rate of 25 sccm (see, Table 1), to thereby obtain a non-single crystalline Si:H:B semiconductor sample (Sample No. ES 1-3).

Preparation of Sample No. ES 1-4

The procedures of preparing the Sample No. ES 1-3 were repeated, except that the flow rate of the $B_2H_6/H_2$ gas (10 ppm) was changed to 5 sccm (see, Table 1), to thereby obtain a non-single crystalline Si:H:B semiconductor sample (Sample No. ES 1-4).

Preparation of Sample No. ES 1-5

The procedures of preparing the Sample No. ES 1-1 were repeated, except that the $B_2H_6/H_2$ gas (10%) was not used (see, Table 1), to thereby obtain a non-single crystalline Si:H semiconductor sample (Sample No. ES 1-5).

Preparation of Sample No. ES 1-6

The procedures of preparing the Sample No. ES 1-1 were repeated, except that the $B_2H_6/H_2$ gas (10%) was replaced by $PH_3/H_2$ gas (10 ppm) from the gas reservoir 573 and the $PH_3/H_2$ gas (10 ppm) was introduced into the deposition chamber 501 at a flow rate of 5 sccm (see, Table 1), to thereby obtain a non-single crystalline Si:H:P semiconductor sample (Sample No. ES 1-6).

Preparation of Sample No. ES 1-7

The procedures of preparing the Sample No. ES 1-6 were repeated, except the flow rate of the $PH_3/H_2$ gas (10 ppm) was changed to 25 sccm (see, Table 1), to thereby obtain a non-single crystalline Si:H:P semiconductor sample (Sample No. ES 1-7).

Preparation of Sample No. ES 1-8

The procedures of preparing the Sample No. ES 1-1 were repeated, except that the $B_2H_6/H_2$ gas (10%) was replaced by $PH_3/H_2$ gas (10%) from the gas reservoir 573 and the $PH_3/H_2$ gas (10%) was introduced into the deposition chamber 501 at a flow rate of 0.5 sccm (see, Table 1), to thereby obtain a non-single crystalline Si:H:P semiconductor sample (Sample No. ES 1-8).

Preparation of Sample No. ES 1-9

The procedures of preparing the Sample No. ES 1-8 were repeated, except that the flow rate of the $PH_3/H_2$ gas (10%) was changed to 5 sccm (see, Table 1), to thereby obtain a non-single crystalline Si:H:P semiconductor sample (Sample No. ES 1-9).

Comparative Experiment 1

There were prepared comparative nine non-single crystalline Si:H semiconductor samples (Sample Nos. CS 1-1 to CS 1-9), which are different from each other with regard to the amount of a dopant contained or the kind of a dopant contained wherein Sample No. CS 1-5 contains no dopant (see, Table 3), using a conventional high frequency (RF) glow discharge decomposition apparatus (hereinafter referred to as RF plasma CVD apparatus) of the constitution shown in FIG. 7. Each of these samples was examined with respect to doping efficiency, microvoids contained, and crystallinity.

Firstly, description will be made of the RF plasma CVD apparatus shown in FIG. 7.

Figure 7:
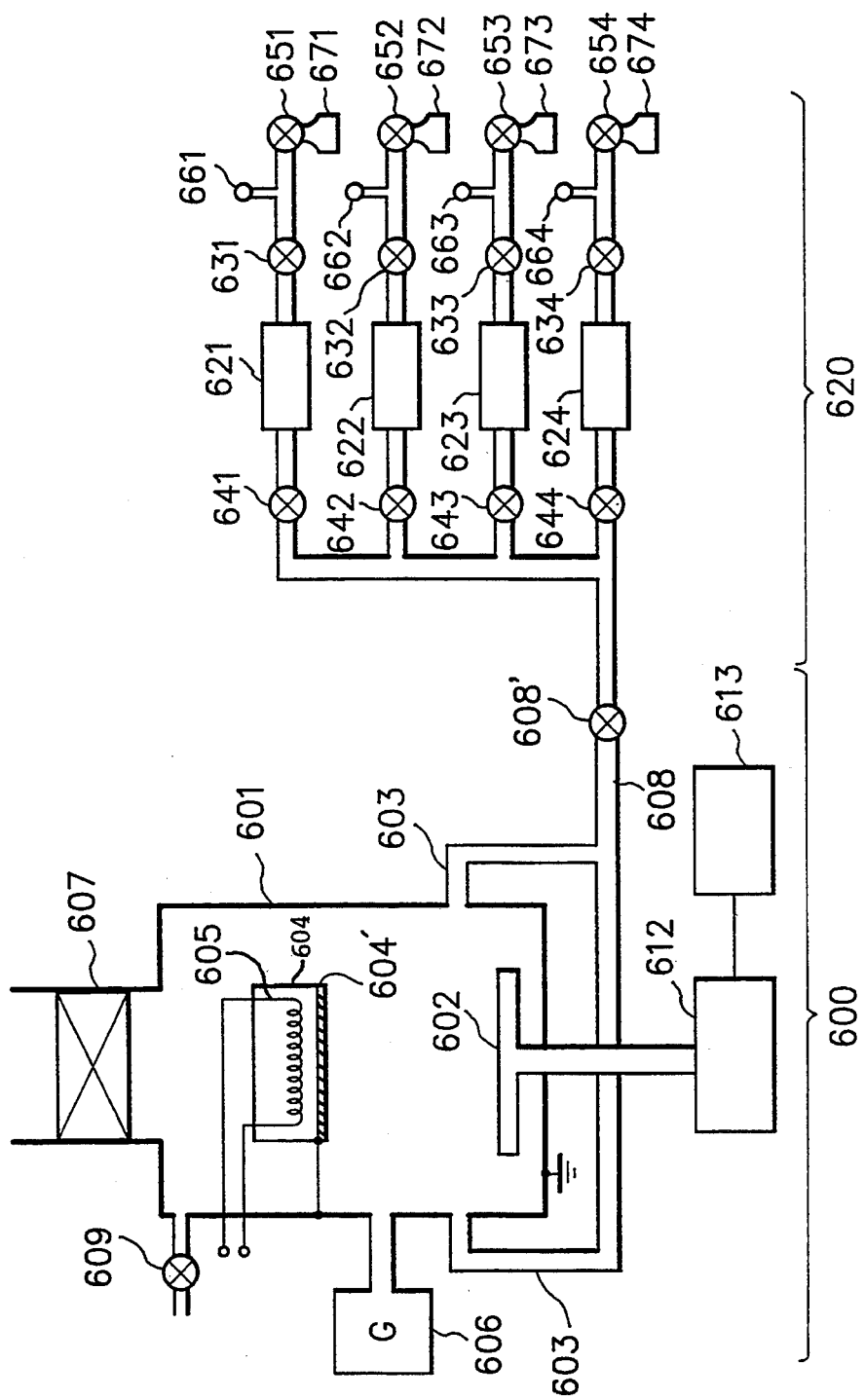
FIG. 7 is a schematic explanatory view of a RF glow-discharge film-forming apparatus which is used for the formation of a conventional silicon-containing non-single crystalline semiconductor.

The RF plasma CVD apparatus shown in FIG. 7 comprises a raw material gas supply system 620 and a film formation system 600.

The film formation system 600 includes a deposition chamber 601 which contains a substrate holder 604 equipped with an electric heater 605. Reference numeral 604' indicates a substrate on which a film is to be formed, which is positioned on the surface of the substrate holder 604. Reference numeral 602 indicates a cathode which is positioned opposite the substrate 604' in the deposition chamber 601. The cathode 602 is electrically connected through a matching box 612 to a RF power source 613. Reference numeral 603 indicates a gas feed pipe which is connected to a circular gas feed pipe (not shown) arranged in the deposition chamber 601. The circular gas feed pipe is arranged such that it is situated along the inner face of the circumferential of the deposition chamber 601 and that it circumscribes a discharge space between the substrate 604' and the cathode 602 in the deposition chamber 601. The circular gas feed pipe arranged in the deposition chamber 601 is provided with a plurality of gas liberation holes (not shown) capable of introducing a raw material gas into the discharge space. The gas feed pipe 603 is extending from a gas transportation conduit 608 which is extending from the gas supply system 620.

The deposition chamber 601 is provided with an exhaust pipe equipped a conductance valve 607. The exhaust pipe is connected to a vacuum pump (not shown). Reference numeral 609 indicates a leak valve provided at a leak pipe connected to the deposition chamber 601. The deposition chamber 501 is provided with a vacuum gage 506.

The gas supply system 620 includes gas reservoirs 671, 672, 673, and 674 which are charged with raw material gases, particularly, $SiH_4$ gas of 99.99% in purity in the gas reservoir 671, $H_2$ gas of 99.9999% in purity in the gas reservoir 672, $PH_3$ gas (purity: 99.999%) diluted with $H_2$ gas to 10% (hereinafter referred to as "$PH_3/H_2$ gas (10%)") or $PH_3$ gas (purity: 99.999%) diluted with $H_2$ gas to 10 ppm (hereinafter referred to as "$PH_3/H_2$ gas (10 ppm)") in the gas reservoir 673, and $B_2H_6$ gas (purity: 99.999%) diluted with $H_2$ gas to 10% (hereinafter referred to as "$B_2H_6/H_2$ gas (10%)") or $B_2H_6$ gas (purity: 99.999%) diluted with $H_2$ gas to 10 ppm (hereinafter referred to as "$B_2H_6/H_2$ gas (10 ppm)") in the gas reservoir 674.

Each of the gas reservoirs 671, 672, 673 and 674 is connected to the gas transportation conduit 608 through a pipe way provided with a valve 651, 652, 653 or 654, a pressure gage 661, 662, 663 or 664, an inlet valve 631, 632, 633 or 634, a mass flow controller 621, 622, 623 or 624, and an exit valve 641, 642, 643 or 644. The gas transportation conduit 608 is provided with a sub-valve 608'.

Now, the RF plasma CVD apparatus shown in FIG. 7 is operated before film formation starts. That is, prior to the entrance of raw material gases into the deposition chamber 601, it is confirmed that the valves 651 through 654 and the leak valve 609 are closed and that the inlet valves 631 through 634, the exit valves 641 through 644, and the sub-valve 608' are opened. Then, the conductance valve 607 for the exhaust pipe is opened to evacuate the inside of the deposition chamber 601 and gas piping while operating the vacuum pump (not shown). Then, upon observing that the reading on the vacuum gage 606 became about $1\times10^{-4}$ Torr, the sub-valve 608' and the exit valves 641 through 644' are closed.

The comparative nine non-single crystalline Si:H semiconductor samples (Sample Nos. CS 1-1 to CS 1-9) were prepared in the following manner using the RF plasma CVD apparatus shown in FIG. 7.

Firstly, there were provided nine SUS 304 stainless steel plates of 1 inch (width)×1.5 inches (length) in size and 1 mm in thickness each having a mirror ground surface as the substrate 604'. On each of the stainless steel plates was formed a 0.1 μm thick Cr film by means of a conventional electron beam evaporation technique.

Each of the stainless steel plates each having the Cr thin film thereon as the substrate 604' was subjected to film formation.

Preparation of Sample No. CS 1-1

The substrate 604' comprising the above stainless steel plate having the Cr thin film thereon was fixed to the surface of the substrate holder 604. The inside of the deposition chamber 501 was evacuated to a vacuum of about $1\times10^{-4}$ Torr by operating the vacuum pump in the manner as above described. The substrate 604' was heated to and maintained at 250° C. by actuating the heater 605. Then, the valves 651, 652 and 654 and the exit valves 641, 642 and 644 were opened. Then, the inlet valves 631, 632 and 634 and the sub-valve 608' were gradually opened to introduce $SiH_4$ gas, $H_2$ gas and $B_2H_6/H_2$ gas (10%) into the deposition chamber 601 through the gas feed pipe 603 and the above described circular gas feed pipe (not shown), when the $SiH_4$ gas and the $H_2$ gas were regulated at respective flow rates of 1 sccm and 50 sccm by means of the mass flow controllers 621 and 622, and the $B_2H_6/H_2$ gas (10%) was regulated at a flow rate of 1 sccm (see, Table 1) by means of the mass flow controller 624. The inner pressure of the deposition chamber 601 was controlled to and maintained at a vacuum of 1 Torr by adjusting the opening of the conductance valve 607 while reading the vacuum gage 606. After the flow rate of each of the above raw material gases became stable at the above respective flow rates, the RF power source 613 was switched on to apply a RF power of 5 mW/cm$^3$ to the cathode 602 through the matching box 612. As a result, RF glow discharge was occurred in the deposition chamber 501, wherein the $SiH_4$ gas, $H_2$ gas and $B_2H_6/H_2$ gas (10%) were decomposed to cause plasma, resulting in forming a non-single crystalline Si:H:B semiconductor film on the Cr thin film of the substrate 604'. The film formation was continued until the non-single crystalline Si:H:B semiconductor film became 3 μm thick.

Thereafter, the RF power source was switched off. And the exit valves 641, 642 and 644 and the sub-valve 608' were closed. After the substrate 604' was cooled to room temperature, it was taken out from the deposition chamber 601.

The above film-forming conditions are shown in Tables 3 and 4.

On the surface of the resultant, there was formed a 0.1 um thick Cr film as an upper electrode by means of a conventional electron beam evaporation technique.

Thus, there was obtained a comparative non-single crystalline Si:H:B semiconductor sample (Sample No. CS 1-1).

Preparation of Sample No. CS 1-2

The procedures of preparing the Sample No. CS 1-1 were repeated, except that the flow rate of the $B_2H_6/H_2$ gas (10%) was changed to 0.1 sccm (see, Table 3), to thereby obtain a comparative non-single crystalline Si:H:B semiconductor sample (Sample No. CS 1-2).

Preparation of Sample No. CS 1-3

The procedures of preparing the Sample No. CS 1-1 were repeated, except that the $B_2H_6/H_2$ gas (10%) was replaced by $B_2H_6/H_2$ gas (10 ppm) and the $B_2H_6/H_2$ gas (10 ppm) was introduced into the deposition chamber 601 at a flow rate of 5 sccm (see, Table 3), to thereby obtain a comparative non-single crystalline Si:H:B semiconductor sample (Sample No. CS 1-3).

Preparation of Sample No. CS 1-4

The procedures of preparing the Sample No. CS 1-3 were repeated, except that the flow rate of the $B_2H_6/H_2$ gas (10 ppm) was changed to 1 sccm (see, Table 3), to thereby obtain a comparative non-single crystalline Si:H:B semiconductor sample (Sample No. CS 1-4).

Preparation of Sample No. CS 1-5

The procedures of preparing the Sample No. CS 1-1 were repeated, except that the $B_2H_6/H_2$ gas (10%) was not used (see, Table 3), to thereby obtain a comparative non-single crystalline Si:H semiconductor sample (Sample No. CS 1-5).

Preparation of Sample No. CS 1-6

The procedures of preparing the Sample No. CS 1-1 were repeated, except that the $B_2H_6/H_2$ gas (10%) was replaced by $PH_3/H_2$ gas (10 ppm) from the gas reservoir 673 and the $PH_3/H_2$ gas (10 ppm) was introduced into the deposition chamber 601 at a flow rate of 1 sccm (see, Table 3), to thereby obtain a comparative non-single crystalline Si:H:P semiconductor sample (Sample No. CS 1-6).

Preparation of Sample No. CS 1-7

The procedures of preparing the Sample No. CS 1-6 were repeated, except the flow rate of the $PH_3/H_2$ gas (10 ppm) was changed to 5 sccm (see, Table 3), to thereby obtain a comparative non-single crystalline Si:H:P semiconductor sample (Sample No. CS 1-7).

Preparation of Sample No. CS 1-8

The procedures of preparing the Sample No. CS 1-1 were repeated, except that the $B_2H_6/H_2$ gas (10%) was replaced by $PH_3/H_2$ gas (10%) from the gas reservoir 673 and the $PH_3/H_2$ gas (10%) was introduced into the deposition chamber 601 at a flow rate of 0.1 sccm (see, Table 3), to thereby obtain a comparative non-single crystalline Si:H:P semiconductor sample (Sample No. CS 1-8).

Preparation of Sample No. CS 1-9

The procedures of preparing the Sample No. CS 1-8 were repeated, except that the flow rate of the $PH_3/H_2$ gas (10%) was changed to 1 sccm (see, Table 3), to thereby obtain a comparative non-single crystalline Si:H:P semiconductor sample (Sample No. CS 1-9).

Evaluation (1) As for each of Samples Nos. ES 1-1 to 1-9 and Samples Nos. CS 1-1 to 1-9, doping efficiency was observed in the following manner.

That is, the sample was set to a commercially available cryostat (trademark name: WM-365, produced by Sanwa Musenki Kenkyusho Kabushiki Kaisha), wherein using a commercially available picoammeter (trademark name: 4140B, produced by Yokokawa-Hewllet Packard Company), there was applied a predetermined voltage between the substrate made of stainless steel and the Cr thin film as the upper electrode while changing the temperature (T: absolute temperature) of the sample, to measure an electric current (Id) flown between the substrate and the upper electrode. On the basis of the measured results, there was obtained a gradient of the natural logarithm of electric current (log. Id) against the inverse number of temperature (1/T), and the gradient obtained was multiplied by the Boltzmann constant, to thereby obtain an activation energy of the sample.

This evaluation was conducted as for each of the samples.

As a result, the following facts were found. That is, (i) the activation energy of Sample No. ES 1-5 (that is, the non-doped sample) is substantially the same as that of Sample No. CS 1-5 (that is, the non-doped sample); (ii) the rate of change in activation energy of each of Samples Nos. ES 1-3, 1-4, 1-6 and 1-7 (doped with a dopant in a small amount) is greater as much as 1.6 to 2.3 times over that of each of Samples Nos. CS 1-3, 1-4, 1-6 and 1-7 (doped with a dopant in a small amount); and (iii) the rate of change in activation energy of each of Samples Nos. ES 1-1, 1-2, 1-8 and 1-9 (doped with a dopant in a large amount) is 0.4 to 0.7 time over that of each of Samples Nos. CS 1-1, 1-2, 1-8 and 1-9 (doped with a dopant in a large amount). From these results, it is understood that the samples according to the present invention are surpassing the comparative samples in terms of doping efficiency.

(2) As for each of Samples Nos. ES 1-1 to 1-9 and Samples Nos. CS 1-1 to 1-9, there were observed an average radius as for the microvoids contained and a density of the microvoids (that is, a microvoid density) using a commercially available small angle X-ray scattering instrument (trademark name: RAD-IIIb, produced by Rigakudenki Kabushiki Kaisha). As a result, the following facts were found. That is, each of Samples Nos. ES 1-1 to 1-9 (belonging to the present invention) is of 2.8 to 3.0 Å in average radius as for the microvoids contained and has a microvoid density in the range of from $6.3 \times 10^{18}$ (cm$^{-3}$) to $8 \times 10^{18}$ (cm$^{-3}$); on the other hand, each of Samples Nos. CS 1-1 to 1-9 (comparative samples) is of 3.7 to 3.9 Å in average radius as for the microvoids contained and has a microvoid density in the range of from $1.9 \times 10^{19}$ (cm$^{-3}$) to $3.4 \times 10^{19}$ (cm$^{-3}$).

(3) As for each of Samples Nos. ES 1-1 to 1-9 and Samples Nos. CS 1-1 to 1-9, there was observed the situation of microvoids present at the surface using a commercially available STM (trademark name: MANOSCOPE-II, produced by Digital Instrument Company). As a result, it was found that the average radius and the number of the microvoids present at the surface of each of the samples according to the present invention (that is, Samples Nos. ES 1-1 to 1-9) are distinguishably smaller than those of each of the comparative samples (that is, Samples Nos. CS 1-1 to 1-9).

In addition, as for each of Samples Nos. ES 1-1 to 1-9 and Samples Nos. CS 1-1 to 1-9, there was observed its crystallinity using a commercially available RHEED (trademark name: JEM-100SX, produced by JEOL, Ltd.). As a result, a ring pattern indicating amorphous material (including microcrystalline material) was observed as for each of the samples.

Experiments 2 and 3 and Comparative Experiments 2 and 3

Experiment 2

There was prepared a pin junction semiconductor device (having a stacked pin junction semiconductor active region formed of the specific non-single crystalline semiconductor according to the present invention), following the procedures of preparing Sample No. ES 1-1 using the microwave plasma CVD apparatus of FIG. 5 in Experiment 1.

Firstly, there was provided a SUS 304 stainless steel plate of 50 mm×50 mm in size and 1 mm in thickness having a mirror ground surface on which a film is to be formed as a substrate (that is, the substrate 504' in FIG. 5).

Formation of P-Type Semiconductor Layer

The substrate 504' was fixed to the surface of the substrate holder 504. The inside of the deposition chamber 501 was evacuated to a vacuum of about $1 \times 10^{-4}$ Torr by operating the vacuum pump. The substrate 504' was heated to and maintained at 400° C. by actuating the heater 505. Then, the valves 551, 552 and 554 and the exit valves 541, 542 and 544 were opened. Then, the inlet valves 531, 532 and 534 and the sub-valve 508' were gradually opened to introduce SiH$_4$ gas, D$_2$ gas and B$_2$H$_6$/H$_2$ gas (10%) into the deposition chamber 501 through the gas feed pipe 503 and the above described circular gas feed pipe (not shown) at respective flow rates of 5 sccm, 100 sccm and 5 sccm. The inner pressure of the deposition chamber 501 was controlled to and maintained at a vacuum of 2 mTorr by adjusting the opening of the conductance valve 507 while reading the vacuum gage 506. After the flow rate of each of the above raw material gases became stable at the above respective flow rates, the DC power source 511 was switched on to apply a DC bias voltage of −100 V to the deposition chamber 501, simultaneously with this, the RF power source 513 was switched on to apply a RF power of 1 mW/cm$^3$ to the substrate 504' through the matching box 512. At the same time, the microwave power source (not shown in the figure) was switched on to apply a microwave power of 70 mW/cm$^3$ into the deposition chamber 501 through the wave guide 510 and the microwave transmissive window 502. As a result, discharge was occurred in the deposition chamber 501, wherein the SiH$_4$ Gas, D$_2$ Gas and B$_2$H$_6$/H$_2$ Gas (10%) were decomposed to cause plasma, resulting in forming a non-single crystalline Si:H:B semiconductor film on the mirror ground surface of the substrate 504'. The film formation was continued until the non-single crystalline Si:H:B semiconductor film became 10 nm thick. Thus, there was formed the p-type semiconductor layer.

Formation of I-Type Semiconductor Layer

The procedures of forming the p-type semiconductor layer were repeated, except for not using the B$_2$H$_6$/H$_2$ gas (10%).

That is, the substrate 504' having the p-type semiconductor layer formed thereon was maintained at 400° C. Then, the valves 551 and 552 and the exit valves 541 and 542 were opened. Then, the inlet valves 531 and 532 and the sub-valve 508' were Gradually opened to introduce SiH$_4$ Gas and D$_2$ Gas into the deposition chamber 501 at respective flow rates of 5 sccm and 100 sccm. The inner pressure of the deposition chamber 501 was controlled to and maintained at a vacuum of 2 mTorr. After the flow rate of each of the above raw material Gases became stable at the above respective flow rates, the DC power source 511 was switched on to apply a DC bias voltage of −100 V to the deposition chamber 501, simultaneously with this, the RF power source 513 was switched on to apply a RF power of 1 mW/cm$^3$ to the substrate 504' through the matching box 512. At the same time, the microwave power source was switched on to apply a microwave power of 70 mW/cm$^3$ into the deposition chamber 501. As a result, discharge was occurred in the deposition chamber 501, wherein the SiH$_4$ gas and D$_2$ gas were decomposed to cause plasma, resulting in forming a non-single crystalline Si:H semiconductor film on the previously formed p-type semiconductor layer. The film formation was continued until the non-single crystalline Si:H semiconductor film became 500 nm thick. Thus, there was formed the i-type semiconductor layer.

Formation of N-Type Semiconductor Layer

The procedures of forming the p-type semiconductor layer were repeated, except for replacing the B$_2$H$_6$/H$_2$ gas (10%) by PH$_3$/H$_2$ gas (10%).

That is, the substrate 504' having the p-type semiconductor layer and the i-type semiconductor layer formed thereon was maintained at 400° C. Then, the valves 551, 552 and 553 and the exit valves 541, 542 and 543 were opened. Then, the inlet valves 531, 532 and 533 and the sub-valve 508' were gradually opened to introduce SiH$_4$ gas, D$_2$ gas and PH$_3$/H$_2$ gas (10%) into the deposition chamber 501 at respective flow rates of 5 sccm, 100 sccm and 5 sccm. The inner pressure of the deposition chamber 501 was controlled to and maintained at a vacuum of 2 mTorr. After the flow rate of each of the above raw material gases became stable at the above respective flow rates, the DC power source 511 was switched on to apply a DC bias voltage of −100 V to the deposition chamber 501, simultaneously with this, the RF power source 513 was switched on to apply a RF power of 1 mW/cm$^3$ to the substrate 504' through the matching box 512. At the same time, the microwave power source was switched on to apply a microwave power of 70 mW/cm$^3$ into the deposition chamber 501. As a result, discharge was occurred in the deposition chamber 501, wherein the SiH$_4$ gas, D$_2$ gas and PH$_3$/H$_2$ gas (10%) were decomposed to cause plasma, resulting in forming a non-single crystalline Si:H:P semiconductor film on the previously formed i-type semiconductor layer. The film formation was continued until the non-single crystalline Si:H:P semiconductor film became 10 nm thick. Thus, there was formed the n-type semiconductor layer.

Thereafter, the microwave power source, the RF power source and the DC power source were switched off. At the same time, the exit valves 541, 542 and 543 and the sub-valve 508' were closed. After the substrate 504' was cooled to room temperature, it was taken out from the deposition chamber 501.

Then, on the surface of the n-type layer of the resultant, there was formed an ITO (In$_2$O$_3$+SnO$_2$) film of 70 nm as a transparent and conductive layer by means of a conventional resistance heating evaporation technique.

Thus, there was obtained a pin junction semiconductor device (Sample No. ES 2).

The above conditions for the preparation of the pin junction semiconductor device (Sample No. ES 2) are collectively shown in Table 5.

Experiment 3

The procedures of Experiment 2 were repeated, except that the n-type semiconductor layer was first formed on the substrate and the p-type semiconductor layer was formed on the i-type semiconductor layer and that the i-type semiconductor layer was formed at a thickness of 3 μm, to thereby obtain a nip junction semiconductor device (Sample No. ES 3).

Comparative Experiment 2

There was prepared a comparative pin junction semiconductor device (having a stacked pin junction semiconductor active region formed of the conventional non-single crystalline semiconductor), following the procedures of preparing Sample No. CS 1-1 using the RF plasma CVD apparatus of FIG. 7 in Comparative Experiment 1.

Firstly, there was provided a SUS 304 stainless steel plate of 50 mm×50 mm in size and 1 mm in thickness having a mirror ground surface on which a film is to be formed as a substrate (that is, the substrate 604' in FIG. 7).

Formation of P-Type Semiconductor Layer

The substrate 604' was fixed to the surface of the substrate holder 604. The inside of the deposition chamber 501 was evacuated to a vacuum of about 1×10$^{-4}$ Torr by operating the vacuum pump. The substrate 604' was heated to and maintained at 250° C. by actuating the heater 605. Then, the valves 651, 652 and 654 and the exit valves 641, 642 and 644 were opened. Then, the inlet valves 631, 632 and 634 and the sub-valve 608' were gradually opened to introduce SiH$_4$ gas, H$_2$ gas and B$_2$/H$_6$/H$_2$ gas (10%) into the deposition chamber 601 through the gas feed pipe 603 and the above described circular gas feed pipe (not shown) at respective flow rates of 1 sccm, 50 sccm and 1 sccm. The inner pressure of the deposition chamber 601 was controlled to and maintained at a vacuum of 1 Torr by adjusting the opening of the conductance valve 607 while reading the vacuum gage 606. After the flow rate of each of the above raw material gases became stable at the above respective flow rates, the RF power source 613 was switched on to apply a RF power of 5 mW/cm$^3$ to the cathode 602 through the matching box 612. As a result, RF glow discharge was occurred in the deposition chamber 501, wherein the SiH$_4$ gas, H$_2$ gas and B$_2$H$_6$/H$_2$ gas (10%) were decomposed to cause plasma, resulting in forming a non-single crystalline Si:H:B semiconductor film on the mirror ground surface of the substrate 604'. The film formation was continued until the non-single crystalline Si:H:B semiconductor film became 10 nm thick. Thus, there was formed the p-type semiconductor layer.

Formation of I-Type Semiconductor Layer

The procedures of forming the p-type semiconductor layer were repeated, except for not using the $B_2H_6/H_2$ gas (10%).

That is, the substrate 604' having the p-type semiconductor layer formed thereon was maintained at 250° C. Then, the valves 651 and 652 and the exit valves 641 and 642 were opened. Then, the inlet valves 631 and 632 and the sub-valve 608' were gradually opened to introduce $SiH_4$ gas and $H_2$ gas into the deposition chamber 601 at respective flow rates of 1 sccm and 50 sccm. The inner pressure of the deposition chamber 601 was controlled to and maintained at a vacuum of 1 Torr. After the flow rate of each of the above raw material gases became stable at the above respective flow rates, the RF power source 613 was switched on to apply a RF power of 5 $mW/cm^3$ to the cathode 602 through the matching box 612. As a result, RF glow discharge was occurred in the deposition chamber 501, wherein the $SiH_4$ gas and $H_2$ gas were decomposed to cause plasma, resulting in forming a non-single crystalline Si:H semiconductor film on the p-type semiconductor layer of the substrate 604'. The film formation was continued until the non-single crystalline Si:H semiconductor film became 500 nm thick. Thus, there was formed the i-type semiconductor layer.

Formation of N-Type Semiconductor Layer

The procedures of forming the p-type semiconductor layer, except for replacing the $B_2H_6/H_2$ gas (10%) by $PH_3/H_2$ gas (10%).

That is, the substrate 604' having the p-type semiconductor layer and the i-type semiconductor layer formed thereon was maintained at 250° C. Then, the valves 651, 652 and 653 and the exit valves 641, 642 and 643 were opened. Then, the inlet valves 631, 632 and 633 and the sub-valve 608' were gradually opened to introduce $SiH_4$ gas, $H_2$ gas and $PH_3/H_2$ gas (10%) into the deposition chamber 601 at respective flow rates of 1 sccm, 50 sccm and 1 sccm. The inner pressure of the deposition chamber 601 was controlled to and maintained at a vacuum of 1 Torr. After the flow rate of each of the above raw material gases became stable at the above respective flow rates, the RF power source 613 was switched on to apply a RF power of 5 $mW/cm^3$ to the cathode 602 through the matching box 612. As a result, RF glow discharge was occurred in the deposition chamber 501, wherein the $SiH_4$ gas, $H_2$ gas and $PH_3/H_2$ gas (10%) were decomposed to cause plasma, resulting in forming a non-single crystalline Si:H:P semiconductor film on the i-type semiconductor layer of the substrate 604'. The film formation was continued until the non-single crystalline Si:H:P semiconductor film became 10 nm thick. Thus, there was formed the n-type semiconductor layer.

Thereafter, the RF power source was switched off. And the exit valves 641, 642 and 643 and the sub-valve 608' were closed. After the substrate 604' was cooled to room temperature, it was taken out from the deposition chamber 601.

Then, on the surface of the n-type layer of the resultant, there was formed an ITO ($In_2O_3 + SnO_2$) film of 70 nm as a transparent and conductive layer by means of a conventional resistance heating evaporation technique.

Thus, there was obtained a comparative pin junction semiconductor device (Sample No. CS 2).

The above conditions for the preparation of the pin junction semiconductor device (Sample No. CS 2) are collectively shown in Table 6.

Comparative Example 3

The procedures of Comparative Experiment 2 were repeated, except that the n-type semiconductor layer was first formed on the substrate and the p-type semiconductor layer was formed on the i-type semiconductor layer and that the i-type semiconductor layer was formed at a thickness of 3 μm, to thereby obtain a comparative nip junction semiconductor device (Sample No. CS 3).

Evaluation (1) Each of Sample No. ES 2 and Sample No. CS 2 was evaluated with respect to (a) pin junction property, (b) the situation of the boron atoms (B) and phosphorous atoms (P) to have been diffused into the i-type semiconductor layer, and (c) leakage current.

Evaluation of the above Item (a)

As for each of Sample No. ES 2 and Sample No. CS 2, there was observed a pin junction property in the following manner. That is, a predetermined voltage was applied between the substrate made of stainless steel and the transparent and conductive layer of the sample using a picoammeter (produced by Yokokawa-Hewllet Packard Company), to obtain current/voltage characteristics. On the basis of the results obtained, an n-value as for the pin junction was obtained in accordance with the measuring method described in *Physics of Semiconductor Devices* (2nd Edition published by John Willey & Sons, edited by S. M. Sze, pp. 89–92.

As a result, it was found that the n-value of Sample No. ES 2 (that is, the pin junction semiconductor device according to the present invention) is 0.85 time over that of Sample No. CS 2 (that is, the conventional pin junction semiconductor device), and because of this, Sample No. ES 2 is surpassing Sample No. CS 2 in terms of pin junction characteristics.

Evaluation of the above Item (b)

As for each of Sample No. ES 2 and Sample No. CS 2, the amount of each of phosphorous atoms (P) and boron atoms (B) contained in the i-type semiconductor layer was measured by means of a commercially available secondary ion mass spectrometer (trademark name: IMS-3F, produced by CAMECA Company).

As a result, it was found that the amount of P contained in the i-type semiconductor layer of Sample No. ES 2 is 0.7 time over that in the i-type semiconductor layer of Sample No. CS 2, and the amount of B contained in the former is 0.4 time over that in the latter.

Evaluation of the above Item (c)

As for each of Sample No. ES 2 and Sample No. CS 2, there was observed a leakage current in the following manner. That is, a leakage current at a prescribed reverse bias voltage was observed using a picoammeter (trademark name: 4140B, produced by Yokokawa-Hewllet Packard Company), wherein a predetermined voltage was applied between the substrate made of stainless steel and the transparent and conductive layer of the sample to obtain current/voltage characteristics.

As a result, it was found that the leakage current in Sample No. ES 2 is 0.46 time smaller over that in Sample No. CS 2, and thus, the constituent thin semiconductor films of the former are surpassing those of the latter in terms of semiconductor characteristics.

(2) Each of Sample No. ES 2, Sample No. ES 3, Sample No. CS 2, and Sample No. CS 3 was evaluated with respect to electron mobility and hole mobility in accordance with the time-of-flight method described in *Semiconductors and Semimetals*, volume 21, Part C, Chapter 6, edited by T. Tiedje, published by Academic Press.

As a result, it was found that the hole mobility in Sample No. ES 2 (that is, the semiconductor device according to the present invention) is greater as much as 2.7 times over that in Sample No. CS 2 (that is, the conventional semiconductor device); the electron mobility in Sample No. ES 3 (that is, the semiconductor device according to the present invention) is greater as much as 1.5 times over that in Sample No. CS 3 (that is, the conventional semiconductor device); and thus, Samples Nos. ES 2 and ES 3 are surpassing any of Samples Nos. CS 2 and CS 3 in terms of semiconductor characteristics.

Experiment 4 and Comparative Experiment 4

Experiment 4

The procedures of Experiment 2 were repeated, except that the thickness of each of the p-type semiconductor layer and the n-type semiconductor layer was changed to 2 nm, to thereby obtain a pin junction semiconductor device (Sample No. ES 4).

Comparative Experiment 4

The procedures of Comparative Experiment 2 were repeated, except that the thickness of each of the p-type semiconductor layer and the n-type semiconductor layer was changed to 2 nm, to thereby obtain a comparative pin junction semiconductor device (Sample No. CS 4).

Evaluation

As for each of Sample No. ES 4 and Sample No. CS 4, there was observed a leakage current in the following manner. That is, a leakage current at a prescribed reverse bias voltage was observed using a picoammeter (trademark name: 4140B, produced by Yokokawa-Hewllet Packard Company), wherein a predetermined voltage was applied between the substrate made of stainless steel and the transparent and conductive layer of the sample to obtain current/voltage characteristics.

As a result, it was found that the leakage current in Sample No. ES 4 is 0.08 time smaller over that in Sample No. CS 4, and thus, the constituent thin semiconductor films of the former are surpassing those of the latter in terms of semiconductor characteristics.

Experiment 5 and Comparative Experiment 5

Experiment 5

(1) There were prepared three non-single crystalline Si:H samples (Sample Nos. ES 5-1-(1), ES 5-2-(1) and ES 5-3-(1)) by repeating the procedures of Experiment 1 under the conditions shown in Table 8, wherein the flow rate of $D_2$ gas was changed as shown in Table 7 in each case.

(2) There were prepared three pin junction semiconductor devices (Sample Nos. ES 5-1-(2), ES 5-2-(2) and ES 5-3-(2)) by repeating the procedures of Experiment 2 under the conditions shown in Table 9, wherein the flow rate of $D_2$ gas upon forming the i-type semiconductor layer was changed as shown in Table 7 in each case.

Comparative Experiment 5

(1) There was prepared a comparative non-single crystalline Si:H sample (Sample No. CS 5(1)) by repeating the procedures of Experiment 1 under the conditions shown in Table 8 wherein not $D_2$ gas but $H_2$ gas was used, and the flow rate of the $H_2$ gas was made to be 50 sccm as shown Table 7.

(2) There was prepared a comparative pin junction semiconductor device (Sample No. CS 5(2)) by repeating the procedures of Experiment 2, except that the i-type semiconductor layer was formed under the conditions shown in Table 9 wherein not $D_2$ gas but $H_2$ gas was used, and the flow rate of the $H_2$ gas was made to be 50 sccm as shown Table 7.

Evaluation (1) As for each of Samples Nos. ES 5-1-(1), ES 5-2(1) and ES 5-3-(1) and Sample No. CS 5(1), there were observed an average radius as for the microvoids and a microvoid density using the foregoing small angle X-ray scattering instrument. The results obtained are shown in FIG. 8.

(2) As for each of Samples Nos. ES 5-1-(1), ES 5-2(1) and ES 5-3-(1) and Sample No. CS 5(1), there was examined the crystallinity using the foregoing RHEED. The results obtained are described in FIG. 8.

(3) Each of Samples Nos. ES 5-1-(2), ES 5-2-(2) and ES 5-3-(2) and Sample No. CS 5(2) was evaluated with respect to n-value, hole mobility and leakage current, respectively in the same manner as above described.

Figure 8:
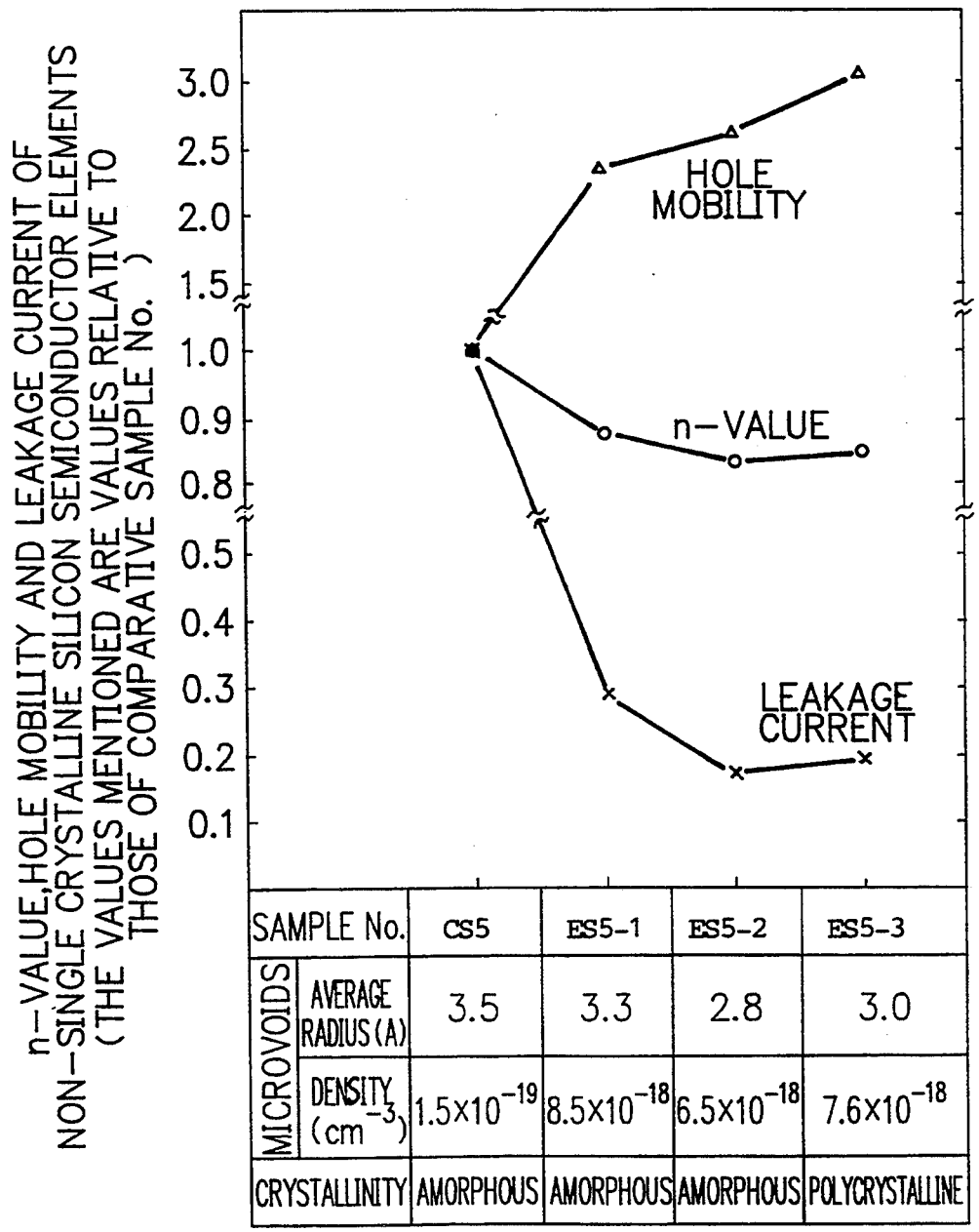
FIG. 8 is a graph showing the interrelations of hole mobility, n-value, leakage current, average radius and density of microvoids, and crystallinity with respect to a conventional non-single crystalline Si semiconductor and non-single crystalline Si semiconductors according to the present invention.

The results obtained are graphically shown in FIG. 8, wherein the values shown as for each of Samples Nos. ES 5-1, ES 5-2 and ES 5-3 are relative to those of CS 5 which were set at 1.

As is apparent from the results shown in FIG. 8, it is understood that any of the non-single crystalline Si:H samples according to the present invention is of less than 3.5 Å in average radius as for the microvoids contained and less than $1 \times 10^{19}$ (cm$^{-3}$) in microvoid density, and that any of the pin junction semiconductor device samples according to the present invention is surpassing the comparative pin junction semiconductor device sample in terms of n-value, hole mobility and leakage current.

Experiment 6 and Comparative Experiment 6

Experiment 6

There were prepared nine non-single crystalline Si-Ge:H semiconductor samples (Sample Nos. EG 1-1 to EG 1-9), which are different from each other with regard to the amount of a dopant contained or the kind of a dopant contained wherein Sample No. EG 1-5 contains no dopant (see, Table 10), by practicing the foregoing film-forming method using a microwave plasma CVD apparatus of the constitution shown in FIG. 6. Each of these samples was examined with respect to doping efficiency, microvoids contained, and crystallinity.

Firstly, description will be made of the microwave plasma CVD apparatus shown in FIG. 6.

Figure 6:
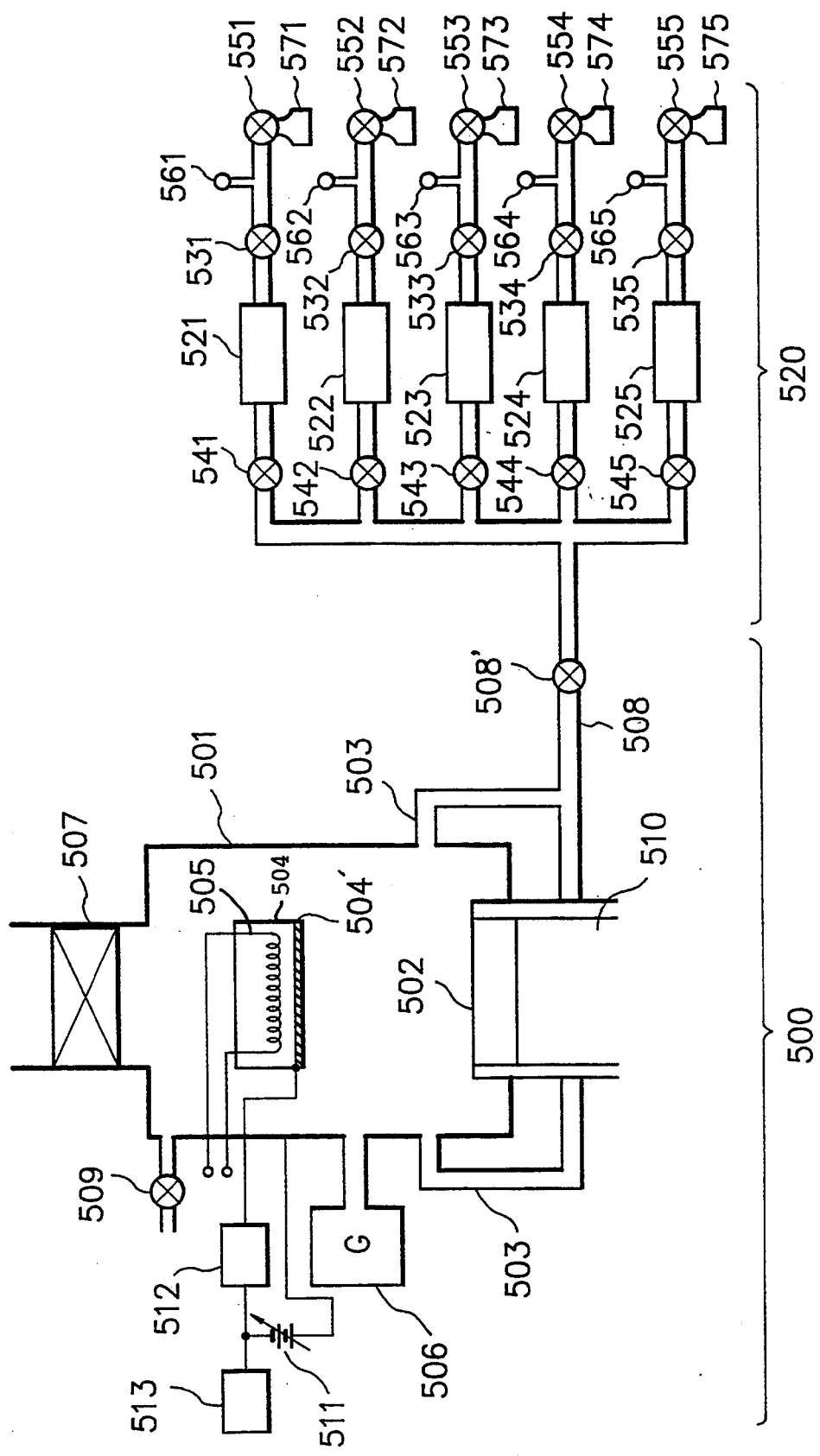
FIG. 6 is a schematic explanatory view of other microwave plasma CVD apparatus which is suitable for the formation of a non-single crystalline semiconductor according to the present invention.

The microwave plasma CVD apparatus shown in FIG. 6 is of the same constitution as the microwave plasma CVD apparatus shown in FIG. 5, except that a gas supply series comprising a gas reservoir 575 containing GeH₄ gas and a pipe way extending from the gas reservoir 575 is added to the gas supply system of the microwave plasma CVD apparatus shown in FIG. 5. Particularly, the gas reservoir 575 is connected to the gas transportation conduit 508 through the pipe way provided with a valve 555, a pressure gage 565, an inlet valve 535, a mass flow controller 525, and an exit valve 545.

The gas supply system 520 includes the gas reservoirs 571, 572, 573, 574, and 575 which are charged with raw material gases, particularly, SiH₄ gas of 99.99% in purity in the gas reservoir 571; heavy hydrogen gas (hereinafter referred to as "D₂ gas") of 99.6% in purity in the gas reservoir 572; PH₃ gas (purity: 99.999%) diluted with H₂ gas to 10% (hereinafter referred to as "PH₃/H₂ gas (10%)") or PH₃ gas (purity: 99.999%) diluted with H₂ gas to 10 ppm (hereinafter referred to as "PH₃/H₂ gas (10 ppm)") in the gas reservoir 573; B₂H₆ gas (purity: 99.999%) diluted with H₂ gas to 10% (hereinafter referred to as "B₂H₆/H₂ gas (10%)") or B₂H₆ gas (purity: 99.999%) diluted with H₂ gas to 10 ppm (hereinafter referred to as "B₂H₆/H₂ gas (10 ppm)") in the gas reservoir 574; and GeH₄ gas of 99.999% in purity in the gas reservoir 575.

Now, the microwave plasma CVD apparatus shown in FIG. 6 is operated before film formation starts. That is, prior to the entrance of raw material gases into the deposition chamber 501, it is confirmed that the valves 551 through 555 and the leak valve 509 are closed and that the inlet valves 531 through 535, the exit valves 541 through 545, and the sub-valve 508' are opened. Then, the conductance valve 507 for the exhaust pipe is opened to evacuate the inside of the deposition chamber 501 and gas piping while operating the vacuum pump (not shown). Then, upon observing that the reading on the vacuum gage 506 became about $1 \times 10^{-4}$ Torr, the sub-valve 508' and the exit valves 541 through 545 are closed.

The nine non-single crystalline SiGe:H semiconductor samples (Sample Nos. EG 1-1 to EG 1-9) were prepared in the following manner using the microwave plasma CVD apparatus shown in FIG. 6.

Firstly, there were provided nine SUS 304 stainless steel plates of 1 inch (width)×1.5 inches (length) in size and 1 mm in thickness each having a mirror ground surface as the substrate 504'. On each of the stainless steel plates was formed a 0.1 μm thick Cr film by means of a conventional electron beam evaporation technique.

Each of the stainless steel plates each having the Cr thin film thereon as the substrate 504' was subjected to film formation.

Preparation of Sample No. EG 1-1

The substrate 504' comprising the above stainless steel plate having the Cr thin film thereon was fixed to the surface of the substrate holder 504. The inside of the deposition chamber 501 was evacuated to a vacuum of about $1 \times 10^{-4}$ Torr by operating the vacuum pump in the manner as above described. The substrate 504' was heated to and maintained at 350° C. by actuating the heater 505. Then, the valves 551, 552, 554, and 555 and the exit valves 541, 542, 544, and 545 were opened. Then, the inlet valves 531, 532, 534, and 535, and the sub-valve 508' were gradually opened to introduce SiH₄ gas, GeH₄ gas, D₂ gas and B₂H₆/H₂ gas (10%) into the deposition chamber 501 through the gas feed pipe 503 and the above described circular gas feed pipe (not shown), when the SiH₄ gas, GeH₄ gas, and the D₂ gas were regulated at respective flow rates of 3 sccm, 2 sccm and 100 sccm by means of the mass flow controllers 521, 522, and 525, and the B₂H₆/H₂ gas (10%) was regulated at 5 sccm (see, Table 10) by means of the mass flow controller 524. The inner pressure of the deposition chamber 501 was controlled to and maintained at a vacuum of 2 mTorr by adjusting the opening of the conductance valve 507 while reading the vacuum gage 506. After the flow rate of each of the above raw material gases became stable at the above respective flow rates, the DC power source 511 was switched on to apply a DC bias voltage of −90 V to the deposition chamber 501, simultaneously with this, the RF power source 513 was switched on to apply a RF power of 0.8 mW/cm³ to the substrate 504' through the matching box 512. At the same time, the microwave power source (not shown) was switched on to apply a microwave power of 60 mW/cm³ into the deposition chamber 501 through the wave guide 510 and the microwave transmissive window 502. As a result, discharge was occurred in the deposition chamber 501, wherein the SiH₄ gas, GeH₄ gas, D₂ gas and B₂H₆/H₂ gas (10%) were decomposed to cause plasma, resulting in forming a non-single crystalline SiGe:H:B semiconductor film on the Cr thin film of the substrate 504'. The film formation was continued until the non-single crystalline SiGe:H:B semiconductor film became 3 μm thick.

Thereafter, the microwave power source, the RF power source and the DC power source were switched off. And the exit valves 541, 542, 544, and 545, and the sub-valve 508' were closed. After the substrate 504' was cooled to room temperature, it was taken out from the deposition chamber 501.

The above film-forming conditions are shown in Tables 10 and 11.

On the surface of the resultant, there was formed a 0.1 μm thick Cr film as an upper electrode by means of a conventional electron beam evaporation technique.

Thus, there was obtained a non-single crystalline SiGe:H:B semiconductor sample (Sample No. EG 1-1).

Preparation of Sample No. EG 1-2

The procedures of preparing the Sample No. EG 1-1 were repeated, except that the flow rate of the B₂H₆/H₂ gas (10%) was changed to 0.5 sccm (see, Table 10), to thereby obtain a non-single crystalline SiGe:H:B semiconductor sample (Sample No. EG 1-2).

Preparation of Sample No. EG 1-3

The procedures of preparing the Sample No. EG 1-1 were repeated, except that the B₂H₆/H₂ gas (10%) was replaced by B₂H₆/H₂ gas (10 ppm) and the B₂H₆/H₂ gas (10 ppm) was introduced into the deposition chamber 501 at a flow rate of 25 sccm (see, Table 10), to thereby obtain a non-single crystalline SiGe:H:B semiconductor sample (Sample No. EG 1-3).

Preparation of Sample No. EG 1-4

The procedures of preparing the Sample No. EG 1-3 were repeated, except that the flow rate of the B₂H₆/H₂ gas (10 ppm) was changed to 5 sccm (see, Table 10), to thereby obtain a non-single crystalline SiGe:H:B semiconductor sample (Sample No. EG 1-4).

Preparation of Sample No. EG 1-5

The procedures of preparing the Sample No. EG 1-1 were repeated, except that the B₂H₆/H₂ gas (10%) was not used (see, Table 10), to thereby obtain a non-single crystalline SiGe:H semiconductor sample (Sample No. EG 1-5).

Preparation of Sample No. EG 1-6

The procedures of preparing the Sample No. EG 1-1 were repeated, except that the B$_2$H$_6$/H$_2$ gas (10%) was replaced by PH$_3$/H$_2$ gas (10 ppm) from the gas reservoir 573 and the PH$_3$/H$_2$ gas (10 ppm) was introduced into the deposition chamber 501 at a flow rate of 5 sccm (see, Table 10), to thereby obtain a non-single crystalline SiGe:H:P semiconductor sample (Sample No. EG 1-6).

Preparation of Sample No. EG 1-7

The procedures of preparing the Sample No. EG 1-6 were repeated, except the flow rate of the PH$_3$/H$_2$ gas (10 ppm) was changed to 25 sccm (see, Table 10), to thereby obtain a non-single crystalline SiGe:H:P semiconductor sample (Sample No. EG 1-7).

Preparation of Sample No. EG 1-8

The procedures of preparing the Sample No. EG 1-1 were repeated, except that the B$_2$H$_6$/H$_2$ gas (10%) was replaced by PH$_3$/H$_2$ gas (10%) from the gas reservoir 573 and the PH$_3$/H$_2$ gas (10%) was introduced into the deposition chamber 501 at a flow rate of 0.5 sccm (see, Table 10), to thereby obtain a non-single crystalline SiGe:H:P semiconductor sample (Sample No. EG 1-8).

Preparation of Sample No. EG 1-9

The procedures of preparing the Sample No. EG 1-8 were repeated, except that the flow rate of the PH$_3$/H$_2$ gas (10%) was changed to 5 sccm (see, Table 10), to thereby obtain a non-single crystalline SiGe:H:P semiconductor sample (Sample No. EG 1-9).

Comparative Experiment 6

There were prepared comparative nine non-single crystalline SiGe:H semiconductor samples (Sample Nos. CG 1-1 to CG 1-9), which are different from each other with regard to the amount of a dopant contained or the kind of a dopant contained wherein Sample No. CG 1-5 contains no dopant (see, Table 12), using a conventional high frequency (RF) glow discharge decomposition apparatus (hereinafter referred to as RF plasma CVD apparatus) of the constitution shown in FIG. 9. Each of these samples was examined with respect to doping efficiency, microvoids contained, and crystallinity.

Firstly, description will be made of the RF plasma CVD apparatus shown in FIG. 9.

Figure 9:
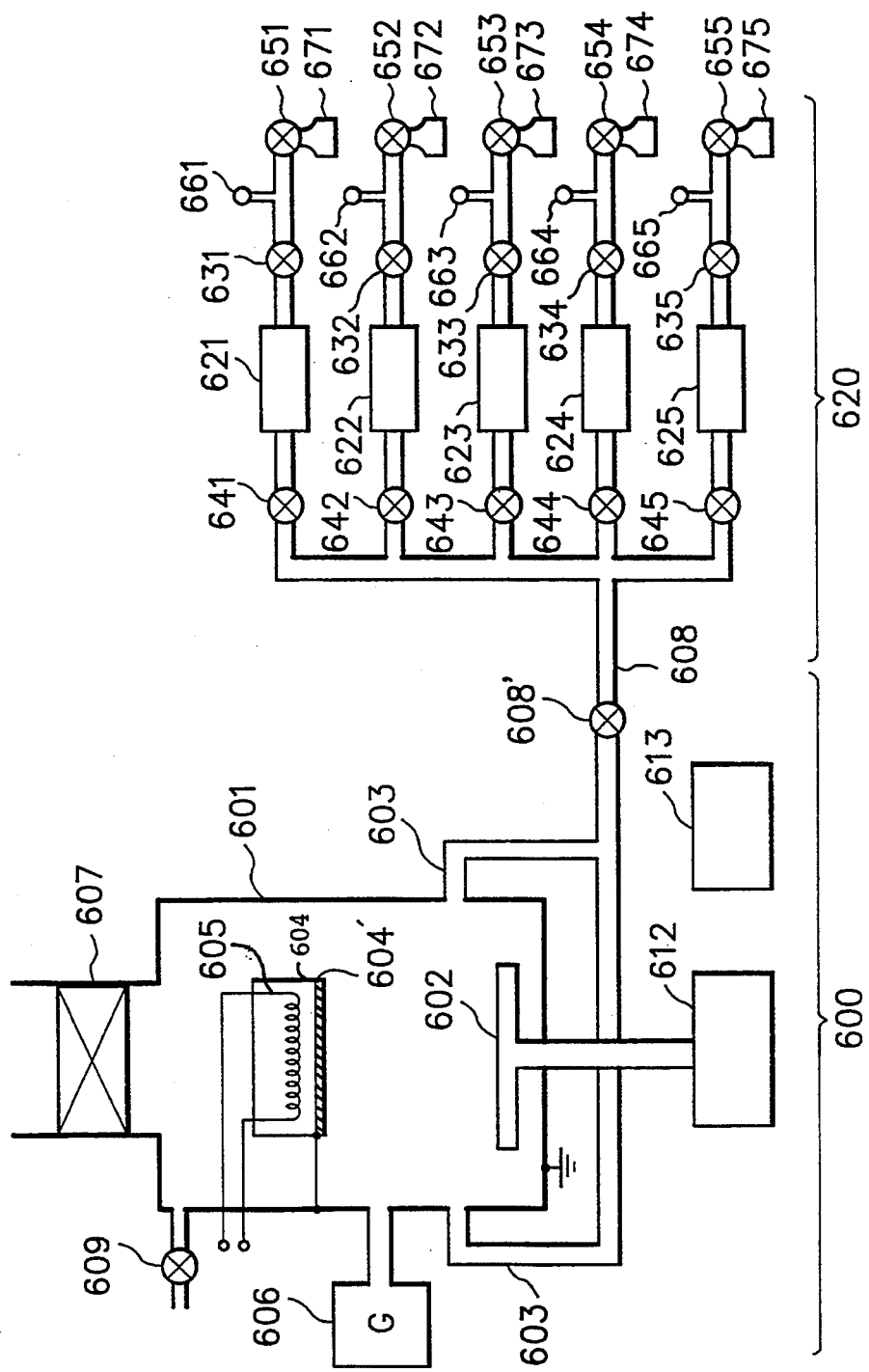
FIG. 9 is a schematic explanatory view of a RF glow-discharge film-forming apparatus which is used for the formation of a conventional germanium-containing non-single crystalline semiconductor.

The RF plasma CVD apparatus shown in FIG. 9 is of the same constitution as the RF plasma CVD apparatus shown in FIG. 7, except that a gas supply series comprising a gas reservoir 675 containing GeH$_4$ gas and a pipe way extending from the gas reservoir 675 is added to the gas supply system of the microwave plasma CVD apparatus shown in FIG. 7. Particularly, the gas reservoir 675 is connected to the gas transportation conduit 608 through the pipe way provided with a valve 655, a pressure gage 665, an inlet valve 635, a mass flow controller 625, and an exit valve 645.

The gas supply system 620 includes the gas reservoirs 671, 672, 673, 674, and 675 which are charged with raw material gases, particularly, SiH$_4$ gas of 99.99% in purity in the gas reservoir 671; H$_2$ gas of 99.9999% in purity in the gas reservoir 672; PH$_3$ gas (purity: 99.999%) diluted with H$_2$ gas to 10% (hereinafter referred to as "PH$_3$/H$_2$ gas (10%)") or PH$_3$ gas (purity: 99.999%) diluted with H$_2$ gas to 10 ppm (hereinafter referred to as "PH$_3$/H$_2$ gas (10 ppm)") in the gas reservoir 673; B$_2$H$_6$ gas (purity: 99.999%) diluted with H$_2$ gas to 10% (hereinafter referred to as "B$_2$H$_6$/H$_2$ gas (10%)") or B$_2$H$_6$ gas (purity: 99.999%) diluted with H$_2$ gas to 10 ppm (hereinafter referred to as "B$_2$H$_6$/H$_2$ gas (10 ppm)") in the gas reservoir 674; and GeH$_4$ gas of 99.999% in purity in the gas reservoir 675.

Now, the RF plasma CVD apparatus shown in FIG. 9 is operated before film formation starts. That is, prior to the entrance of raw material gases into the deposition chamber 601, it is confirmed that the valves 651 through 655 and the leak valve 609 are closed and that the inlet valves 631 through 635, the exit valves 641 through 645, and the sub-valve 608' are opened. Then, the conductance valve 607 for the exhaust pipe is opened to evacuate the inside of the deposition chamber 601 and gas piping while operating the vacuum pump (not shown). Then, upon observing that the reading on the vacuum gage 606 became about $1 \times 10^{-4}$ Torr, the sub-valve 608' and the exit valves 641 through 645 are closed.

The comparative nine non-single crystalline SiGe:H semiconductor samples (Sample Nos. CG 1-1 to CG 1-9) were prepared in the following manner using the RF plasma CVD apparatus shown in FIG. 9.

Firstly, there were provided nine SUS 304 stainless steel plates of 1 inch (width)×1.5 inches (length) in size and 1 mm in thickness each having a mirror ground surface as the substrate 604'. On each of the stainless steel plates was formed a 0.1 μm thick Cr film by means of a conventional electron beam evaporation technique.

Each of the stainless steel plates each having the Cr thin film thereon as the substrate 604' was subjected to film formation.

Preparation of Sample No. CG 1-1

The substrate 604' comprising the above stainless steel plate having the Cr thin film thereon was fixed to the surface of the substrate holder 604. The inside of the deposition chamber 501 was evacuated to a vacuum of about $1 \times 10^{-4}$ Torr by operating the vacuum pump in the manner as above described. The substrate 604' was heated to and maintained at 250° C. by actuating the heater 605. Then, the valves 651, 652, 654, and 655, and the exit valves 641, 642, 644, and 645 were opened. Then, the inlet valves 631, 632, 634, and 635, and the sub-valve 608' were gradually opened to introduce SiH$_4$ gas, GeH$_4$ gas, H$_2$ gas and B$_2$/H$_6$/H$_2$ gas (10%) into the deposition chamber 601 through the gas feed pipe 603 and the above described circular gas feed pipe (not shown), when the SiH$_4$ gas, GeH$_4$ gas and the H$_2$ gas were regulated at respective flow rates of 0.6 sccm, 0.4 sccm and 50 sccm by means of the mass flow controllers 621, 622, and 625, and the B$_2$H$_6$/H$_2$ gas (10%) was regulated at a flow rate of 1 sccm (see, Table 12) by means of the mass flow controller 624. The inner pressure of the deposition chamber 601 was controlled to and maintained at a vacuum of 1 Torr by adjusting the opening of the conductance valve 607 while reading the vacuum gage 606. After the flow rate of each of the above raw material gases became stable at the above respective flow rates, the RF power source 613 was switched on to apply a RF power of 5 mW/cm$^3$ to the cathode 602 through the matching box 612. As a result, RF glow discharge was occurred in the deposition chamber 501, wherein the SiH$_4$ gas, GeH$_4$ gas, H$_2$ gas and B$_2$H$_6$/H$_2$ gas (10%) were decomposed to cause plasma, resulting in forming a non-single crystalline SiGe:H:B semiconductor film on the Cr thin film of the substrate 604'. The film formation was continued until the non-single crystalline SiGe:H:B semiconductor film became 3 um thick.

Thereafter, the RF power source was switched off. And the exit valves 641, 642, 644, and 645, and the sub-valve 608' were closed. After the substrate 604' was cooled to room temperature, it was taken out from the deposition chamber 601.

The above film-forming conditions are shown in Tables 12 and 13.

On the surface of the resultant, there was formed a 0.1 μm thick Cr film as an upper electrode by means of a conventional electron beam evaporation technique.

Thus, there was obtained a comparative non-single crystalline SiGe:H:B semiconductor sample (Sample No. CG 1-1).

Preparation of Sample No. CG 1-2

The procedures of preparing the Sample No. CG 1-1 were repeated, except that the flow rate of the $B_2H_6/H_2$ gas (10%) was changed to 0.1 sccm (see, Table 12), to thereby obtain a comparative non-single crystalline SiGe:H:B semiconductor sample (Sample No. CG 1-2).

Preparation of Sample No. CG 1-3

The procedures of preparing the Sample No. CG 1-1 were repeated, except that the $B_2H_6/H_2$ gas (10%) was replaced by $B_2H_6/H_2$ gas (10 ppm) and the $B_2H_6/H_2$ gas (10 ppm) was introduced into the deposition chamber 601 at a flow rate of 5 sccm (see, Table 12), to thereby obtain a comparative non-single crystalline SiGe:H:B semiconductor sample (Sample No. CG 1-3).

Preparation of Sample No. CG 1-4

The procedures of preparing the Sample No. CG 1-3 were repeated, except that the flow rate of the $B_2H_6/H_2$ gas (10 ppm) was changed to 1 sccm (see, Table 12), to thereby obtain a comparative non-single crystalline SiGe:H:B semiconductor sample (Sample No. CG 1-4).

Preparation of Sample No. CG 1-5

The procedures of preparing the Sample No. CG 1-1 were repeated, except that the $B_2H_6/H_2$ gas (10%) was not used (see, Table 12), to thereby obtain a comparative non-single crystalline SiGe:H semiconductor sample (Sample No. CG 1-5).

Preparation of Sample No. CG 1-6

The procedures of preparing the Sample No. CG 1-1 were repeated, except that the $B_2H_6/H_2$ gas (10%) was replaced by $PH_3/H_2$ gas (10 ppm) from the gas reservoir 673 and the $PH_3/H_2$ gas (10 ppm) was introduced into the deposition chamber 601 at a flow rate of 1 sccm (see, Table 12), to thereby obtain a comparative non-single crystalline SiGe:H:P semiconductor sample (Sample No. CG 1-6).

Preparation of Sample No. CG 1-7

The procedures of preparing the Sample No. CG 1-6 were repeated, except the flow rate of the $PH_3/H_2$ gas (10 ppm) was changed to 5 sccm (see, Table 12), to thereby obtain a comparative non-single crystalline SiGe:H:P semiconductor sample (Sample No. CG 1-7).

Preparation of Sample No. CG 1-8

The procedures of preparing the Sample No. CG 1-1 were repeated, except that the $B_2H_6/H_2$ gas (10%) was replaced by $PH_3/H_2$ gas (10%) from the gas reservoir 673 and the $PH_3/H_2$ gas (10%) was introduced into the deposition chamber 601 at a flow rate of 0.1 sccm (see, Table 12), to thereby obtain a comparative non-single crystalline SiGe:H:P semiconductor sample (Sample No. CG 1-8).

Preparation of Sample No. CG 1-9

The procedures of preparing the Sample No. CG 1-8 were repeated, except that the flow rate of the $PH_3/H_2$ gas (10%) was changed to 1 sccm (see, Table 12), to thereby obtain a comparative non-single crystalline SiGe:H:P semiconductor sample (Sample No. CG 1-9).

Evaluation (1) As for each of Samples Nos. EG 1-1 to 1-9 and Samples Nos. CG 1-1 to 1-9, doping efficiency was observed in the following manner.

That is, the sample was set to a commercially available cryostat (trademark name: WM-365, produced by Sanwa Musenki Kenkyusho Kabushiki Kaisha), wherein using a commercially available picoammeter (trademark name: 4140B, produced by Yokokawa-Hewllet Packard Company), there was applied a predetermined voltage between the substrate made of stainless steel and the Cr thin film as the upper electrode while changing the temperature (T: absolute temperature) of the sample, to measure an electric current (Id) flown between the substrate and the upper electrode. On the basis of the measured results, there was obtained a gradient of the natural logarithm of electric current (log. Id) against the inverse number of temperature (1/T), and the gradient obtained was multiplied by the Boltzmann constant, to thereby obtain an activation energy of the sample.

This evaluation was conducted as for each of the samples.

As a result, the following facts were found. That is, (i) the activation energy of Sample No. EG 1-5 (that is, the non-doped sample) is substantially the same as that of Sample No. CG 1-5 (that is, the non-doped sample); (ii) the rate of change in activation energy of each of Samples Nos. EG 1-3, 1-4, 1-6 and 1-7 (doped with a dopant in a small amount) is greater as much as 1.9 to 2.4 times over that of each of Samples Nos. CG 1-3, 1-4, 1-6 and 1-7 (doped with a dopant in a small amount); and (iii) the rate of change in activation energy of each of Samples Nos. EG 1-1, 1-2, 1-8 and 1-9 (doped with a dopant in a large amount) is 0.4 to 0.6 time over that of each of Samples Nos. CG 1-1, 1-2, 1-8 and 1-9 (doped with a dopant in a large amount). From these results, it is understood that the samples according to the present invention are surpassing the comparative samples in terms of doping efficiency.

(2) As for each of Samples Nos. EG 1-1 to 1-9 and Samples Nos. CG 1-1 to 1-9, there were observed an average radius as for the microvoids contained and a density of the microvoids (that is, a microviod density) using a commercially available small angle X-ray scattering instrument (trademark name: RAD-IIIb, produced by Rigakudenki Kabushiki Kaisha). As a result, the following facts were found. That is, each of Samples Nos. EG 1-1 to 1-9 (belonging to the present invention) is of 2.7 to 2.9 Å in average radius as for the microvoids contained and has a microvoid density in the range of from $5.6 \times 10^{18}$ $(cm^{-3})$ to $8.3 \times 10^{18}$ $(cm^{-3})$; on the other hand, each of Samples Nos. CG 1-1 to 1-9 (comparative samples) is of 3.8 to 4.0 Å in average radius as for the microvoids contained and has a microvoid density in the range of from $2.0 \times 10^{19}$ $(cm^{-3})$ to $3.1 \times 10^{19}$ $(cm^{-3})$.

(3) As for each of Samples Nos. EG 1-1 to 1-9 and Samples Nos. CG 1-1 to 1-9, there was observed the situation of microvoids present at the surface using a commercially available STM (trademark name: MANOSCOPE-II, produced by Digital Instrument Company). As a result, it was found that the average radius and the number of the microvoids present at the surface of each of the samples according to the present invention (that is, Samples Nos. EG 1-1 to 1-9) are distinguishably smaller than those of each of the comparative samples (that is, Samples Nos. CG 1-1 to 1-9).

In addition, as for each of Samples Nos. EG 1-1 to 1-9 and Samples Nos. CG 1-1 to 1-9, there was observed its crystallinity using a commercially available RHEED (trademark name: JEM-100SX, produced by JEOL, Ltd.). As a result, a ring pattern indicating amorphous material (including microcrystalline material) was observed as for each of the samples.

Experiments 7 and 8 and Comparative Experiments 7 and 8

Experiment 7

There was prepared a pin junction semiconductor device (having a stacked pin junction semiconductor active region formed of the specific non-single crystalline semiconductor according to the present invention), following the procedures of preparing Sample No. EG 1-1 using the microwave plasma CVD apparatus of FIG. 6 in Experiment 6.

Firstly, there was provided a SUS 304 stainless steel plate of 50 mm×50 mm in size and 1 mm in thickness having a mirror ground surface on which a film is to be formed as a substrate (that is, the substrate 504' in FIG. 6).

Formation of P-Type Semiconductor Layer

The substrate 504' was fixed to the surface of the substrate holder 504. The inside of the deposition chamber 501 was evacuated to a vacuum of about $1 \times 10^{-4}$ Torr by operating the vacuum pump. The substrate 504' was heated to and maintained at 350° C. by actuating the heater 505. Then, the valves 551, 552, 554, and 555, and the exit valves 541, 542, 544, and 545 were opened. Then, the inlet valves 531, 532, 534, and 535, and the sub-valve 508' were gradually opened to introduce $SiH_4$ gas, $D_2$ gas, $B_2H_6/H_2$ gas (10%), and $GeH_4$ gas into the deposition chamber 501 through the gas feed pipe 503 and the above described circular gas feed pipe (not shown) at respective flow rates of 3 sccm, 100 sccm, 5 sccm and 2 sccm. The inner pressure of the deposition chamber 501 was controlled to and maintained at a vacuum of 2 mTorr by adjusting the opening of the conductance valve 507 while reading the vacuum gage 506. After the flow rate of each of the above raw material gases became stable at the above respective flow rates, the DC power source 511 was switched on to apply a DC bias voltage of $-90$ V to the deposition chamber 501, simultaneously with this, the RF power source 513 was switched on to apply a RF power of 0.8 mW/cm³ to the substrate 504' through the matching box 512. At the same time, the microwave power source (not shown in the figure) was switched on to apply a microwave power of 60 mW/cm³ into the deposition chamber 501 through the wave guide 510 and the microwave transmissive window 502. As a result, discharge was occurred in the deposition chamber 501, wherein the $SiH_4$ gas, $GeH_4$ gas, $D_2$ gas and $B_2H_6/H_2$ gas (10%) were decomposed to cause plasma, resulting in forming a non-single crystalline SiGe:H:B semiconductor film on the mirror ground surface of the substrate 504'. The film formation was continued until the non-single crystalline SiGe:H:B semiconductor film became 10 nm thick. Thus, there was formed the p-type semiconductor layer.

Formation of I-Type Semiconductor Layer

The procedures of forming the p-type semiconductor layer were repeated, except for not using the $B_2H_6/H_2$ gas (10%).

That is, the substrate 504' having the p-type semiconductor layer formed thereon was maintained at 350° C. Then, the valves 551, 552, and 555, and the exit valves 541, 542, and 545 were opened. Then, the inlet valves 531, 532, and 535, and the sub-valve 508' were gradually opened to introduce $SiH_4$ gas, $GeH_4$ gas, and $D_2$ gas into the deposition chamber 501 at respective flow rates of 3 sccm, 2 sccm and 100 sccm. The inner pressure of the deposition chamber 501 was controlled to and maintained at a vacuum of 2 mTorr. After the flow rate of each of the above raw material gases became stable at the above respective flow rates, the DC power source 511 was switched on to apply a DC bias voltage of $-90$ V to the deposition chamber 501, simultaneously with this, the RF power source 513 was switched on to apply a RF power of 0.8 mW/cm³ to the substrate 504' through the matching box 512. At the same time, the microwave power source was switched on to apply a microwave power of 60 mW/cm³ into the deposition chamber 501. As a result, discharge was occurred in the deposition chamber 501, wherein the $SiH_4$ gas, $GeH_4$ gas and $D_2$ gas were decomposed to cause plasma, resulting in forming a non-single crystalline SiGe:H semiconductor film on the previously formed p-type semiconductor layer. The film formation was continued until the non-single crystalline Si:H semiconductor film became 500 nm thick. Thus, there was formed the i-type semiconductor layer.

Formation of N-Type Semiconductor Layer

The procedures of forming the p-type semiconductor layer were repeated, except for replacing the $B_2H_6/H_2$ gas (10%) by $PH_3/H_2$ gas (10%).

That is, the substrate 504' having the p-type semiconductor layer and the i-type semiconductor layer formed thereon was maintained at 350° C. Then, the valves 551, 552, 553, and 555, and the exit valves 541, 542, 543, and 545 were opened. Then, the inlet valves 531, 532, 533, and 535, and the sub-valve 508' were gradually opened to introduce $SiH_4$ gas, $GeH_4$ gas, $D_2$ gas and $PH_3/H_2$ gas (10%) into the deposition chamber 501 at respective flow rates of 3 sccm, 2 sccm, 100 sccm and 5 sccm. The inner pressure of the deposition chamber 501 was controlled to and maintained at a vacuum of 2 mTorr. After the flow rate of each of the above raw material gases became stable at the above respective flow rates, the DC power source 511 was switched on to apply a DC bias voltage of $-90$ V to the deposition chamber 501, simultaneously with this, the RF power source 513 was switched on to apply a RF power of 0.8 mW/cm³ to the substrate 504' through the matching box 512. At the same time, the microwave power source was switched on to apply a microwave power of 60 mW/cm³ into the deposition chamber 501. As a result, discharge was occurred in the deposition chamber 501, wherein the SiH₄ gas, GeH₄ gas, D₂ gas and PH₃/H₂ gas (10%) were decomposed to cause plasma, resulting in forming a non-single crystalline SiGe:H:P semiconductor film on the previously formed i-type semiconductor layer. The film formation was continued until the non-single crystalline SiGe:H:P semiconductor film became 10 nm thick. Thus, there was formed the n-type semiconductor layer.

Thereafter, the microwave power source, the RF power source and the DC power source were switched off. At the same time, the exit valves 541, 542, 543, and 545, and the sub-valve 508' were closed. After the substrate 504' was cooled to room temperature, it was taken out from the deposition chamber 501.

Then, on the surface of the n-type layer of the resultant, there was formed an ITO (In₂O₃+SnO₂) film of 70 nm as a transparent and conductive layer by means of a conventional resistance heating evaporation technique.

Thus, there was obtained a pin junction semiconductor device (Sample No. EG 2).

The above conditions for the preparation of the pin junction semiconductor device (Sample No. EG 2) are collectively shown in Table 14.

Experiment 8

The procedures of Experiment 7 were repeated, except that the n-type semiconductor layer was first formed on the substrate and the p-type semiconductor layer was formed on the i-type semiconductor layer and that the i-type semiconductor layer was formed at a thickness of 3 μm, to thereby obtain a nip junction semiconductor device (Sample No. EG 3).

Comparative Experiment 7

There was prepared a comparative pin junction semiconductor device (having a stacked pin junction semiconductor active region formed of the conventional non-single crystalline semiconductor), following the procedures of preparing Sample No. CG 1-1 using the RF plasma CVD apparatus of FIG. 9 in Comparative Experiment 6.

Firstly, there was provided a SUS 304 stainless steel plate of 50 mm×50 mm in size and 1 mm in thickness having a mirror ground surface on which a film is to be formed as a substrate (that is, the substrate 604' in FIG. 9).

Formation of P-Type Semiconductor Layer

The substrate 604' was fixed to the surface of the substrate holder 604. The inside of the deposition chamber 501 was evacuated to a vacuum of about 1×10⁻⁴ Torr by operating the vacuum pump. The substrate 604' was heated to and maintained at 250° C. by actuating the heater 605. Then, the valves 651, 652, 654, and 655, and the exit valves 641, 642, 644, and 645 were opened. Then, the inlet valves 631, 632, 634, and 635, and the sub-valve 608' were gradually opened to introduce SiH₄ gas, GeH₄ gas, H₂ gas and B₂/H₆/H₂ gas (10%) into the deposition chamber 601 through the gas feed pipe 603 and the above described circular gas feed pipe (not shown) at respective flow rates of 0.6 sccm, 0.4 sccm, 50 sccm and 1 sccm. The inner pressure of the deposition chamber 601 was controlled to and maintained at a vacuum of 1 Torr by adjusting the opening of the conductance valve 607 while reading the vacuum gage 606. After the flow rate of each of the above raw material gases became stable at the above respective flow rates, the RF power source 613 was switched on to apply a RF power of 5 mW/cm³ to the cathode 602 through the matching box 612. As a result, RF glow discharge was occurred in the deposition chamber 501, wherein the SiH₄ gas, GeH₄ gas, H₂ gas and B₂H₆/H₂ gas (10%) were decomposed to cause plasma, resulting in forming a non-single crystalline SiGe:H:B semiconductor film on the mirror ground surface of the substrate 604'. The film formation was continued until the non-single crystalline SiGe:H:B semiconductor film became 10 nm thick. Thus, there was formed the p-type semiconductor layer.

Formation of I-Type Semiconductor Layer

The procedures of forming the p-type semiconductor layer were repeated, except for not using the B₂H₆/H₂ gas (10%).

That is, the substrate 604' having the p-type semiconductor layer formed thereon was maintained at 250° C. Then, the valves 651, 652, and 655, and the exit valves 641, 642, and 645 were opened. Then, the inlet valves 631, 632, and 635, and the sub-valve 608' were gradually opened to introduce SiH₄ gas, GeH₄ gas and H₂ gas into the deposition chamber 601 at respective flow rates of 0.6 sccm, 0.4 sccm and 50 sccm. The inner pressure of the deposition chamber 601 was controlled to and maintained at a vacuum of 1 Torr. After the flow rate of each of the above raw material gases became stable at the above respective flow rates, the RF power source 613 was switched on to apply a RF power of 5 mW/cm³ to the cathode 602 through the matching box 612. As a result, RF glow discharge was occurred in the deposition chamber 501, wherein the SiH₄ gas, GeH₄ gas and H₂ gas were decomposed to cause plasma, resulting in forming a non-single crystalline SiGe:H semiconductor film on the p-type semiconductor layer of the substrate 604'. The film formation was continued until the non-single crystalline Si:H semiconductor film became 500 nm thick. Thus, there was formed the i-type semiconductor layer.

Formation of N-Type Semiconductor Layer

The procedures of forming the p-type semiconductor layer, except for replacing the B₂H₆/H₂ gas (10%) by PH₃/H₂ gas (10%).

That is, the substrate 604' having the p-type semiconductor layer and the i-type semiconductor layer formed thereon was maintained at 250° C. Then, the valves 651, 652, 653, and 655, and the exit valves 641, 642, 643, and 645 were opened. Then, the inlet valves 631, 632, 633, and 635, and the sub-valve 608' were gradually opened to introduce SiH₄ gas, GeH₄ gas, H₂ gas and PH₃/H₂ gas (10%) into the deposition chamber 601 at respective flow rates of 0.6 sccm, 0.4 sccm, 50 sccm and 1 sccm. The inner pressure of the deposition chamber 601 was controlled to and maintained at a vacuum of 1 Torr. After the flow rate of each of the above raw material gases became stable at the above respective flow rates, the RF power source 613 was switched on to apply a RF power of 5 mW/cm³ to the cathode 602 through the matching box 612. As a result, RF glow discharge was occurred in the deposition chamber 501, wherein the SiH$_4$ gas, GeH$_4$ gas, H$_2$ gas and PH$_3$/H$_2$ gas (10%) were decomposed to cause plasma, resulting in forming a non-single crystalline SiGe:H:P semiconductor film on the i-type semiconductor layer of the substrate 604'. The film formation was continued until the non-single crystalline SiGe:H:P semiconductor film became 10 nm thick. Thus, there was formed the n-type semiconductor layer.

Thereafter, the RF power source was switched off. And the exit valves 641, 642, 643, and 645, and the sub-valve 608' were closed. After the substrate 604' was cooled to room temperature, it was taken out from the deposition chamber 601.

Then, on the surface of the n-type layer of the resultant, there was formed an ITO (In$_2$O$_3$+SnO$_2$) film of 70 nm as a transparent and conductive layer by means of a conventional resistance heating evaporation technique.

Thus, there was obtained a comparative pin junction semiconductor device (Sample No. CG 2).

The above conditions for the preparation of the comparative pin junction semiconductor device (Sample No. CG 2) are collectively shown in Table 15.

Comparative Example 8

The procedures of Comparative Experiment 7 were repeated, except that the n-type semiconductor layer was first formed on the substrate and the p-type semiconductor layer was formed on the i-type semiconductor layer and that the i-type semiconductor layer was formed at a thickness of 3 μm, to thereby obtain a comparative nip junction semiconductor device (Sample No. CG 3).

Evaluation (1) Each of Sample No. EG 2 and Sample No. CG 2 was evaluated with respect to (a) pin junction property, (b) the situation of the boron atoms (B) and phosphorous atoms (P) to have been diffused into the i-type semiconductor layer, and (c) leakage current.

Evaluation of the above item (a)

As for each of Sample No. EG 2 and Sample No. CG 2, there was observed a pin junction property in the following manner. That is, a predetermined voltage was applied between the substrate made of stainless steel and the transparent and conductive layer of the sample using a picoammeter (produced by Yokokawa-Hewllet Packard Company), to obtain current/voltage characteristics. On the basis of the results obtained, an n-value as for the pin junction was obtained in accordance with the measuring method described in *Physics of Semiconductor Devices* (2nd Edition) published by John Willey & Sons, edited by S. M. Sze, pp. 89–92.

As a result, it was found that the n-value of Sample No. EG 2 (that is, the pin junction semiconductor device according to the present invention) is 0.79 time over that of Sample No. CG 2 (that is, the conventional pin junction semiconductor device), and because of this, Sample No. EG 2 is surpassing Sample No. CG 2 in terms of pin junction characteristics.

Evaluation of the above item (b)

As for each of Sample No. EG 2 and Sample No. CG 2, the amount of each of phosphorous atoms (P) and boron atoms (B) contained in the i-type semiconductor layer was measured by means of a commercially available secondary ion mass spectrometer (trademark name: IMS-3F, produced by CAMECA Company).

As a result, it was found that the amount of P contained in the i-type semiconductor layer of Sample No. EG 2 is 0.8 time over that in the i-type semiconductor layer of Sample No. CG 2, and the amount of B contained in the former is 0.3 time over that in the latter.

Evaluation of the above item (c)

As for each of Sample No. EG 2 and Sample No. CG 2, there was observed a leakage current in the following manner. That is, a leakage current at a prescribed reverse bias voltage was observed using a picoammeter (trademark name: 4140B, produced by Yokokawa-Hewllet Packard Company), wherein a predetermined voltage was applied between the substrate made of stainless steel and the transparent and conductive layer of the sample to obtain current/voltage characteristics.

As a result, it was found that the leakage current in Sample No. EG 2 is 0.42 time smaller over that in Sample No. CG 2, and thus, the constituent thin semiconductor films of the former are surpassing those of the latter in terms of semiconductor characteristics.

(2) Each of Sample No. EG 2, Sample No. EG 3, Sample No. CG 2, and Sample No. CG 3 was evaluated with respect to electron mobility and hole mobility in accordance with the foregoing time-of-flight method.

As a result, it was found that the hole mobility in Sample No. EG 2 (that is, the semiconductor device according to the present invention) is greater as much as 3.3 times over that in Sample No. CG 2 (that is, the conventional semiconductor device); the electron mobility in Sample No. EG 3 (that is, the semiconductor device according to the present invention) is greater as much as 1.7 times over that in Sample No. CG 3 (that is, the conventional semiconductor device); and thus, Samples Nos. EG 2 and EG 3 are surpassing any of Samples Nos. CG 2 and CG 3 in terms of semiconductor characteristics.

Experiment 9 and Comparative Experiment 9

Experiment 9

The procedures of Experiment 7 were repeated, except that the thickness of each of the p-type semiconductor layer and the n-type semiconductor layer was changed to 2 nm, to thereby obtain a pin junction semiconductor device (Sample No. EG 4).

Comparative Experiment 9

The procedures of Comparative Experiment 7 were repeated, except that the thickness of each of the p-type semiconductor layer and the n-type semiconductor layer was changed to 2 nm, to thereby obtain a comparative pin junction semiconductor device (Sample No. CG 4).

Evaluation

As for each of Sample No. EG 4 and Sample No. CG 4, there was observed a leakage current in the following manner. That is, a leakage current at a prescribed reverse bias voltage was observed using a picoammeter (trademark name: 4140B, produced by Yokokawa-Hewllet Packard Company), wherein a predetermined voltage was applied between the substrate made of stainless steel and the transparent and conductive layer of the sample to obtain current/voltage characteristics.

As a result, it was found that the leakage current in Sample No. EG 4 is 0.07 time smaller over that in Sample No. CG 4, and thus, the constituent thin semiconductor films of the former are surpassing those of the latter in terms of semiconductor characteristics.

Experiment 10 and Comparative Experiment 10

Experiment 10

(1) There were prepared three non-single crystalline SiGe:H samples (Sample Nos. EG 5-1-(1), EG 5-2-(1) and EG 5-3-(1)) by repeating the procedures of Experiment 6 under the conditions shown in Table 17, wherein the flow rate of $D_2$ gas was changed as shown in Table 16 in each case.

(2) There were prepared three pin junction semiconductor devices (Sample Nos. EG 5-1-(2), EG 5-2-(2) and EG 5-3-(2)) by repeating the procedures of Experiment 7, except that the i-type semiconductor layer was formed under the conditions shown in Table 18, wherein the flow rate of $D_2$ gas at the time of forming the i-type semiconductor layer was changed as shown in Table 16 in each case.

Comparative Experiment 10

(1) There was prepared a comparative non-single crystalline SiGe:H sample (Sample No. CG 5(1)) by repeating the procedures of Experiment 6 under the conditions shown in Table 17 wherein not $D_2$ gas but $H_2$ gas was used, and the flow rate of the $H_2$ gas was made to be 50 sccm as shown Table 16.

(2) There was prepared a comparative pin junction semiconductor device (Sample No. CG 5(2)) by repeating the procedures of Experiment 7, except that the i-type semiconductor layer was formed under the conditions shown in Table 18 wherein not $D_2$ gas but $H_2$ gas was used, and the flow rate of the $H_2$ gas was made to be 50 sccm as shown Table 16.

Evaluation (1) As for each of Samples Nos. EG 5-1-(1), EG 5-2-(1) and EG 5-3-(1) and Sample No. CG 5(1), there were observed an average radius as for the microvoids and a microvoid density using the foregoing small angle X-ray scattering instrument. The results obtained are shown in FIG. 10.

(2) As for each of Samples Nos. EG 5-1-(1), EG 5-2-(1) and EG 5-3-(1) and Sample No. CG 5(1), there was examined the crystallinity using the foregoing RHEED. The results obtained are described in FIG. 10.

(3) Each of Samples Nos. EG 5-1-(2), EG 5-2-(2) and EG 5-3-(2) and Sample No. CG 5(2) was evaluated with respect to n-value, hole mobility and leakage current, respectively in the same manner as above described.

Figure 10:
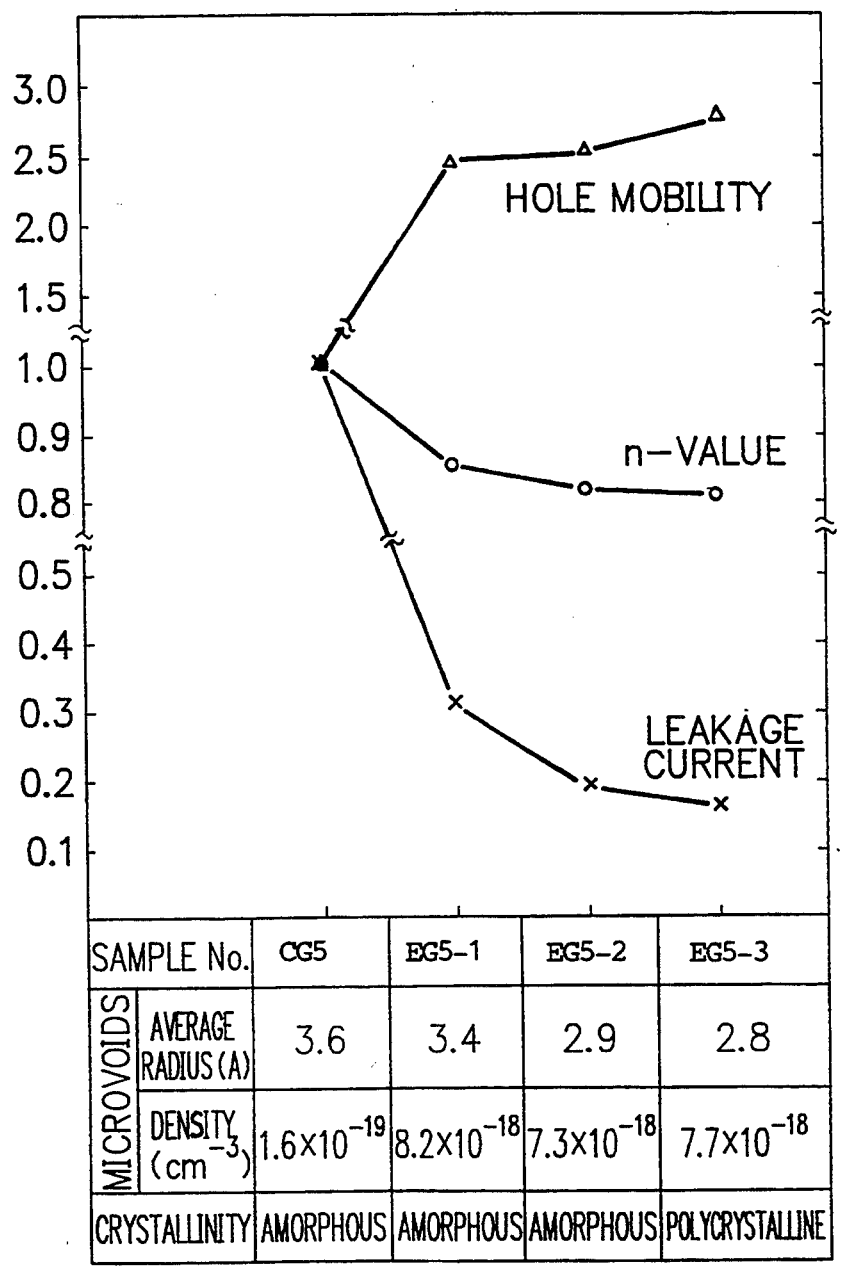
FIG. 10 is a graph showing the interrelations of hole mobility, n-value, leakage current, average radius and density of microvoids, and crystallinity with respect to a conventional n-single crystalline Ge semiconductor and non-single crystalline Ge semiconductors according to the present invention.

The results obtained are graphically shown in FIG. 10, wherein the values shown as for each of Samples Nos. EG 5-1, EG 5-2 and EG 5-3 are relative to those of CG 5 which were set at 1.

As is apparent from the results shown in FIG. 10, it is understood that any of the non-single crystalline SiGe:H samples according to the present invention is of less than 3.5 Å in average radius as for the microvoids contained and less than $1 \times 10^{19}$ (cm$^{-3}$) in microvoid density, and that any of the pin junction semiconductor device samples according to the present invention is surpassing the comparative pin junction semiconductor device sample in terms of n-value, hole mobility and leakage current.

Experiment 11 and Comparative Experiment 11

Experiment 11

(1) There was prepared a non-single crystalline Ge:H sample (Sample No. EG 6(1)) by repeating the procedures of Experiment 6 under the conditions shown in Table 19, wherein GeH$_4$ gas and D$_2$ gas were used as the raw material gases.

(2) There was prepared a pin junction semiconductor device (Sample No. EG 6(2)) by repeating the procedures of Experiment 7 under the conditions shown in Table 20, wherein the i-type semiconductor layer was formed with the use of GeH$_4$ gas and D$_2$ gas without using SiH$_4$ gas.

Comparative Experiment 11

(1) There was prepared a comparative non-single crystalline Ge:H sample (Sample No. CG 6(1)) by repeating the procedures of Experiment 6 under the conditions shown in Table 21, wherein GeH$_4$ gas and H$_2$ gas were used as the raw material gases.

(2) There was prepared a comparative pin junction semiconductor device (Sample No. CG 6(2)) by repeating the procedures of Experiment 7 under the conditions shown in Table 22, wherein the i-type semiconductor layer was formed with the use of GeH$_4$ gas and H$_2$ gas without using SiH$_4$ gas.

Evaluation (1) As for each of Sample No. EG 6(1) and Sample No. CG 6(1), there were observed an average radius as for the microvoids and a microvoid density using the foregoing small angle X-ray scattering instrument.

As a result, it was found that Sample No. EG 6(1) (that is, the non-single crystalline Ge:H semiconductor according to the present invention) is of 3.2 Å in average radius as for the microvoids contained and $9.1 \times 10^{18}$ (cm$^{-3}$) in microvoid density; on the other hand, Sample No. CG 6(1) (that is, the comparative non-single crystalline Ge:H semiconductor) is 3.9 Å in average radius as for the microvoids and $2.2 \times 10^{19}$ (cm$^{-3}$) in microvoid density.

(2) As for each of Sample No. EG 6(1) and Sample No. CG 6(1), there was examined the crystallinity using the foregoing RHEED.

As a result, any of the samples showed a ring-like pattern indicating an amorphous material (including microcrystalline material).

(3) Each of Sample No. EG 6(2) and Sample No. CG 6(2) was evaluated with respect to n-value, hole mobility and leakage current, respectively in the same manner as above described.

As a result, it was found that Sample No. 6(2) (that is, the pin junction semiconductor device sample according to the present invention) is surpassing the comparative pin junction semiconductor device sample (Sample No. CG 6(2)) in terms of n-value, hole mobility and leakage current.

Any of the foregoing silicon- or/and germanium-containing non-single crystalline semiconductors (1) to (3) according to the present invention is suitable for use as a constituent element of various semiconductor devices such as electrophotographic light receiving devices, solar cells, thin film transistors, photosensors, and the like.

In the following, description will be made of semiconductor devices in which any of the foregoing silicon- or and germanium-containing non-single crystalline semiconductors (1) to (3) according to the present invention is used.

FIG. 1 is a schematic cross section view illustrating the configuration of an example of an electrophotographic light receiving device in which any of the foregoing silicon- or and germanium-containing non-single crystalline semiconductors (1) to (3) according to the present invention is used.

In FIG. 1, reference numeral 104 indicates the entire of the electrophotographic light receiving device which comprises a charge injection inhibition layer 102 and a photoconductive layer 103 being disposed in this order on a substrate 101.

The charge injection inhibition layer 102 is composed of one of the foregoing silicon- or and germanium-containing non-single crystalline semiconductors (1) to (3) according to the present invention.

In the case where the electrophotographic light receiving device is for positively charging, the charge injection inhibition layer 102 is constituted by one of the silicon- or/and germanium-containing non-single crystalline semiconductors (1)to (3) according to the present invention into which atoms of an element belonging to Group IIIb of the periodic table are incorporated. In the case where the electrophotographic light receiving device is for negatively charging, the charge injection inhibition layer 102 is constituted by one of the silicon- or/and germanium-containing non-single crystalline semiconductors (1) to (3) according to the present invention into which atoms of an element belonging to Group Vb of the periodic table are incorporated.

In a preferred embodiment, the charge injection inhibition layer 102 is composed of the foregoing microcrystalline silicon- or/and germanium-containing microcrystalline semiconductor (that is, the $\mu$c-Si(H,X), $\mu$c-Ge(H,X) or uc-SiGe(H,X)) or the polycrystalline silicon-or/and germanium-containing semiconductor (that is, the poly-Si(H,X), poly-Ge(H,X) or poly-SiGe(H,X)) according to the present invention into which the atoms of an element belonging to group IIIb or the atoms of an element belonging to group Vb are incorporated.

The photoconductive layer 103 is composed of one of the foregoing silicon- or/and germanium-containing non-single crystalline semiconductors (1) to (3) according to the present invention.

In a preferred embodiment, the photoconductive layer 103 is composed of the foregoing silicon- or/and germanium-containing amorphous semiconductor (that is, the a-Si(H,X), a-Ge(H,X) or a-SiGe(H,X)) according to the present invention.

The thickness of each of the charge injection inhibition layer 102 and the photoconductive layer 102 should be properly determined depending upon the electrophotographic image-forming conditions employed.

However, in general, the charge injection inhibition layer is made to be of a thickness preferably in the range of from 100 Å to 10 $\mu$m, more preferably in the range of from 1000 Å to 7 $\mu$m, most preferably in the range of from 5000 Å to 5 $\mu$m. The photoconductive layer 103 is made to be of a thickness preferably in the range of from 1 $\mu$m to 100 $\mu$m, more preferably in the range of from 5 $\mu$m to 50 $\mu$m, most preferably in the range of from 10 $\mu$m to 40 $\mu$m.

The electrophotographic light receiving device thus configured exhibits an improved charge retentivity and an excellent photosensitivity without causing residual charges and stably and continuously provides high quality copied images which are not accompanied by ghosts or smeared images.

In the case where the electrophotographic light receiving device is comprised of the non-single crystalline Ge(H,X) or non-single crystalline SiGe(H,X) according to the present invention, it is suitable for image formation by using a laser beam printer utilizing a semiconductor laser of infrared ray, wherein it exhibits an excellent matching property with the semiconductor laser and shows quick light response, and it is free from interference fringe patterns even after repeated use over a long period of time.

The photoconductive layer 103 may be a multi-layered structure comprising, for example, a charge transporting layer and a charge generating layer. In this case, it is desired that the charge transporting layer is composed of the foregoing non-single crystalline Si(H,X) semiconductor or non-single crystalline Ge(H,X) semiconductor according to the present invention and the charge generating layer is composed of the foregoing non-single crystalline Ge(H,X) semiconductor or non-single crystalline Si(H,X) semiconductor according to the present invention. In this case, it is possible that the non-single crystalline Ge(H,X) semiconductor is replaced by the foregoing non-single crystalline SiGe(H,X) semiconductor according to the present invention.

The above electrophotographic light receiving device is desired to have a surface layer in order to improve its charge retentivity and durability and in order to ensure its resistance not only to moisture but also environments.

The surface layer may be formed of a non-single Si material containing at least one kind of atoms selected from carbon atoms, nitrogen atoms and oxygen atoms or a boron nitride.

Figure 2:
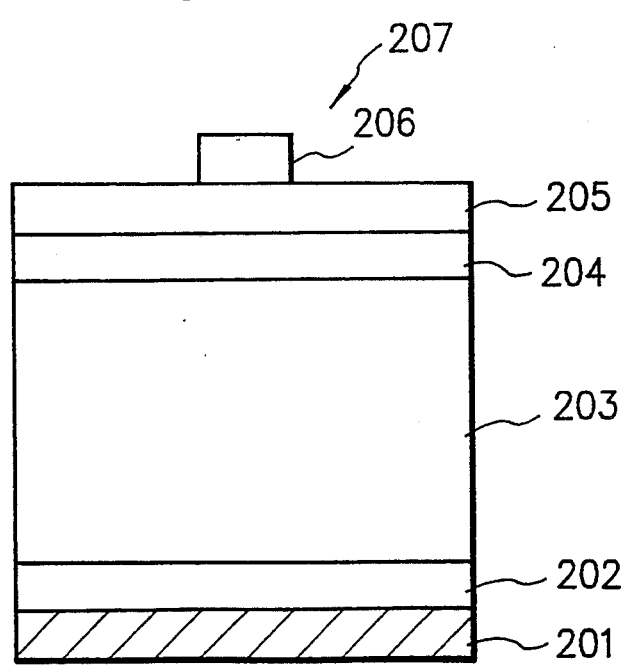
FIG. 2 is a schematic cross-section view illustrating the configuration of a solar cell in which a non-single crystalline semiconductor according to the present invention is used.

FIG. 2 is a schematic cross Section view illustrating the configuration of an example of a solar cell having a pin junction semiconductor active layer for which any of the foregoing silicon- or/and germanium-containing non-single crystalline semiconductors (1) to (3) according to the present invention is used.

In FIG. 2, reference numeral 207 indicates the entire of the solar cell. The solar cell 207 shown in FIG. 2 comprises a substrate 201 having a conductive surface, an n-type semiconductor layer 202 disposed on the conductive surface of the substrate 201, an i-type semiconductor layer 203 disposed on the n-type semiconductor layer 202, a p-type semiconductor layer 204 disposed on the i-type semiconductor layer 203, a transparent and conductive layer 204 disposed on the p-type semiconductor layer 204, and a collecting electrode 206 disposed on the transparent and conductive layer 205.

The solar cell 207 may have a reflective layer or a reflection promoting layer (not shown) between the substrate 201 and the n-type semiconductor layer 202.

The substrate 201 of the solar cell 207 shown in FIG. 2 may be formed of a light transmissive material. In this case, the layer configuration shown in FIG. 2 is desired to be reversed.

The n-type semiconductor layer 202 is composed of one of the foregoing silicon- or/and germanium-containing non-single crystalline semiconductors (1) to (3) each having been doped with atoms of an element belonging to group Vb of the periodic table. The p-type semiconductor layer 204 is composed of one of the foregoing silicon- or/and germanium-containing non-single crystalline semiconductors (1) to (3) each having been doped with atoms of an element belonging to group IIIb of the periodic table. In any case, the non-single crystalline semiconductor by which each of the n-type semiconductor layer 202 and the p-type semiconductor layer 204 is constituted is one of the foregoing silicon- or/and germanium-containing microcrystalline semiconductors (that is, the foregoing uc-Si(H,X), uc-Ge(H,X) or uc-SiGe(H,X)) or one of the foregoing silicon- or/and germanium-containing polycrystalline semiconductors (that is, the foregoing poly-Si(H,X), poly-Ge(H,X) or poly-SiGe(H,X)).

As for the thickness of each of the n-type semiconductor layer 202 and the p-type semiconductor layer 204, it is desired to be thinned as much as possible since these semiconductor layers do not contribute to generating photocurrents although they absorb light. However, in general, it is desired for each of the n-type semiconductor layer 202 and the p-type semiconductor layer 204 to be of a thickness preferably in the range of from 10 to 1000 Å, more preferably in the range of from 10 to 200 Å, most preferably in the range of from 20 to 100 Å.

It should be noted to the fact that any of the silicon- or/and germanium-containing non-single crystalline semiconductors according to the present invention which is employed herein exhibits required semiconductor characteristics even in a thin film state of some tens angstromes in thickness because the microvoids contained therein are of a small average radius and a small density as above described.

The i-type semiconductor layer 203 is composed of one of the foregoing silicon- or/and germanium-containing non-single crystalline semiconductors (1) to (3) according to the present invention. In a preferred embodiment, the i-type semiconductor layer 203 is composed of one of the foregoing silicon- or/and germanium-containing amorphous semiconductors according to the present invention (that is, the foregoing a-Si(H,X) semiconductor, a-Ge(H,X) semiconductor, or a-SiGe(H,X)) or one of the foregoing silicon- or/and germanium-containing polycrystalline semiconductors according to the present invention (that is, the foregoing poly-Si(H,X) semiconductor, poly-Ge(H,X) semiconductor, or poly-SiGe(H,X)).

As for the thickness of the i-type semiconductor layer 203, it should be properly determined depending upon the spectrum of light where the solar cell is used. However, in general, it is desired to be in the range of from 500 Å to 1 μm.

The transparent and conductive layer 205 may be formed by using any of the conventional transparent and conductive materials such as ITO, SnO$_2$, etc. which are conventionally used for the formation of the transparent and conductive layer of conventional solar cells. Similarly, the collecting electrode 206 may be formed by using any of the conventional materials which are conventionally used for the formation of the collecting electrode of conventional solar cells.

The solar cell thus configured are significantly advantageous in that an excellent pin junction is provided for the pin junction semiconductor active layer because each of the n-type, i-type and p-type semiconductor layers is constituted by the specific silicon- or/and germanium semiconductor having a small average radius as for the microvoids present therein and a small microvoid density which is dense in texture and the dopant (the impurity in other words) contained in each of the n-type and p-type semiconductor layers is effectively prevented from dispersing into the i-type semiconductor layer; the metal atoms contained in the transparent and conductive layer is effectively prevented from dispersing into the p-type semiconductor layer or the n-type semiconductor layer; and as a result, an improved photoelectric conversion efficiency is provided since incident light is substantially absorbed by the i-type semiconductor layer while being slightly absorbed by each of the p-type and n-type semiconductor layers. Particularly, when either the n-type semiconductor layer or the p-type semiconductor layer is constituted by one of the foregoing non-single crystalline Si(H,X), Ge(H,X) and SiGe(H,X) semiconductors according to the present invention which has a greater forbidden band width than that of the semiconductor by which the i-type semiconductor layer is constituted, the resulting solar cell becomes such that excels in form factor, exhibits a further photoelectric conversion efficiency and outputs an improved photocurrent. In any case, the p-type semiconductor layer or the n-type semiconductor layer which is situated on the side where light is impinged is desired to be constituted by one of the foregoing silicon- or/and germanium-containing microcrystalline and polycrystalline semiconductors according to the present invention. In this case, the light absorption coefficient of the p-type semiconductor layer or the n-type semiconductor layer situated on the side where light is impinged is desirably reduced and a a result, an improvement is provided particularly in photoelectric conversion efficiency of short wavelength light.

In the above, description has been made of the solar cell having a single cell. But the foregoing silicon- or/and germanium-containing non-single crystalline semiconductors according to the present invention are effective for the preparation of a multi-cell pin junction solar cell. As such multi-cell pin junction solar cell, there can be mentioned, for example, a so-called tandem type solar cell in which a pin junction cell of which i-type semiconductor layer being composed of one of the foregoing non-single crystalline Si(H,X) semiconductors according to the present invention and other pin junction cell of which i-type semiconductor layer being composed of one of the foregoing non-single crystalline Ge(H,X) and SiGe(H,X) semiconductors according to the present invention are stacked.

Figure 3:
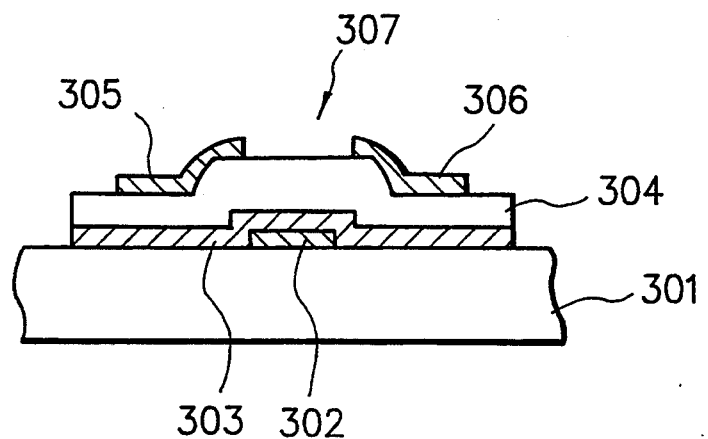
FIG. 3 is a schematic cross-section view illustrating the configuration of a thin film transistor in which a non-single crystalline semiconductor according to the present invention is used.

FIG. 3 is a schematic cross section view illustrating the configuration of an example of a thin film transistor having a semiconductor active layer for which any of the foregoing silicon- or/and germanium-containing non-single crystalline semiconductors (1) to (3) according to the present invention is used.

In FIG. 3, reference numeral 307 indicates the entire of a thin film transistor. The thin film transistor 307 shown in FIG. 3 comprises an insulating substrate 301, a gate electrode 302 disposed on the insulating substrate 301, an insulating layer 303 disposed to cover the gate electrode 302, a semiconductor active layer 304 disposed on the insulating layer 303, a source electrode 305 and a drain electrode 306 each being disposed on the semiconductor active layer 304, wherein the semiconductor active layer 304 is composed of one of the foregoing non-single crystalline Si(H,X), Ge(H,X) and SiGe(H,X) semiconductors according to the present invention.

In the thin film transistor thus configured, the interfacial level between the semiconductor active layer 303 and the insulating layer 303 is reduced so that improved transistor characteristics are exhibited. The thin film transistor excels in durability and stably exhibits desirable transistor characteristics even after repeated use over a long period of time.

Figure 4:
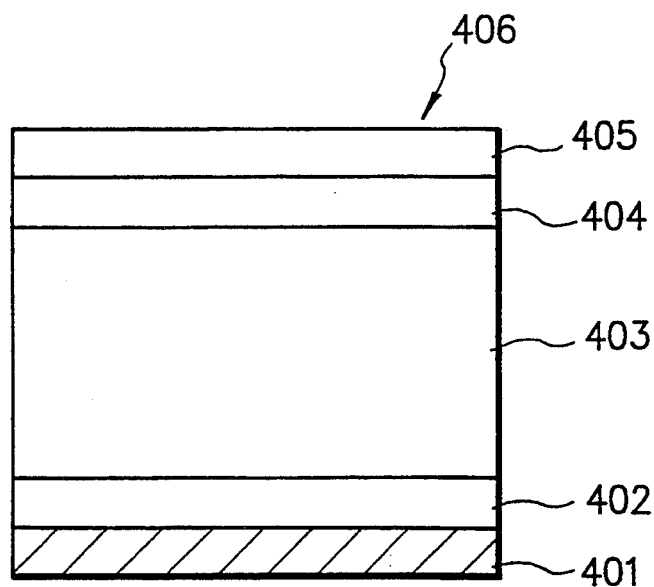
FIG. 4 is a schematic cross-section view illustrating the configuration of a photosensor in which a non-single crystalline semiconductor according to the present invention is used.

FIG. 4 is a schematic cross section view illustrating the configuration of an example of a photosensor having pin or nip junction semiconductor active layer for which any of the foregoing silicon- or/and germanium-containing non-single crystalline semiconductors (1) to (3) according to the present invention is used.

In FIG. 4, reference numeral 406 indicates the entire of a photosensor having a pin or nip junction semiconductor active layer. The photosensor 406 shown in FIG. 4 comprises a substrate 401 having a conductive surface, an n-type or p-type semiconductor layer 402 disposed on the conductive surface of the substrate 401, an i-type semiconductor layer 403 disposed on the n-type or p-type semiconductor layer 402, a p-type or n-type semiconductor layer 404 disposed on the i-type semiconductor layer 403, and a transparent and conductive layer 405 disposed on the p-type or n-type semiconductor layer 405, in which any of the n-type, i-type and p-type semiconductor layers is constituted by one of the foregoing non-single crystalline Si(H,X), Ge(H,X) and SiGe(H,X) semiconductors according to the present invention. Particularly, the n-type semiconductor layer is composed of one of the foregoing non-single crystalline Si(H,X), Ge(H,X) and SiGe(H,X) semiconductors according to the present invention each having been doped with atoms of an element belonging to Group Vb of the periodic table. The p-type semiconductor layer is composed of one of the foregoing non-single crystalline Si(H,X), Ge(H,X) and SiGe(H,X) semiconductors according to the present invention each having been doped with atoms of an element belonging to Group IIIb of the periodic table.

The n-type semiconductor layer and the p-type semiconductor layer are desired to be relatively thickened in comparison with those in the case of the solar cell above described since the photosensor is used by applying a reverse bias. The reverse bias applied is desired to be in the range of from 1 V to 10 V.

The transparent and conductive layer 405 may be formed by using any of the conventional transparent and conductive materials such as ITO, SnO$_2$, etc. which are conventionally used for the formation of the transparent and conductive layer of conventional photosensors.

The photosensor thus configured are significantly advantageous in that an excellent pin junction is provided for the semiconductor active layer because each of the n-type, i-type and p-type semiconductor layers is constituted by the specific silicon- or/and Germanium semiconductor having a small average radius as for the microvoids present therein and a small microvoid density which is dense in texture and the dopant (the impurity in other words) contained in each of the n-type and p-type semiconductor layers is effectively prevented from dispersing into the i-type semiconductor layer; the metal atoms contained in the transparent and conductive layer is effectively prevented from dispersing into the p-type semiconductor layer or the n-type semiconductor layer; and as a result, improved photosensor characteristics are provided since incident light is substantially absorbed by the i-type semiconductor layer while being slightly absorbed by each of the p-type and n-type semiconductor layers. Particularly, the photosensor is significantly advantageous in that it stably and continuously provides desirable photosensor characteristics while exhibiting an improved sensitivity to light without causing a residual image even after repeated use over a long period of time, wherein a noise due to dark current is slightly caused upon the application of a reverse bias.

In a preferred embodiment, the i-type semiconductor layer is composed of one of the non-single crystalline Ge(H,X) and SiGe(H,X) semiconductors according to the present invention which has a smaller forbidden band width than that of the semiconductor by which each of the n-type and p-type semiconductor layers. In this case, a pronounced effect is provided in that the occurrence of the noise due to dark current upon the application of a reverse bias is markedly diminished.

The advantages of the present invention will be described in more detail by reference to the following examples and comparative examples.

Example 1 and Comparative Example 1

Example 1

There was prepared a solar cell of the configuration shown in FIG. 2.

There was firstly provided a stainless steel plate (commercially available under the trademark SUS 304) of 50 mm×50 mm in size and 1 mm in thickness having a mirror ground surface as the substrate 201. On the mirror ground surface of the stainless steel plate, there was formed a 0.1 μm thick Ag film as the reflective layer by means of a conventional sputtering technique, followed by forming a 1 μm thick ZnO film as the reflection promotion layer by means of a conventional vacuum evaporation technique.

Then, on the ZnO film thus formed, there was formed a semiconductor active layer comprising an n-type semiconductor layer 202, an i-type semiconductor layer 203 and a p-type semiconductor layer 204, each comprising a silicon-containing non-single crystalline semiconductor according to the present invention, wherein each of the n-type, i-type and p-type semiconductor layers was formed in the same manner as in the foregoing Experiment 2.

Successively, there was formed a 70 nm thick ITO film as the transparent and conductive layer 205 on the p-type semiconductor layer 204 in the same manner as in Experiment 2, followed by forming a 2 μm thick Al film as the collecting electrode 206 on the ITO film by means of a conventional electron beam evaporation technique.

Thus, there was obtained a solar cell (SC Sample Ex. 1).

Comparative Example 1

The procedures of Example 1 were repeated, except that the n-type semiconductor layer, the i-type semiconductor layer and the p-type semiconductor layer were formed in the same manner as in the foregoing Comparative Experiment 2, to thereby obtain a comparative solar cell (SC Sample Comp. Ex. 1).

Evaluation

For each of the SC Sample Ex. 1 and SC Sample Comp. Ex. 1, the initial solar cell characteristics were evaluated by irradiating the sample with AM-1.5 light (100 mW/cm$^2$). As a result, the SC Sample Ex. 1 exhibited a photoelectric conversion efficiency as much as 1.22 times over that exhibited by the SC Sample Comp. Ex. 1.

Further, each sample was irradiated with AM-1.5 light (100 mW/cm$^2$) continuously for 100 hours, and its photoelectric conversion efficiency was examined. As a result, the SC Sample Ex. 1 exhibited a photoelectric conversion efficiency as much as 1.45 times over that exhibited by the SC Sample Comp. Ex. 1.

From the results obtained, it was found that the solar cell in which the non-single crystalline silicon-containing semiconductor according to the present invention excels in solar cell characteristics.

Example 2 and Comparative Example 2

Example 2

There was prepared a photosensor of the configuration shown in FIG. 4.

There was firstly provided a stainless steel plate (commercially available under the trademark SUS 304) of 50 mm×50 mm in size and 1 mm in thickness having a mirror ground surface as the substrate 401. On the mirror ground surface of the stainless steel plate, there was formed a 0.1 μm thick Ag film as the reflective layer by means of a conventional sputtering technique, followed by forming a 1 μm thick ZnO film as the reflection promotion layer by means of a conventional vacuum evaporation technique.

Then, on the ZnO film thus formed, there was formed a semiconductor active layer comprising an n-type semiconductor layer 402, an i-type semiconductor layer 403 and a p-type semiconductor layer 404, each comprising a silicon-containing non-single crystalline semiconductor according to the present invention, wherein each of the n-type, i-type and p-type semiconductor layers was formed in the same manner as in the foregoing Experiment 2.

Successively, there was formed a 100 nm thick ITO film as the transparent and conductive layer 405 on the p-type semiconductor layer 404 in the same manner as in Experiment 2.

Thus, there was obtained a photosensor (PS Sample Ex. 2).

Comparative Example 2

The procedures of Example 2 were repeated, except that the n-type semiconductor layer, the i-type semiconductor layer and the p-type semiconductor layer were formed in the same manner as in the foregoing Comparative Experiment 1, to thereby obtain a comparative photosensor (PS Sample Comp. Ex. 2).

Evaluation

For each of the PS Sample Ex. 2 and the PS Sample Comp. Ex. 2, the photosensor characteristics were evaluated.

That is, each sample was irradiated intermittently with light from a green light diode, wherein a transient build-up current and a transient current were measured by means of a commercially available oscilloscope of 2430 type (produced by Sony Techtronics Company), whereby its response characteristic to light was evaluated.

As a result, the PS Sample Ex. 2 was found to posses a response characteristic to light as much as 2.2 times over that of the PS Comp. Ex. 2.

From the results obtained, the photosensor in which the non-single crystalline silicon-containing semiconductor according to the present invention is used excels in photosensor characteristics.

Example 3 and Comparative Example 3

Example 3

There was prepared a thin film transistor of the configuration shown in FIG. 3.

On an insulating substrate 301 comprising a barium boro-silicate glass No. 7059 (produced by Corning Company) of 50 mm×50 mm in size and 0.8 mm in thickness, a gate electrode 302 of 100 nm in thickness, 16 μm in width and 100 μm in length comprising a chromium film was formed by means of a conventional electron beam evaporation technique, followed by forming an insulating layer 303 of 500 nm in thickness, 50 μm in width and 100 μm in length comprising a silicon nitride film so as to cover the gate electrode 302 by means of a conventional glow discharge decomposition technique. On the insulating layer 303 was formed a semiconductor active layer 304 of 500 nm in thickness, 50 μm in width and 100 μm in length comprising an i-type semiconductor film composed of an non-single crystalline silicon-containing semiconductor according to the present invention was formed following the procedures of forming the i-type semiconductor layer in the foregoing Experiment 2. Then, on the semiconductor active layer 304, there were spacedly formed a source electrode 305 and a drain electrode 306 each comprising a chromium film 100 nm in thickness, 10 μm in width and 100 μm in length by means of a conventional electron beam evaporation technique, wherein a space of 10 μm was provided between the two electrodes.

Thus, there was obtained a thin film transistor (TFT Sample Ex. 3).

Comparative Example 3

The procedures of Example 3 were repeated, except that the semiconductor active layer 304 was composed of an i-type non-single crystalline silicon-containing semiconductor formed by repeating the procedures of forming the i-type non-single crystalline silicon-containing semiconductor in the foregoing Comparative Experiment 2, to thereby obtain a comparative thin film transistor (TFT Sample Comp. Ex. 3).

Evaluation

As for each of the TFT Sample Ex. 3 and the TFT Sample Comp. Ex. 3, there was measured an electric current flown between the drain electrode and the source electrode by applying a predetermined voltage between the gate electrode and the source electrode, using a commercially available picoammeter (pA meter) (produced by Yokokawa-Hewllet Packard Company). Based on the results obtained, an on-current and an on-off ratio were evaluated.

As a result, the TFT Sample Ex. 3 was found to surpass the TFT Sample Comp. Ex. 3 by as much as 3.2 times with respect to the on-current and as much as 4.3 times with respect to the on-off ratio.

From the results obtained, the thin film transistor in which the non-single crystalline silicon-containing semiconductor according to the present invention is used excels in thin film transistor characteristics.

Example 4 and Comparative Example 4

Example 4

Figure 11:
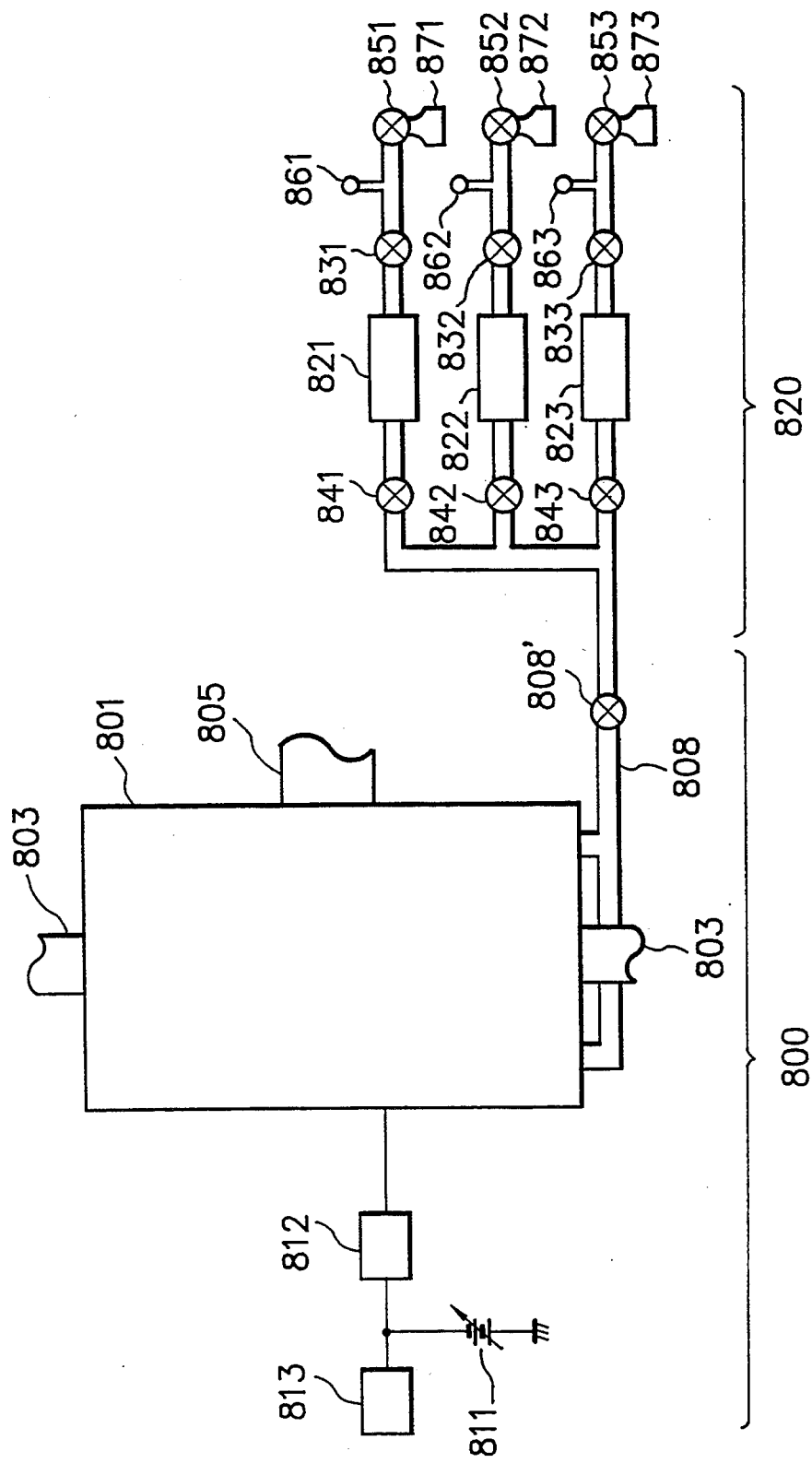
FIG. 11 is a schematic explanatory view of a microwave plasma CVD apparatus which is suitable for the production of an electrophotographic light receiving device provided with a light receiving layer comprising a silicon-containing non-single crystalline semiconductor according to the present invention or a conventional electrophotographic light receiving device provided with a light receiving layer comprising a conventional silicon-containing non-single crystalline semiconductor.
Figure 12:
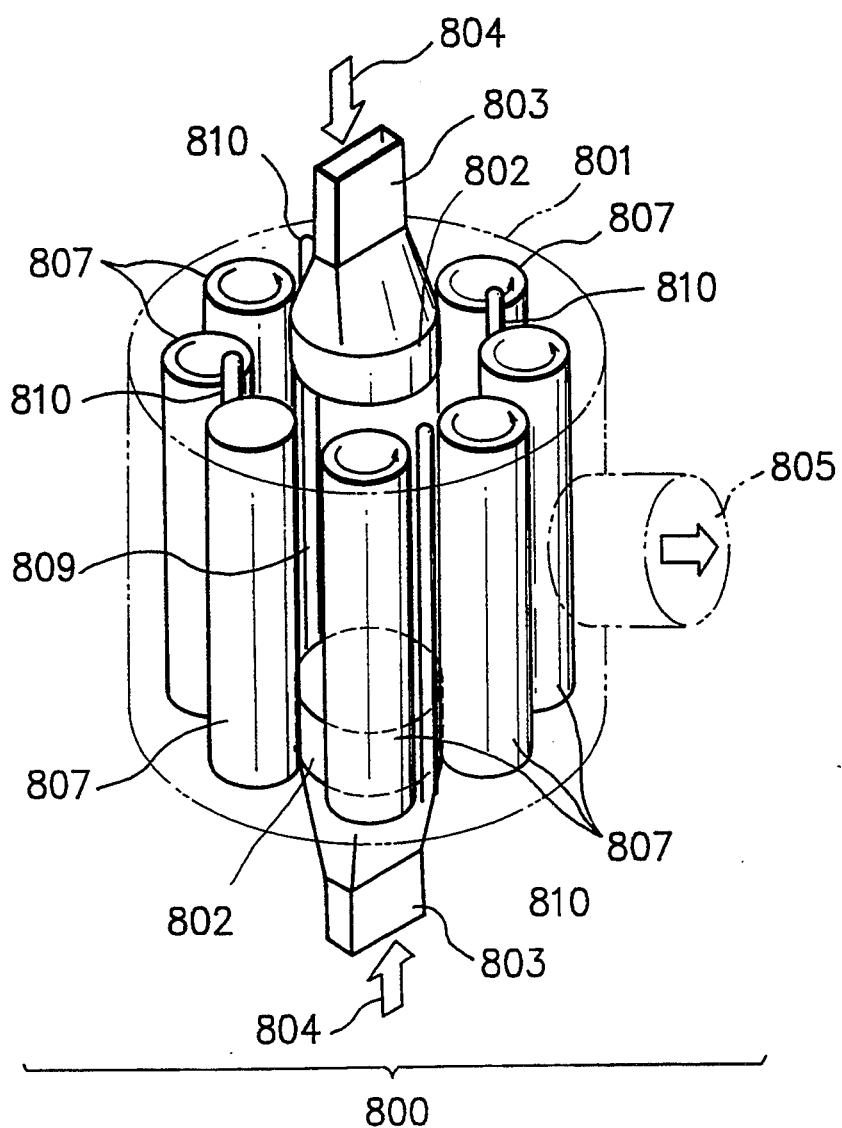
FIG. 12 is a schematic explanatory view of other microwave plasma CVD apparatus which is suitable for the production of an electrophotographic light receiving device provided with a light receiving layer comprising a silicon-containing non-single crystalline semiconductor according to the present invention or a conventional electrophotographic light receiving device provided with a light receiving layer comprising a conventional silicon-containing non-single crystalline semiconductor.

(1) Preparation of electrophotographic light receiving device:

There was prepared an electrophotographic light receiving device of the configuration shown in FIG. 1 in which some of the silicon-containing non-single crystalline semiconductors according to the present invention are used, using a microwave plasma CVD apparatus shown in FIGS. 11 and 12.

The microwave plasma CVD apparatus shown in FIGS. 11 and 12 comprises a raw material gas supply system 820 and a film formation system 800.

The film formation system 800 includes a deposition chamber 801 containing a plurality of cylindrical rotary substrate holders each having a cylindrical substrate 807 thereon (see, FIG. 12). Each of the substrate holders has a heater installed therein. Reference numeral 803 indicates a waveguide extending from a microwave power source (not shown). Reference numeral 804 (see, FIG. 12) indicates a microwave from the microwave power source. The waveguide 803 is connected to a microwave transmissive window 802 hermetically mounted at either an upper wall or a lower wall of the deposition chamber 801. Reference numeral 809 indicates a discharge space situated in the deposition chamber 801. The cylindrical substrate holders each having the cylindrical substrate 807 thereon are spacedly arranged so as to circumscribe the discharge space 809 in the deposition chamber 801. Reference numeral 810 is a gas feed pipe provided with a plurality of gas liberation holes (not shown) capable of introducing a film-forming raw material gas into the discharge space 809. The gas feed pipes 810 are connected to a gas transportation conduit 808 which is extending from the gas supply system 820 (see, FIG. 11).

The deposition chamber 801 is provided with an exhaust pipe 805 (see, FIG. 11) which is connected through a conductance valve (not shown) to a vacuum pump (not shown). Reference numeral 813 indicates a RF power source which is electrically connected through a matching box 812 to the deposition chamber 801. Reference numeral 811 indicates a direct current (DC) power source which is also connected to the deposition chamber 801.

The gas supply system 820 (see, FIG. 11) contains gas reservoirs 871, 872 and 873 which are charged with film-forming raw material gases for forming the respective layers, particularly, SiH$_4$ gas of 99.99% in purity in the gas reservoir 871, heavy hydrogen gas (D$_2$ gas) of 99.6% in purity in the gas reservoir 872, and gas comprising B$_2$H$_6$ gas (purity: 99.999%) diluted with H$_2$ gas to a 1% concentration (hereinafter referred to as "B$_2$H$_6$/H$_2$ (1%)") in the gas reservoir 873. Each of the gas reservoirs 871, 872 and 873 is connected to the gas transportation conduit 808 through a pipe way provided with a valve 851, 852 or 853, a pressure gage 861, 862 or 863, an inlet valve 831, 832 or 833, a mass flow controller 821, 822 or 823, and an exit valve 841, 842 or 843. The gas transportation conduit 808 is provided with a sub-valve 808'.

In this example, a cylindrical aluminum substrate of 108 mm in outer diameter, 358 mm in length and 5 mm in thickness having a mirror ground surface on which a film is to be formed was used as the cylindrical substrate 807.

The cylindrical aluminum substrate was positioned on each of the cylindrical substrate holders of the deposition chamber 801. On each of the aluminum cylindrical substrates 807, there were formed an charge injection inhibition layer and a photoconductive layer in the following manner.

Now, in the case of conducting film formation in the microwave plasma CVD apparatus shown in FIG. 11 and 12, prior to the entrance of raw material gases into the deposition chamber 801, it is confirmed that the valves 851 through 853 is closed and that the inlet valves 831 through 833, the exit valves 841 through 843, and the sub-valve 808' are opened. Then, the conductance valve (not shown) for the exhaust pipe 805 is opened to evacuate the inside of the deposition chamber 801 and gas piping while operating the vacuum pump (not shown). Then, upon observing that the reading on a vacuum gage (not shown) disposed at the deposition chamber 801 became about $1 \times 10^{-7}$ Torr, the sub-valve 808' and the exit valves 841 through 843 are closed.

Each of the charge injection inhibition layer and the photoconductive layer was formed as follows.

That is, the inside of the deposition chamber 801 was firstly evacuated to a vacuum of about $1 \times 10^{-7}$ Torr by operating the vacuum pump in the manner as above described while rotating all the cylindrical substrate holders by means of a driving motor (not shown).

Firstly, there was formed the charge injection inhibition layer on each of the cylindrical substrates 807 in the following manner.

Each of the cylindrical substrates 807 was heated to and maintained at 300° C. by actuating the heater (not shown) installed in each of the cylindrical substrate holders. Then, the valves 851 through 853 and the exit valves 841 through 843 were opened. And the inlet valves 831 through 833 and the sub-valve 808' were gradually opened to introduce SiH$_4$ gas, D$_2$ gas and B$_2$H$_6$/H$_2$ (1%) gas into the discharge space 809 through the gas liberation holes of each of the gas feed pipes 810, when the flow rates of these gases were regulated at respective flow rates of 200 sccm, 1000 sccm and 10 sccm by means of the mass flow controllers 821 through 823. The inner pressure of the deposition chamber 801 was adjusted to 1 mTorr by adjusting the opening of the conductance valve while reading the vacuum gage (not shown) disposed at the deposition chamber 801. After the flow rate of each of the above raw material gases became stable at the respective values, the DC power source 811 was switched on to apply a DC bias voltage of $-120$ V into the deposition chamber 801, simultaneously with this, the RF power source 813 was switched on to apply a RF power of 40 mW/cm$^3$ into the deposition chamber 801 through the matching box 812. At the same time, the microwave power source (not shown) was switched on to apply a microwave power of 800 mW/cm$^3$ into the discharge space 809 through the waveguide 803 and the microwave transmissive window 802. As a result, discharge occurred in the discharge space 809 wherein the SiH$_4$ gas, D$_2$ gas and B$_2$H$_6$/H$_2$ (1%) gas introduced were decomposed to cause plasma, resulting in forming a non-single crystalline Si:H:B film on each of the cylindrical substrates 807. In this case, the film formation was continued until each of the non-single crystalline Si:H:B films became 3 μm thick.

Thus, the formation of the charge injection inhibition layer on each of the cylindrical substrates was completed.

Thereafter, the microwave power source, the RF power source, and the DC power source were switched off. And the inlet valves 831 through 833 and the sub-valve 808' were closed.

Then, the photoconductive layer was formed in the following manner.

That is, the deposition chamber 801 was evacuated to bring the inside to a vacuum of about $1 \times 10^{-7}$ Torr in the same manner as in the case of the charge injection inhibition layer while maintaining each of the cylindrical substrates 807 at 300° C. Then, the sub-valve 808' was opened. And the inlet valves 831 and 832 were gradually opened to introduce SiH$_4$ gas and D$_2$ gas into the discharge space 809 through the gas liberation holes of each of the gas feed pipes 810, when the flow rates of these gases were regulated at respective flow rates of 200 sccm and 1200 sccm by means of the mass flow controllers 821 and 822. The inner pressure of the deposition chamber 801 was adjusted to 1 mTorr by adjusting the opening of the conductance valve while reading the vacuum gage (not shown). After the flow rate of each of the above raw material gases became stable at the respective values, the DC power source 811 was switched on to apply a DC bias voltage of $-120$ V into the deposition chamber 801, simultaneously with this, the RF power source 813 was switched on to apply a RF power of 50 mW/cm$^3$ into the deposition chamber 801 through the matching box 812. At the same time, the microwave power source (not shown) was switched on to apply a microwave power of 800 mW/cm$^3$ into the discharge space 809 through the waveguide 803 and the microwave transmissive window 802. As a result, discharge occurred in the discharge space 809 wherein the SiH$_4$ gas and D$_2$ gas introduced were decomposed to cause plasma, resulting in forming a non-single crystalline Si:H film on the charge injection inhibition layer previously formed on each of the cylindrical substrates 807. In this case, the film formation was continued until each of the non-single crystalline Si:H films became 25 μm thick.

Thus, the formation of the photoconductive layer on each of the cylindrical substrates was completed.

Thereafter, the microwave power source, the RF power source, and the DC power source were switched off. And the inlet valves 831 and 832 and the sub-valve 808' were closed. And the cylindrical substrates 807 each having the charge injection inhibition layer and the photoconductive layer being laminated in this order thereon were cooled to room temperature and they were taken out from the deposition chamber 801.

Thus, there were obtained a plurality of electrophotographic light receiving devices (EP Sample Ex. 4).

(2) Preparation of film sample for examination:

There were prepared a plurality of film samples for the purpose of examining microviods contained in a film.

There were provided a plurality of cylindrical aluminum substrate of 108 mm in outer diameter, 358 mm in length and 5 mm in thickness each having a 10 μm thick high purity aluminum foil of 5 mm×5 mm in size fixed thereon.

The cylindrical aluminum substrate having the aluminum foil thereon was positioned on each of the cylindrical substrate holders of the deposition chamber 801. On each of the aluminum foils, a 3 μm thick non-single crystalline Si:H film was formed by repeating the above procedures of forming the photoconductive layer.

Thus, there were obtained a plurality of film samples (Film Sample Ex. 4).

Comparative Example 4

(1) Preparation of comparative electrophotographic light receiving device:

The procedures of Example 4-(1) were repeated, except that the gas reservoir 872 containing D$_2$ gas was replaced by other gas reservoir containing H$_2$ gas (purity: 99.9999%), to thereby obtain a plurality of comparative electrophotographic light receiving devices (PH Sample Comp. Ex. 4).

(2) Preparation of comparative film sample for examination:

The procedures of Example 4-(2) were repeated, except that the gas reservoir 872 containing D$_2$ gas was replaced by other gas reservoir containing H$_2$ gas (purity: 99.9999%), to thereby obtain a plurality of comparative film samples (Comparative Film Sample Comp. Ex. 4).

Evaluation

Evaluation of each of the PH Sample Ex. 4 and the comparative PH Sample Comp. Ex. 4

Each of the PH Sample Ex. 4 and the comparative PH Sample Comp. Ex. 4 was evaluated with respect to (a) charge retentivity, (b) photosensitivity, (c) temperature characteristic, (d) photomemory, and (e) image uniformity respectively in the following manner, wherein a modification for experimental purposes of a commercially available electrophotographic copying machine NP-8580 (produced by Canon Kabushiki Kaisha) was used.

The evaluation of the charge retentivity (a) was conducted based on an electric potential in dark measured by subjecting the sample to charging under the fixed condition using the above copying machine.

The evaluation of the photosensitivity (b) was conducted in the following manner, using the above copying machine. That is, the charging condition is adjusted so that an identical electric potential in dark is provided. Then, light of a fixed quantity is irradiated to the sample, wherein an electric potential in light is measured. On the basis of the result obtained, a difference between the electric potential in light and the electric potential in dark is observed.

The evaluation of the temperature characteristic (c) was conducted in the following manner, using the above copying machine. That is, an electric potential in dark of the sample is measured while maintaining the sample at 25° C. An electric potential in dark of the sample while maintaining the sample at 44° C. Then, the ratio of a change between the former electric potential and the latter electric potential is observed.

The evaluation of the photomemory (d) was conducted in the following manner, using the above copying machine. That is, fluorescence from a fluorescent lamp of 1500 lux is irradiated to a portion of the sample. The sample thus treated is subjected to image formation using a G-Test Sheet-CFY9-9042-020 produced by Canon Kabushiki Kaisha (halftone original) as the original. As for the copied images obtained, an optical density of the image reproduced by the portion of the sample irradiated with the fluorescence and an optical density of the image reproduced by the remaining portion not irradiated with the fluorescence are measured using a RD-100R Macbeth densitometer (produced by Macbeth Co., Ltd.). A difference between the two optical densities is observed.

The evaluation of the image uniformity (e) was conducted in the following manner, using the above copying machine. That is, the sample is subjected to image formation using the above-mentioned halftone original. As for the resultant, the optical density at each of 100 selected areas of 0.05 mm in diameter is examined using the above Macbeth densitometer. On the basis of the results obtained, the situation of unevenness in optical density of the copied images obtained is observed.

The evaluated results of the evaluation items (a) to (e) were as follows.

That is, in the evaluation of the charge retentivity (a), the PH Sample Ex. 4 was found to exhibit a charge retentivity as much as 1.5 times over that exhibited by the comparative PH Sample Comp. Ex. 4.

In the evaluation of the photosensitivity (b), the PH Sample Ex. 4 was found to exhibit a photosensitivity as much as 1.1 times over that exhibited by the comparative PH Sample Comp. Ex. 4.

In the evaluation of the temperature characteristic (c) (that is, the ratio of a change in electric potential in dark), the PH Sample Ex. 4 was found to possess a temperature characteristic which is 0.55 time smaller than that of the comparative PH Sample Comp. Ex. 4.

In the evaluation of the photomemory (d) (that is, the difference between an optical density of the image reproduced by the portion of the sample irradiated with the fluorescence and an optical density of the image reproduced by the remaining portion not irradiated with the fluorescence), the density difference in the case of the PH Sample Ex. 4 was found to be 0.45 time smaller than that in the case of the comparative PH Sample Comp. Ex. 4.

In the evaluation of the image uniformity (e) (that is, the situation of unevenness in optical density of the copied images obtained), the unevenness of the copied images obtained by the PH Sample Ex. 4 was found to be 0.65 time smaller than that of the copied images obtained by the comparative PH Sample Comp. Ex. 4.

In addition to the above evaluations, each of the PH Sample Ex. 4 and the comparative PH Sample Comp. Ex. 4 was evaluated with respect to image quality in the following manner.

That is, the sample is set to the foregoing electrophoto commercially available electrophotographic copying machine, wherein image formation is performed using a Test Sheet NA-7 produced by Canon Kabushiki Kaisha (which contains minute chinese characters) as the original to obtain copied images. The copied images obtained are examined by eyes with respect to (i) resolution, (ii) reproduction of minute characters comprised of fine lines, (iii) occurrence of coarse image, (iv) density difference among images reproduced, (v) halftone reproduction, and (vi) uniformity among images reproduced.

The images reproduced by the PH Sample Ex. 4 were found to be satisfactory with respect to any of the evaluation items (i) to (vi) and to surpass those reproduced by the comparative PH Sample Comp. Ex. 4 with respect to any of the evaluation items (i) to (vi).

Particularly, the PH Sample Ex. 4 reproduced high quality images excelling in resolution, reproduction of minute characters comprised of fine lines, halftone reproduction, and uniformity among images reproduced without occurrence of a coarse image and density-difference among images reproduced even at the initial stage; on the other hand, the PH Sample Comp. Ex. 4 did not reproduce such high quality images at the initial stage.

Evaluation of each of the Film Sample Ex. 4 and the comparative Film Sample Comp. Ex. 4

As for each of the two film samples, the average radius of microvoids contained therein and the density of the microvoids were examined in the same manner as in the foregoing Experiment 1 using a small angle X-ray scattering instrument.

As a result, it was found that the Film Sample Ex. 4 is of 2.7 Å in average radius and $5.5 \times 10^{18}$ $(cm^{-3})$ in density with respect to the microvoids contained therein, and the comparative Film Sample Comp. Ex. 4 is of 3.8 Å in average radius and $2.4 \times 10^{19}$ $(cm^{-3})$ as for the microvoids contained therein.

In combination of the results obtained in this evaluation and the foregoing results obtained in the evaluation of the electrophotographic light receiving device, it is understood that when the silicon-containing non-single crystalline semiconductor with an average radius of 2.7 Å (which is less than 3.5 Å) and a density of $5.5 \times 10^{18}$ $(cm^{-3})$ (which is less than $1 \times 10^{19}$ $(cm^{-3})$) as for the microvoids contained therein according to the present invention is used in the preparation of an electrophographic light receiving device, there is afforded a desirable electrophotographic light receiving device which excels in electrophographic characteristics required for an electrophotographic light receiving device.

Example 5 and Comparative Example 5

Example 5

There was prepared a solar cell of the configuration shown in FIG. 2.

There was firstly provided a stainless steel plate (commercially available under the trademark SUS 304) of 50 mm × 50 mm in size and 1 mm in thickness having a mirror ground surface as the substrate 201. On the mirror ground surface of the stainless steel plate, there was formed a 0.1 μm thick Ag film as the reflective layer by means of a conventional sputtering technique, followed by forming a 1 um thick ZnO film as the reflection promotion layer by means of a conventional vacuum evaporation technique.

Then, on the ZnO film thus formed, there was formed a semiconductor active layer comprising an n-type semiconductor layer 202 composed of an n-type non-single crystalline Si:H semiconductor according to the present invention, an i-type semiconductor layer 203 composed of an i-type non-single crystalline SiGe:H semiconductor according to the present invention and a p-type semiconductor layer 204 composed of a p-type non-single crystalline semiconductor according to the present invention, wherein each of the n-type, i-type and p-type semiconductor layers was formed in the same manner as in the foregoing Experiment 7 under the conditions shown in Table 25.

Successively, there was formed a 70 nm thick ITO film as the transparent and conductive layer 205 on the p-type semiconductor layer 204 in the same manner as in Experiment 2, followed by forming a 2 μm thick Al film as the collecting electrode 206 on the ITO film by means of a conventional electron beam evaporation technique.

Thus, there was obtained a solar cell (SC Sample Ex. 5).

Comparative Example 5

The procedures of Example 5 were repeated, except that the n-type semiconductor layer, the i-type semiconductor layer and the p-type semiconductor layer were formed in the same manner as in the foregoing Comparative Experiment 7 under the conditions shown in Table 26, to thereby obtain a comparative solar cell (SC Sample Comp. Ex. 5).

Evaluation

For each of the SC Sample Ex. 5 and the SC Sample Comp. Ex. 5, the initial solar cell characteristics were evaluated by irradiating the sample with AM-1.5 light (100 mW/cm$^2$). As a result, the SC Sample Ex. 5 exhibited a photoelectric conversion efficiency as much as 1.31 times over that exhibited by the SC Sample Comp. Ex. 5.

Further, each sample was irradiated with AM-1.5 light (100 mW/cm$^2$) continuously for 100 hours, and its photoelectric conversion efficiency was examined. As a result, the SC Sample Ex. 5 exhibited a photoelectric conversion efficiency as much as 1.6 times over that exhibited by the SC Sample Comp. Ex. 5.

From the results obtained, it was found that the solar cell in which the non-single crystalline silicon-containing semiconductor according to the present invention excels in solar cell characteristics.

Example 6 and Comparative Example 6

Example 6

There was prepared a photosensor of the configuration shown in FIG. 4.

There was firstly provided a stainless steel plate (commercially available under the trademark SUS 304) of 50 mm×50 mm in size and 1 mm in thickness having a mirror ground surface as the substrate 401. On the mirror ground surface of the stainless steel plate, there was formed a 0.1 um thick Ag film as the reflective layer by means of a conventional sputtering technique, followed by forming a 1 μm thick ZnO film as the reflection promotion layer by means of a conventional vacuum evaporation technique.

Then, on the ZnO film thus formed, there was formed a semiconductor active layer comprising an n-type semiconductor layer 402 composed of an n-type non-single crystalline Si:H semiconductor according to the present invention, an i-type semiconductor layer 403 composed of an i-type non-single crystalline SiGe:H semiconductor according to the present invention and a p-type semiconductor layer 404 composed of a p-type non-single crystalline semiconductor according to the present invention, wherein each of the n-type, i-type and p-type semiconductor layers was formed in the same manner as in Example 5. Successively, there was formed a 100 nm thick ITO film as the transparent and conductive layer 405 on the p-type semiconductor layer 404 in the same manner as in Example 5.

Thus, there was obtained a photosensor (PS Sample Ex. 6).

Comparative Example 6

The procedures of Example 6 were repeated, except that the n-type semiconductor layer, the i-type semiconductor layer and the p-type semiconductor layer were formed respectively in the same manner as in Comparative Example 5, to thereby obtain a comparative photosensor (PS Sample Comp. Ex. 6).

Evaluation

For each of the PS Sample Ex. 6 and the PS Sample Comp. Ex. 6, the photosensor characteristics were evaluated.

That is, each sample was irradiated intermittently with light from a red light diode, wherein a transient build-up current and a transient current were measured by means of a commercially available oscilloscope of 2430 type (produced by Sony Techtronics Company), whereby its response characteristic to light was evaluated.

As a result, the PS Sample Ex. 2 was found to posses a response characteristic to light as much as 2.7 times over that of the PS Comp. Ex. 2.

From the results obtained, the photosensor in which the non-single crystalline semiconductor according to the present invention is used excels in photosensor characteristics.

Example 7 and Comparative Example 7

Example 7

There was prepared a thin film transistor of the configuration shown in FIG. 3.

On an insulating substrate 301 comprising a barium boro-silicate glass No. 7059 (produced by Corning Company), a gate electrode 302 of 100 nm in thickness, 16 μm in width and 100 μm in length comprising a chromium film was formed by means of a conventional electron beam evaporation technique, followed by forming an insulating layer 303 of 500 nm in thickness, 50 μm in width and 100 μm in length comprising a silicon nitride film so as to cover the gate electrode 302 by means of a conventional glow discharge decomposition technique. On the insulating layer 303 was formed a semiconductor active layer 304 of 500 nm in thickness, 50 μm in width and 100 μm in length comprising an i-type semiconductor film composed of an non-single crystalline SiGe:H semiconductor according to the present invention was formed following the procedures of forming the i-type semiconductor layer in Example 5. Then, on the semiconductor active layer 304, there were spacedly formed a source electrode 305 and a drain electrode 306 each comprising a chromium film by means of a conventional electron beam evaporation technique, wherein a space of 10 μm was formed between the two electrodes.

Thus, there was obtained a thin film transistor (TFT Sample Ex. 7).

Comparative Example 7

The procedures of Example 7 were repeated, except that the semiconductor active layer 304 was composed of an i-type non-single crystalline SiGe:H semiconductor formed by repeating the procedures of forming the i-type non-single crystalline semiconductor in Comparative Example 5, to thereby obtain a comparative thin film transistor (TFT Sample Comp. Ex. 7).

Evaluation

As for each of the TFT Sample Ex. 7 and the TFT Sample Comp. Ex. 7, there was measured an electric current flown between the drain electrode and the source electrode by applying a predetermined voltage between the gate electrode and the source electrode, using a commercially available picoammeter (produced by Yokokawa-Hewllet Packard Company). Based on the results obtained, an on-current and an on-off ratio were evaluated.

As a result, the TFT Sample Ex. 7 was found to surpass the TFT Sample Comp. Ex. 7 by as much as 3.7 times with respect to the on-current and as much as 5.1 times with respect to the on-off ratio.

From the results obtained, the thin film transistor in which the non-single crystalline SiGe:H semiconductor according to the present invention is used excels in thin film transistor characteristics.

Example 8 and Comparative Example 8

Example 8

(1) Preparation of electrophotographic light receiving device:

There was prepared an electrophotographic light receiving device of the configuration shown in FIG. 1 in which some of the non-single crystalline semiconductors according to the present invention are used, using a microwave plasma CVD apparatus shown in FIG. 13.

The microwave plasma CVD apparatus shown in FIG. 13 comprises a raw material gas supply system 820 and a film formation system 800.

The film formation system 800 includes a deposition chamber 801 of the constitution shown in FIG. 12 containing a plurality of cylindrical rotary substrate holders each having a cylindrical substrate 807 thereon.

Thus, the constitution of the microwave plasma CVD apparatus shown in FIG. 13 is the same as that of the microwave plasma CVD apparatus shown in FIGS. 11 and 12, except that a gas supply series comprising a gas reservoir 874 containing GeH$_4$ gas and a piping extending from the gas reservoir 874 is added to the gas supply system of the microwave plasma CVD apparatus shown in FIGS. 11 and 12. Particularly, the gas reservoir 874 is connected to the gas transportation conduit 808 through a gas supply pipe way extending from the gas reservoir 874, wherein the gas supply pipe way is provided with a valve 854, a pressure gage 864, an inlet valve 834, a mass flow controller 824, and an exit valve 844.

In the gas supply system 820 (see, FIG. 13), the gas reservoirs 871, 872, 873 and 874 are charged with film-forming raw material gases for forming the respective layers, particularly, SiH$_4$ gas of 99.99% in purity in the gas reservoir 871, heavy hydrogen gas (D$_2$ gas) of 99.6% in purity in the gas reservoir 872, gas comprising B$_2$H$_6$ gas (purity: 99.999%) diluted with H$_2$ gas to a 1% concentration (hereinafter referred to as "B$_2$H$_6$/H$_2$ (1%)") in the gas reservoir 873, and GeH$_4$ gas of 99.999% in purity in the gas reservoir 874. Each of the gas reservoirs 871, 872, 873 and 874 is connected to the gas transportation conduit 808 through the pipe way provided with the valve 851, 852, 853 or 854, the pressure gage 861, 862, 863 or 864, the inlet valve 831, 832, 832 or 834, the mass flow controller 821, 822, 823 or 824, and the exit valve 841, 842 or 843. The gas transportation conduit 808 is provided with the sub-valve 808'.

In this example, a cylindrical aluminum substrate of 108 mm in outer diameter, 358 mm in length and 5 mm in thickness having a mirror ground surface on which a film is to be formed was used as the cylindrical substrate 807.

The cylindrical aluminum substrate was positioned on each of the cylindrical substrate holders of the deposition chamber 801. On each of the aluminum cylindrical substrates 807, there were formed an charge injection inhibition layer and a photoconductive layer in the following manner.

Each of the charge injection inhibition layer and the photoconductive layer was formed as follows.

That is, the inside of the deposition chamber 801 was firstly evacuated to a vacuum of about $1 \times 10^{-7}$ Torr by operating the vacuum pump in the manner as above described while rotating all the cylindrical substrate holders by means of a driving motor (not shown).

Firstly, there was formed the charge injection inhibition layer on each of the cylindrical substrates 807 in the same manner as in Example 4.

That is, each of the cylindrical substrates 807 was heated to and maintained at 300° C. by actuating the heater (not shown) installed in each of the cylindrical substrate holders. Then, the valves 851 through 853 and the exit valves 841 through 843 were opened. And the inlet valves 831 through 833 and the sub-valve 808' were gradually opened to introduce SiH$_4$ gas, D$_2$ gas and B$_2$H$_6$/H$_2$ (1%) gas into the discharge space 809 through the gas liberation holes of each of the gas feed pipes 810, when the flow rates of these gases were regulated at respective flow rates of 200 sccm, 1000 sccm and 10 sccm by means of the mass flow controllers 821 through 823. The inner pressure of the deposition chamber 801 was adjusted to 1 mTorr by adjusting the opening of the conductance valve while reading the vacuum gage (not shown) disposed at the deposition chamber 801. After the flow rate of each of the above raw material gases became stable at the respective values, the DC power source 811 was switched on to apply a DC bias voltage of −120 V into the deposition chamber 801, simultaneously with this, the RF power source 813 was switched on to apply a RF power of 40 mW/cm$^3$ into the deposition chamber 801 through the matching box 812. At the same time, the microwave power source (not shown) was switched on to apply a microwave power of 800 mW/cm$^3$ into the discharge space 809 through the waveguide 803 and the microwave transmissive window 802. As a result, discharge occurred in the discharge space 809 wherein the SiH$_4$ gas, D$_2$ gas and B$_2$H$_6$/H$_2$ (1%) gas introduced were decomposed to cause plasma, resulting in forming a non-single crystalline Si:H:B film on each of the cylindrical substrates 807. In this case, the film formation was continued until each of the non-single crystalline Si:H:B films became 3 μm thick.

Thus, the formation of the charge injection inhibition layer on each of the cylindrical substrates was completed.

Thereafter, the microwave power source, the RF power source, and the DC power source were switched off. And the inlet valves 831 through 833 and the sub-valve 808' were closed.

Then, the photoconductive layer was formed in the same manner as in Example 4, except for using GeH$_4$ gas.

That is, the deposition chamber 801 was evacuated to bring the inside to a vacuum of about $1 \times 10^{-7}$ Torr in the same manner as in the case of the charge injection inhibition layer while maintaining each of the cylindrical substrates 807 at 300° C. Then, the sub-valve 808' was opened. And the inlet valves 831, 832 and 834 were gradually opened to introduce SiH$_4$ gas, D$_2$ gas and GeH$_4$ gas into the discharge space 809 through the gas liberation holes of each of the gas feed pipes 810, when the flow rates of these gases were regulated at respective flow rates of 130 sccm, 1200 sccm and 70 sccm by means of the mass flow controllers 821, 822 and 824. The inner pressure of the deposition chamber 801 was adjusted to 1 mTorr by adjusting the opening of the conductance valve while reading the vacuum gage (not shown). After the flow rate of each of the above raw material gases became stable at the respective values, the DC power source 811 was switched on to apply a DC bias voltage of $-80$ V into the deposition chamber 801, simultaneously with this, the RF power source 813 was switched on to apply a RF power of 50 mW/cm$^3$ into the deposition chamber 801 through the matching box 812. At the same time, the microwave power source (not shown) was switched on to apply a microwave power of 700 mW/cm$^3$ into the discharge space 809 through the waveguide 803 and the microwave transmissive window 802. As a result, discharge occurred in the discharge space 809 wherein the SiH$_4$ gas, D$_2$ gas and GeH$_4$ gas introduced were decomposed to cause plasma, resulting in forming a non-single crystalline SiGe:H film on the charge injection inhibition layer previously formed on each of the cylindrical substrates 807. In this case, the film formation was continued until each of the non-single crystalline SiGe:H films became 25 μm thick.

Thus, the formation of the photoconductive layer on each of the cylindrical substrates was completed.

Thereafter, the microwave power source, the RF power source, and the DC power source were switched off. And the inlet valves 831, 832 and 834 and the sub-valve 808' were closed. And the cylindrical substrates 807 each having the charge injection inhibition layer and the photoconductive layer being laminated in this order thereon were cooled to room temperature and they were taken out from the deposition chamber 801.

Thus, there were obtained a plurality of electrophotographic light receiving devices (EP Sample Ex. 8).

(2) Preparation of film sample for examination:

There were prepared a plurality of film samples for the purpose of examining microvoids contained in a film.

There were provided a plurality of cylindrical aluminum substrate of 108 mm in outer diameter, 358 mm in length and 5 mm in thickness each having a 10 μm thick high purity aluminum foil of 5 mm×5 mm in size fixed thereon.

The cylindrical aluminum substrate having the aluminum foil thereon was positioned on each of the cylindrical substrate holders of the deposition chamber 801. On each of the aluminum foils, a 3 μm thick non-single crystalline SiGe:H film was formed by repeating the above procedures of forming the photoconductive layer.

Thus, there were obtained a plurality of film samples (Film Sample Ex. 8).

Comparative Example 8

(1) Preparation of comparative electrophotographic light receiving device:

The procedures of Example 8-(1) were repeated, except that the gas reservoir 872 containing D$_2$ gas was replaced by other gas reservoir containing H$_2$ gas (purity: 99.9999%), to thereby obtain a plurality of comparative electrophotographic light receiving devices (Comparative PH Sample Comp. Ex. 8).

(2) Preparation of comparative film sample for examination:

The procedures of Example 8-(2) were repeated, except that the gas reservoir 872 containing D$_2$ gas was replaced by other gas reservoir containing H$_2$ gas (purity: 99.9999%), to thereby obtain a plurality of comparative film samples (comparative Film Sample Comp. Ex. 8).

Evaluation

Evaluation of each of the PH Sample Ex. 8 and the comparative PH Sample Comp. Ex. 8

Each of the PH Sample Ex. 8 and the comparative PH Sample Comp. Ex. 8 was evaluated with respect to (a) charge retentivity, (b) photosensitivity, (c) temperature characteristic, (d) photomemory, and (e) image uniformity respectively in the same manner as in Example 4 and Comparative Example 4.

The evaluated results of the evaluation items (a) to (e) were as follows.

That is, in the evaluation of the charge retentivity (a), the PH Sample Ex. 8 was found to exhibit a charge retentivity as much as 1.3 times over that exhibited by the comparative PH Sample Comp. Ex. 8.

In the evaluation of the photosensitivity (b), the PH Sample Ex. 4 was found to exhibit a photosensitivity as much as 1.2 times over that exhibited by the comparative PH Sample Comp. Ex. 8.

In the evaluation of the temperature characteristic (c) (that is, the ratio of a change in electric potential in dark), the PH Sample Ex. 8 was found to possess a temperature characteristic which is 0.45 time smaller than that of the comparative PH Sample Comp. Ex. 8.

In the evaluation of the photomemory (d) (that is, the difference between an optical density of the image reproduced by the portion of the sample irradiated with the fluorescence and an optical density of the image reproduced by the remaining portion not irradiated with the fluorescence), the density difference in the case of the PH Sample Ex. 8 was found to be 0.55 time smaller than that in the case of the comparative PH Sample Comp. Ex. 8.

In the evaluation of the image uniformity (e) (that is, the situation of unevenness in optical density of the copied images obtained), the unevenness of the copied images obtained by the PH Sample Ex. 8 was found to be 0.6 time smaller than that of the copied images obtained by the comparative PH Sample Comp. Ex. 8.

In addition to the above evaluations, each of the PH Sample Ex. 8 and the comparative PH Sample Comp. Ex. 8 was evaluated with respect to image quality, particularly (i) resolution, (ii) reproduction of minute characters comprised of fine lines, (iii) occurrence of coarse image, (iv) density difference among images reproduced, (v) halftone reproduction, and (vi) uniformity among images reproduced in the same manner as in Example 4 and Comparative Example 4.

As a result, the images reproduced by the PH Sample Ex. 8 were found to be satisfactory with respect to any of the evaluation items (i) to (vi) and to surpass those reproduced by the comparative PH Sample Comp. Ex. 8 with respect to any of the evaluation items (i) to (vi).

Particularly, the PH Sample Ex. 8 reproduced high quality images excelling in resolution, reproduction of minute characters comprised of fine lines, halftone reproduction, and uniformity among images reproduced without occurrence of a coarse image and density difference among images reproduced even at the initial stage; on the other hand, the PH Sample Comp. Ex. 8 did not reproduce such high quality images at the initial stage.

Evaluation of each of the Film Sample Ex. 8 and the comparative Film Sample Comp. Ex. 8

As for each of the two film samples, the average radius of microvoids contained therein and the density of the microvoids were examined in the same manner as in the foregoing Experiment 1 using a small angle X-ray scattering instrument.

As a result, it was found that the Film Sample Ex. 8 is of 3.1 Å in average radius and $6.5 \times 10^{18}$ (cm$^{-3}$) in density with respect to the microvoids contained therein, and the comparative Film Sample Comp. Ex. 8 is of 3.9 Å in average radius and $1.7 \times 10^{19}$ (cm$^{-3}$) as for the microvoids contained therein.

In combination of the results obtained in this evaluation and the foregoing results obtained in the evaluation of the electrophotographic light receiving device, it is understood that when the germanium-containing non-single crystalline semiconductor with an average radius of 3.1 Å (which is less than 3.5 Å) and a density of $6.5 \times 10^{18}$ (cm$^{-3}$) (which is less than $1 \times 10^{19}$ (cm$^{-3}$)) as for the microvoids contained therein according to the present invention is used in the preparation of an electrophotographic light receiving device, there is afforded a desirable electrophotographic light receiving device which excels in electrophographic characteristics required for an electrophotographic light receiving device.

TABLE 1

| Sample No. | gas used | flow rate (sccm) |
| --- | --- | --- |
| ES1-1 | B$_2$H$_6$/H$_2$ (10%) | 5 |
| ES1-2 | B$_2$H$_6$/H$_2$ (10%) | 0.5 |
| ES1-3 | B$_2$H$_6$/H$_2$ (10 ppm) | 25 |
| ES1-4 | B$_2$H$_6$/H$_2$ (10 ppm) | 5 |
| ES1-5 | none | none |
| ES1-6 | PH$_3$/H$_2$ (10 ppm) | 5 |
| ES1-7 | PH$_3$/H$_2$ (10 ppm) | 25 |
| ES1-8 | PH$_3$/H$_2$ (10%) | 0.5 |
| ES1-9 | PH$_3$/H$_2$ (10%) | 5 |

TABLE 2

| | | stainless steel member (SUS-304) deposited with Cr film | | | | | |
| --- | --- | --- | --- | --- | --- | --- | --- |
| substrate | gas used and flow rate (sccm) | μW power applied (mW/cm$^3$) | inner pressure (mTorr) | substrate temperature (°C.) | DC bias (V) | RF bias (mW/cm$^3$) | layer thickness (μm) |
| the conditions for the formation of non-single crystalline silicon-containing semiconductor | SiH$_4$ 5<br>D$_2$ 100<br>PH$_3$/H$_2$ (10%)<br>B$_2$H$_6$/H$_2$ (10%)<br>PH$_3$/H$_2$ (10 ppm)<br>B$_2$H$_6$/H$_2$ (10 ppm) | * 70 | 2 | 400 | −100 | 1 | 3 |
| upper electrode | | | | chromium (Cr) | | | |

*shown in Table 1

TABLE 3

| Sample No. | gas used | flow rate (sccm) |
| --- | --- | --- |
| CS1-1 | B$_2$H$_6$/H$_2$ (10%) | 5 |
| CS1-2 | B$_2$H$_6$/H$_2$ (10%) | 0.1 |
| CS1-3 | B$_2$H$_6$/H$_2$ (10 ppm) | 5 |
| CS1-4 | B$_2$H$_6$/H$_2$ (10 ppm) | 1 |
| CS1-5 | none | none |
| CS1-6 | PH$_3$/H$_2$ (10 ppm) | 1 |
| CS1-7 | PH$_3$/H$_2$ (10 ppm) | 5 |
| CS1-8 | PH$_3$/H$_2$ (10%) | 0.1 |
| CS1-9 | PH$_3$/H$_2$ (10%) | 1 |

TABLE 4

| | | stainless steel member (SUS-304) deposited with Cr film | | | |
| --- | --- | --- | --- | --- | --- |
| substrate | gas used and flow rate (sccm) | RF power (mW/cm$^3$) | inner pressure (Torr) | substrate temperature (°C.) | layer thickness (μm) |
| the conditions for the formation of non-single crystalline silicon-containing semiconductor | SiH$_4$ 1<br>H$_2$ 50<br>PH$_3$/H$_2$ (10%)<br>B$_2$H$_6$/H$_2$ (10%)<br>PH$_3$/H$_2$ (10 ppm)<br>B$_2$H$_6$/H$_2$ (10 ppm) | * 1 | 2 | 400 | 3 |
| upper electrode | | | chromium (Cr) | | |

*shown in Table 3

TABLE 5

| | | | stainless steel member (SUS-304) | | | | | |
| --- | --- | --- | --- | --- | --- | --- | --- | --- |
| substrate | | gas used and flow rate (sccm) | μW power applied (mW/cm$^3$) | inner pressure (mTorr) | substrate temperature (°C.) | DC bias (V) | RF bias (mW/cm$^3$) | layer thickness (nm) |
| the conditions for the formation | p-type layer | SiH$_4$ 5<br>D$_2$ 100<br>B$_2$H$_6$/H$_2$ (10%) 5 | 70 | 2 | 400 | −100 | 1 | 10 |

TABLE 5-continued

| | | | | | stainless steel member (SUS-304) | | | |
|---|---|---|---|---|---|---|---|---|
| substrate | | gas used and flow rate (sccm) | μW power applied (mW/cm³) | inner pressure (mTorr) | substrate temperature (°C.) | DC bias (V) | RF bias (mW/cm³) | layer thickness (nm) |
| of each layer | i-type layer | SiH₄ 5<br>D₂ 100 | 70 | 2 | 400 | −100 | 1 | 500 |
| | n-type layer | SiH₄ 5<br>D₂ 100<br>B₂H₆/H₂ 5<br>(10%) | 70 | 2 | 400 | −100 | 1 | 10 |
| transparent and conductive layer | | | | | ITO | | | |

TABLE 6

| | | | stainless steel member (SUS-304) | | | |
|---|---|---|---|---|---|---|
| substrate | | gas used and flow rate (sccm) | RF power (mW/cm³) | inner pressure (Torr) | substrate temperature (°C.) | layer thickness (nm) |
| the conditions for the formation of each layer | p-type layer | SiH₄ 1<br>H₂ 50<br>B₂H₆/H₂ 1<br>(10%) | 5 | 1 | 250 | 10 |
| | i-type layer | SiH₄ 1<br>H₂ 50 | 5 | 1 | 250 | 500 |
| | n-type layer | SiH₄ 1<br>H₂ 50<br>PH₃/H₂ 1<br>(10%) | 5 | 1 | 250 | 10 |
| transparent and conductive layer | | | | ITO | | |

TABLE 7

| sample No. | gas used and flow rate (sccm) |
|---|---|
| ES5-1 | D₂ gas 2.5 |
| ES5-2 | D₂ gas 50 |
| ES5-3 | D₂ gas 500 |
| CS5 | H₂ gas 50 |

TABLE 8

| | | | stainless steel member (SUS-304) | | | | |
|---|---|---|---|---|---|---|---|
| substrate | gas used and flow rate (sccm) | μW power applied (mW/cm³) | inner pressure (mTorr) | substrate temperature (°C.) | DC bias (V) | RF bias (mW/cm³) | layer thickness (μm) |
| the conditions for the formation of non-single crystalline silicon-containing semiconductor | SiH₄ 5<br>D₂<br>H₂ } * | 50 | 2 | 400 | −70 | 2 | 3 |

*shown in Table 7

TABLE 9

| | | | | stainless steel member (SUS-304) | | | | |
|---|---|---|---|---|---|---|---|---|
| substrate | | gas used and flow rate (sccm) | μW power applied (mW/cm³) | inner pressure (mTorr) | substrate temperature (°C.) | DC bias (V) | RF bias (mW/cm³) | layer thickness (nm) |
| the conditions for the formation of each layer | p-type layer | SiH₄ 5<br>D₂ 100<br>B₂H₅/H₂ 5<br>(10%) | 70 | 2 | 400 | −100 | 1 | 5 |
| | i-type layer | SiH₄ 5<br>D₂<br>H₂ } * | 50 | 2 | 400 | −70 | 2 | 500 |
| | n-type layer | SiH₄ 5<br>D₂ 100<br>PH₃/H₂ 5<br>(10%) | 70 | 2 | 400 | −100 | 1 | 5 |
| transparent and conductive layer | | | | ITO | | | | |

*shown in table 7

TABLE 10

| Sample No. | gas used | flow rate (sccm) |
|---|---|---|
| EG1-1 | $B_2H_6/H_2$ (10%) | 5 |
| EG1-2 | $B_2H_6/H_2$ (10%) | 0.5 |
| EG1-3 | $B_2H_6/H_2$ (10 ppm) | 25 |
| EG1-4 | $B_2H_6/H_2$ (10 ppm) | 5 |
| EG1-5 | none | none |
| EG1-6 | $PH_3/H_2$ (10 ppm) | 5 |
| EG1-7 | $PH_3/H_2$ (10 ppm) | 25 |
| EG1-8 | $PH_3/H_2$ (10%) | 0.5 |
| EG1-9 | $PH_3/H_2$ (10%) | 5 |

TABLE 12

| Sample No. | gas used | flow rate (sccm) |
|---|---|---|
| CG1-1 | $B_2H_6/H_2$ (10%) | 5 |
| CG1-2 | $B_2H_6/H_2$ (10%) | 0.1 |
| CG1-3 | $B_2H_6/H_2$ (10 ppm) | 5 |
| CG1-4 | $B_2H_6/H_2$ (10 ppm) | 1 |
| CG1-5 | none | none |
| CG1-6 | $PH_3/H_2$ (10 ppm) | 1 |
| CG1-7 | $PH_3/H_2$ (10 ppm) | 5 |
| CG1-8 | $PH_3/H_2$ (10%) | 0.1 |
| CG1-9 | $PH_3/H_2$ (10%) | 1 |

TABLE 11

| substrate | gas used and flow rate (sccm) | | μW power applied (mW/cm³) | inner pressure (mTorr) | substrate temperature (°C.) | DC bias (V) | RF bias (mW/cm³) | layer thickness (μm) |
|---|---|---|---|---|---|---|---|---|
| stainless steel member (SUS-304) deposited with Cr film | | | | | | | | |
| the conditions for the formation of non-single crystalline germanium-containing semiconductor | $SiH_4$<br>$D_2$<br>$GeH_4$<br>$PH_3/H_2$ (10%)<br>$B_2H_6/H_2$ (10%)<br>$PH_3/H_2$ (10 ppm)<br>$B_2H_6/H_2$ (10 ppm) | 3<br>100<br>2 | * | 60 | 2 | 350 | −90 | 0.8 | 3 |
| upper electrode | chromium (Cr) | | | | | | | |

*shown in Table 10

TABLE 13

| substrate | gas used and flow rate (sccm) | | RF power (mW/cm³) | inner pressure (Torr) | substrate temperature (°C.) | layer thickness (μm) |
|---|---|---|---|---|---|---|
| stainless steel member (SUS-304) deposited with Cr film | | | | | | |
| the conditions for the formation of non-single germanium-containing semiconductor | $SiH_4$<br>$H_2$<br>$GeH_4$<br>$PH_3/H_2$ (10%)<br>$B_2H_6/H_2$ (10%)<br>$PH_3/H_2$ (10 ppm)<br>$B_2H_6/H_2$ (10 ppm) | 1<br>50<br>0.4 | * | 5 | 1 | 250 | 3 |
| upper electrode | chromium (Cr) | | | | | | |

*shown in Table 12

TABLE 14

| substrate | | gas used and flow rate (sccm) | | μW power applied (mW/cm³) | inner pressure (mTorr) | substrate temperature (°C.) | DC bias (V) | RF bias (mW/cm³) | layer thickness (nm) |
|---|---|---|---|---|---|---|---|---|---|
| stainless steel member (SUS-304) | | | | | | | | | |
| the conditions for the formation of each layer | p-type layer | $SiH_4$<br>$D_2$<br>$GeH_4$<br>$B_2H_6/H_2$ (10%) | 3<br>100<br>2<br>5 | 60 | 2 | 350 | −90 | 0.8 | 10 |
| | i-type layer | $SiH_4$<br>$D_2$<br>$GeH_4$ | 3<br>100<br>2 | 60 | 2 | 350 | −90 | 0.8 | 500 |
| | n-type layer | $SiH_4$<br>$D_2$<br>$GeH_4$<br>$PH_3/H_2$ (10%) | 3<br>100<br>2<br>5 | 60 | 2 | 350 | −90 | 0.8 | 10 |
| transparent and conductive layer | | ITO | | | | | | | |

TABLE 15

| substrate | | gas used and flow rate (sccm) | | RF power (mW/cm³) | inner pressure (Torr) | substrate temperature (°C.) | layer thickness (nm) |
|---|---|---|---|---|---|---|---|
| stainless steel member (SUS-304) | | | | | | | |
| the | p-type | $SiH_4$ | 0.6 | 5 | 1 | 250 | 10 |

TABLE 15-continued

| | | | | | | | |
|---|---|---|---|---|---|---|---|
| | | | stainless steel member (SUS-304) | | | | |
| substrate | | gas used and flow rate (sccm) | | RF power (mW/cm$^3$) | inner pressure (Torr) | substrate temperature (°C.) | layer thickness (nm) |
| conditions for the formation of each layer | layer | H$_2$<br>GeH$_4$<br>B$_2$H$_6$/H$_2$ (10%) | 50<br>0.5<br>1 | | | | |
| | i-type layer | SiH$_4$<br>H$_2$<br>GeH$_4$ | 0.6<br>50<br>0.4 | 5 | 1 | 250 | 500 |
| | n-type layer | SiH$_4$<br>H$_2$<br>GeH$_4$<br>PH$_3$/H$_2$ (10%) | 0.6<br>50<br>0.4<br>1 | 5 | 1 | 250 | 10 |
| transparent and conductive layer | | | | | ITO | | |

TABLE 16

| sample No. | gas used and flow rate (sccm) |
|---|---|
| EG5-1 | D$_2$ gas 2.5 |
| EG5-2 | D$_2$ gas 50 |
| EG5-3 | D$_2$ gas 500 |
| CG5 | H$_2$ gas 50 |

TABLE 17

| | | | | | | | | |
|---|---|---|---|---|---|---|---|---|
| | | stainless steel member (SUS-304) | | | | | | |
| substrate | | gas used and flow rate (sccm) | | μW power applied (mW/cm$^3$) | inner pressure (mTorr) | substrate temperature (°C.) | DC bias (V) | RF bias (mW/cm$^3$) | layer thickness (μm) |
| the conditions for the formation of non-single crystalline germanium-containing semiconductor | | SiH$_4$<br>D$_2$<br>H$_2$<br>GeH$_4$ | 3<br><br><br>2 | * | 40 | 2 | 350 | −50 | 2 | 3 |

*shown in Table 16

TABLE 18

| | | | | | | | | | |
|---|---|---|---|---|---|---|---|---|---|
| | | | stainless steel member (SUS-304) | | | | | | |
| substrate | | | gas used and flow rate (sccm) | | μW power applied (mW/cm$^3$) | inner pressure (mTorr) | substrate temperature (°C.) | DC bias (V) | RF bias (mW/cm$^3$) | layer thickness (nm) |
| the conditions for the formation of each layer | p-type layer | SiH$_4$<br>D$_2$<br>GeH$_4$<br>B$_2$H$_5$/H$_2$ (10%) | 3<br>100<br>2<br>5 | 60 | 2 | 350 | −90 | 0.8 | 5 |
| | i-type layer | SiH$_4$<br>D$_2$<br>H$_2$<br>GeH$_4$ | 3<br><br><br>4 | * | 40 | 2 | 350 | −50 | 2 | 500 |
| | n-type layer | SiH$_4$<br>D$_2$<br>GeH$_4$<br>PH$_3$/H$_2$ (10%) | 3<br>100<br>2<br>5 | 60 | 2 | 350 | −90 | 0.8 | 5 |
| transparent and conductive layer | | | | | | ITO | | | |

*shown in Table 16

TABLE 19

| | | | | | | | | |
|---|---|---|---|---|---|---|---|---|
| | stainless steel member (SUS-304) | | | | | | | |
| substrate | gas used and flow rate (sccm) | | μW power applied (mW/cm$^3$) | inner pressure (mTorr) | substrate temperature (°C.) | DC bias (V) | RF bias (mW/cm$^3$) | layer thickness (μm) |
| the conditions for the formation of non-single crystalline | GeH$_4$<br>D$_2$ | 4<br>80 | 30 | 1 | 350 | −60 | 0.5 | 3 |

TABLE 19-continued

| | | stainless steel member (SUS-304) | | | | | |
|---|---|---|---|---|---|---|---|
| substrate | gas used and flow rate (sccm) | μW power applied (mW/cm$^3$) | inner pressure (mTorr) | substrate temperature (°C.) | DC bias (V) | RF bias (mW/cm$^3$) | layer thickness (μm) |
| germanium-containing semiconductor | | | | | | | |

TABLE 20

| | | | | stainless steel member (SUS-304) | | | | | |
|---|---|---|---|---|---|---|---|---|---|
| substrate | | gas used and flow rate (sccm) | | μW power applied (mW/cm$^3$) | inner pressure (mTorr) | substrate temperature (°C.) | DC bias (V) | RF bias (mW/cm$^3$) | layer thickness (nm) |
| the conditions for the formation of each layer | p-type layer | SiH$_4$<br>D$_2$<br>GeH$_4$<br>B$_2$H$_6$/H$_2$<br>(10%) | 3<br>100<br>2<br>5 | 60 | 2 | 350 | −90 | 0.8 | 5 |
| | i-type layer | GeH$_4$<br>D$_2$ | 2<br>100 | 30 | 1 | 350 | −60 | 0.5 | 500 |
| | n-type layer | SiH$_4$<br>D$_2$<br>GeH$_4$<br>PH$_3$/H$_2$<br>(10%) | 3<br>100<br>2<br>5 | 60 | 2 | 350 | −90 | 0.8 | 5 |
| transparent and conductive layer | | | | | | ITO | | | |

TABLE 21

| | | | stainless steel member (SUS-304) | | | |
|---|---|---|---|---|---|---|
| substrate | gas used and flow rate (sccm) | | RF power applied (mW/cm$^3$) | inner pressure (mTorr) | substrate temperature (°C.) | layer thickness (μm) |
| the conditions for the formation of non-single crystalline germanium-containing semiconductor | GeH$_4$<br>H$_2$ | | 0.5<br>30 | 4 | 1 | 250 | 3 |

TABLE 22

| | | | | stainless steel member (SUS-304) | | | |
|---|---|---|---|---|---|---|---|
| substrate | | gas used and flow rate (sccm) | | RF power (mW/cm$^3$) | inner pressure (Torr) | substrate temperature (°C.) | layer thickness (nm) |
| the conditions for the formation of each layer | p-type layer | SiH$_4$<br>H$_2$<br>GeH$_4$<br>B$_2$H$_6$/H$_2$<br>(10%) | 0.6<br>50<br>0.4<br>1 | 5 | 1 | 250 | 10 |
| | i-type layer | GeH$_4$<br>H$_2$ | 0.5<br>30 | 4 | 1 | 250 | 500 |
| | n-type layer | SiH$_4$<br>H$_2$<br>GeH$_4$<br>PH$_3$/H$_2$<br>(10%) | 0.6<br>50<br>0.4<br>1 | 5 | 1 | 250 | 10 |
| transparent and conductive layer | | | | | ITO | | |

TABLE 23

| | | | | stainless steel member (SUS-304) | | | | | |
|---|---|---|---|---|---|---|---|---|---|
| substrate | | gas used and flow rate (sccm) | | μW power applied (mW/cm$^3$) | inner pressure (mTorr) | substrate temperature (°C.) | DC bias (V) | RF bias (mW/cm$^3$) | layer thickness (nm) |
| the conditions for the formation of each layer | charge injection inhibition layer | SiH$_4$<br>D$_2$<br>B$_2$H$_6$/H$_2$<br>(1%) | 200<br>1000<br>10 | 800 | 1 | 300 | −120 | 40 | 3 |
| | photo-conductive | SiH$_4$<br>H$_2$ | 200<br>1200 | 800 | 1 | 300 | −120 | 50 | 25 |

TABLE 23-continued

| | | stainless steel member (SUS-304) | | | | | | |
|---|---|---|---|---|---|---|---|---|
| substrate | | gas used and flow rate (sccm) | μW power applied (mW/cm³) | inner pressure (mTorr) | substrate temperature (°C.) | DC bias (V) | RF bias (mW/cm³) | layer thickness (nm) |
| | layer | | | | | | | |

TABLE 24

| | | stainless steel member (SUS-304) | | | | | | |
|---|---|---|---|---|---|---|---|---|
| substrate | | gas used and flow rate (sccm) | μW power applied (mW/cm³) | inner pressure (mTorr) | substrate temperature (°C.) | DC bias (V) | RF bias (mW/cm³) | layer thickness (nm) |
| the conditions for the formation of each layer | charge injection inhibition layer | SiH₄ 200<br>H₂ 1000<br>B₂H₆/H₂ 10<br>(1%) | 100 | 5 | 300 | −80 | 0 | 3 |
| | photo-conductive layer | SiH₄ 200<br>H₂ 1000 | 100 | 5 | 300 | −80 | 0 | 25 |

TABLE 25

| | | gas used and flow rate (sccm) | μW power applied (mW/cm³) | inner pressure (mTorr) | substrate temperature (°C.) | DC bias (V) | RF bias (mW/cm³) | layer thickness (nm) |
|---|---|---|---|---|---|---|---|---|
| the conditions for the formation of each layer | p-type layer | SiH₄ 5<br>D₂ 100<br>PH₃/H₂ 5<br>(10%) | 70 | 2 | 400 | −100 | 1 | 10 |
| | i-type layer | SiH₄ 5<br>D₂ 100<br>GeH₄ 2 | 60 | 2 | 350 | −90 | 0.8 | 300 |
| | n-type layer | SiH₄ 5<br>D₂ 100<br>B₂H₆/H₂ 5<br>(10%) | 70 | 2 | 400 | −100 | 1 | 10 |

TABLE 26

| | | gas used and flow rate (sccm) | RF power (mW/cm³) | inner pressure (Torr) | substrate temperature (°C.) | layer thickness (nm) |
|---|---|---|---|---|---|---|
| the conditions for the formation of each layer | p-type layer | SiH₄ 1<br>H₂ 50<br>PH₃/H₂ 1<br>(10%) | 5 | 1 | 250 | 10 |
| | i-type layer | SiH₄ 0.6<br>H₂ 50<br>GeH₄ 0.4 | 5 | 1 | 250 | 300 |
| | n-type layer | SiH₄ 1<br>H₂ 50<br>B₂H₆/H₂ 1<br>(10%) | 5 | 1 | 250 | 10 |

TABLE 27

| | | stainless steel member (SUS-304) | | | | | | |
|---|---|---|---|---|---|---|---|---|
| substrate | | gas used and flow rate (sccm) | μW power applied (mW/cm³) | inner pressure (mTorr) | substrate temperature (°C.) | DC bias (V) | RF bias (mW/cm³) | layer thickness (nm) |
| the conditions for the formation of each layer | charge injection inhibition layer | SiH₄ 200<br>D₂ 1000<br>B₂H₆/H₂ 10<br>(1%) | 800 | 1 | 300 | −120 | 40 | 3 |
| | photo-conductive layer | SiH₄ 130<br>D₂ 1200<br>GeH₄ 70 | 700 | 1 | 300 | −80 | 50 | 25 |

TABLE 28

| substrate | | gas used and flow rate (sccm) | | μW power applied (mW/cm³) | inner pressure (mTorr) | substrate temperature (°C.) | DC bias (V) | RF bias (mW/cm³) | layer thickness (nm) |
|---|---|---|---|---|---|---|---|---|---|
| the conditions for the formation of each layer | charge injection inhibition layer | SiH₄<br>H₂<br>B₂H₆/H₂<br>(1%) | 200<br>1000<br>10 | 100 | 5 | 300 | −80 | 0 | 3 |
| | photo-conductive layer | SiH₄<br>H₂<br>GeH₄ | 130<br>1000<br>70 | 90 | 5 | 300 | −80 | 0 | 25 |

What we claim is:

1. A non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less for microvoids contained in said non-single crystalline semiconductor.

2. A non-single crystalline semiconductor according to claim 1, wherein the non-single crystalline semiconductor is an amorphous semiconductor.

3. A non-single crystalline semiconductor according to claim 2 which contains hydrogen atoms in an amount of 1 to 30 atomic %.

4. A non-single crystalline semiconductor according to claim 2 which comprises an amorphous silicon semiconductor containing silicon atoms as a matrix.

5. A non-single crystalline semiconductor according to claim 2 which comprises a microcrystalline semiconductor.

6. A non-single crystalline semiconductor according to claim 5 which comprises a microcrystalline silicon semiconductor containing silicon atoms as a matrix.

7. A non-single crystalline semiconductor according to claim 4 which contains halogen atoms in an amount of 0.1 to 10 atomic %.

8. A non-single crystalline semiconductor according to claim 7 wherein the halogen atoms are fluorine atoms.

9. A non-single crystalline semiconductor according to claim 4 which contains hydrogen atoms in such a state that the area ratio [SiH₂]/[SiH] in terms of Gaussian distributions between the Si—H₂ bond (a peak at 2000 cm$^{-1}$ in IR spectrum) and the Si—H₂ bond (a peak at 2070–2100 cm$^{-1}$ in IR spectrum) is 1/20 or less.

10. A non-single crystalline semiconductor according to claim 9, wherein the amount of the hydrogen atoms is in the range of from 1 to 30 atomic %.

11. A non-single crystalline semiconductor according to claim 2 which comprises an amorphous germanium semiconductor containing germanium atoms as a matrix.

12. A non-single crystalline semiconductor according to claim 2 which comprises a microcrystalline semiconductor.

13. A non-single crystalline semiconductor according to claim 12 which comprises a microcrystalline germanium semiconductor containing germanium atoms as a matrix.

14. A non-single crystalline semiconductor according to claim 11 which contains halogen atoms in an amount of 0.1 to 10 atomic %.

15. A non-single crystalline semiconductor according to claim 14 wherein the halogen atoms are fluorine atoms.

16. A non-single crystalline semiconductor according to claim 11 which contains hydrogen atoms in such a state that the area ratio [GeH₂]/[GeH] in terms of Gaussian distributions between the Ge—H bond (a peak at 1880 cm$^{-1}$ in IR spectrum) and the Ge—H₂ bond (a peak at 1980 cm$^{-1}$ in IR spectrum) is 1/20 or less.

17. A non-single crystalline semiconductor according to claim 16, wherein the amount of the hydrogen atoms is in the range of from 1 to 30 atomic %.

18. A non-single crystalline semiconductor according to claim 1, wherein the non-single crystalline semiconductor is a polycrystalline semiconductor.

19. A non-single crystalline semiconductor according to claim 18 which contains hydrogen atoms in an amount of 0.1 to 10 atomic %.

20. A non-single crystalline semiconductor according to claim 18 which comprises a polycrystalline silicon semiconductor containing silicon atoms as a matrix.

21. A non-single crystalline semiconductor according to claim 20 which contains halogen atoms in an amount of 0.1 to 5 atomic %.

22. A non-single crystalline semiconductor according to claim 21 wherein the halogen atoms are fluorine atoms.

23. A non-single crystalline semiconductor according to claim 20 which contains hydrogen atoms in such a state that the area ratio [SiH₂]/[SiH] in terms of Gaussian distributions between the Si—H bond (a peak at 2000 cm$^{-1}$ in IR spectrum) and the Si—H₂ bond (a peak at 2070–2100 cm in IR spectrum) is 1/10 or less.

24. A non-single crystalline semiconductor according to claim 23, wherein the amount of the hydrogen atoms is in the range of from 0.1 to 10 atomic %.

25. A non-single crystalline semiconductor according to claim 18 which comprises a polycrystalline germanium semiconductor containing germanium atoms as a matrix.

26. A non-single crystalline semiconductor according to claim 25 which contains halogen atoms in an amount of 0.1 to 5 atomic %.

27. A non-single crystalline semiconductor according to claim 26 wherein the halogen atoms are fluorine atoms.

28. A non-single crystalline semiconductor according to claim 25 which contains hydrogen atoms in such a state that the area ratio [GeH₂]/[GeH] in terms of Gaussian distributions between the Ge—H bond (a peak at 1880 cm$^{-1}$ in IR spectrum) and the Ge—H₂ bond (a peak at 1980 cm$^{-1}$ in IR spectrum) is 1/10 or less.

29. A non-single crystalline semiconductor according to claim 28, wherein the amount of the hydrogen atoms is in the range of from 0.1 to 10 atomic %.

30. A non-single crystalline semiconductor according to claim 1 which contains atoms of an element selected from the group consisting of the elements belonging to groups III and V of the periodic table.

31. A non-single crystalline semiconductor which has a stacked structure comprising at least (a) a non-single crystalline semiconductor and (b) other non-single crystalline semiconductor, wherein at least one of said non-single crystalline semiconductors (a) and (b) comprises (c) a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less for microvoids contained therein.

32. A non-single crystalline semiconductor according to claim 31, wherein the non-single crystalline semiconductor (c) has a density of $2 \times 10^{11}$ (cm$^{-2}$) for microvoids present at one of a surface of said non-single crystalline semiconductor (c) and at an interface with one of said non-single crystalline semiconductors (b) and (a).

33. A non-single crystalline semiconductor according to claim 31, wherein the non-single crystalline semiconductor (c) is a non-single crystalline silicon semiconductor containing silicon atoms as a matrix.

34. A non-single crystalline semiconductor according to claim 33, wherein the non-single crystalline silicon semiconductor contains hydrogen atoms in such a state that the area ratio [SiH$_2$]/[SiH] in terms of Gaussian distributions between the Si—H bond (a peak at 2000 cm$^{-1}$ in IR spectrum) and the Si—H$_2$ bond (a peak at 2070–2100 cm$^{-1}$ in IR spectrum) is 1/20 or less.

35. A non-single crystalline semiconductor according to claim 33, wherein the non-single crystalline silicon semiconductor further contains germanium atoms.

36. A non-single crystalline semiconductor according to claim 31, wherein the non-single crystalline semiconductor (c) is a non-single crystalline germanium semiconductor containing germanium atoms as a matrix.

37. A non-single crystalline semiconductor according to claim 36, wherein the non-single crystalline germanium semiconductor contains hydrogen atoms in such a state that the area ratio [GeH$_2$]/[GeH] in terms of Gaussian distributions between the Ge—H bond (a peak at 1880 cm$^{-1}$ in IR spectrum) and the Ge—H$_2$ bond (a peak at 1980 cm$^{-1}$ in IR spectrum) is 1/10 or less.

38. A non-single crystalline semiconductor according to claim 36, wherein said non-single crystalline germanium semiconductor further contains silicon atoms.

39. A non-single crystalline semiconductor according to claim 31, wherein the non-single crystalline semiconductor (c) contains atoms of an element selected from the group consisting of the elements belonging to groups III and V of the periodic table.

40. An electrophotographic light receiving device comprising a substrate and a photoconductive layer disposed on said substrate, characterized in that said photoconductive layer is composed of a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less for microvoids contained in said non-single crystalline semiconductor.

41. An electrophotographic light receiving device according to claim 40, wherein the photoconductive layer has a multi-layered structure comprising a charge transporting layer and a charge generating layer.

42. An electrophotographic light receiving device according to claim 40 which has a charge injection layer interposed between the substrate and the photoconductive layer.

43. An electrophotographic light receiving device according to claim 42, wherein the charge injection inhibition layer is composed of a non-single crystalline semiconductor containing atoms of an element selected from the group consisting of the elements belonging to groups III and V of the periodic table.

44. An electrophotographic light receiving device according to claim 43, wherein the non-single crystalline semiconductor is a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less as for microvoids contained therein, and said non-single crystalline semiconductor contains atoms of an element selected from the group consisting of the elements belonging to groups III and V of the periodic table.

45. An electrophotographic light receiving device according to claim 40 which includes a surface layer disposed on the photoconductive layer.

46. An electrophotographic light receiving device according to claim 45, wherein the surface layer is composed of a material selected from the group consisting of non-single crystalline silicon materials containing at least one kind of atoms selected from the group consisting of carbon atoms, oxygen atoms and nitrogen atoms and boron nitride.

47. A semiconductor device comprising a substrate, a pin or nip junction semiconductor active layer region disposed on said substrate, and a transparent electrode, said pin or nip junction semiconductor layer region comprising (a) a semiconductor layer of one of p-type and n-type, (b) an i-type semiconductor layer and (c) a semiconductor layer of one of n-type and p-type, characterized in that at least one of the semiconductor layers (a) to (c) is composed of a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less as for microvoids contained therein.

48. A semiconductor device according to claim 47, wherein the non-single crystalline semiconductor is amorphous.

49. A semiconductor device according to claim 47, wherein the non-single crystalline semiconductor is polycrystalline.

50. A semiconductor device according to claim 47, wherein one of the n-type semiconductor layer and the p-type semiconductor layer has a forbidden band width which is greater than that of the i-type semiconductor layer.

51. A semiconductor device according to claim 47, wherein the i-type semiconductor layer is composed of a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less as for microvoids contained therein, and one of the n-type semiconductor layer and the p-type semiconductor layer is composed of material selected from other non-single crystalline silicon semiconductors and other non-single crystalline germanium semiconductors.

52. A semiconductor device according to claim 47, wherein the n-type semiconductor layer is composed of a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less for microvoids contained therein, and contains atoms of an element belonging to group III of the periodic table.

53. A semiconductor device according to claim 47, wherein the p-type semiconductor layer is composed of a non-single crystalline semiconductor containing at least one kind of atoms selected from the group consisting of silicon atoms and germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less for microvoids contained therein, and contains atoms of an element belonging to group V of the periodic table.

54. A semiconductor device according to claim 47, wherein the i-type semiconductor layer is of a thickness in the range of from 500 Å to 1 μm in thickness.

55. A semiconductor device according to claim 47, wherein the n-type semiconductor layer and the p-type semiconductor layer are of a thickness in the range of from 10 Å to 1000 Å.

56. A semiconductor device according to claim 47 which includes a reflective layer disposed between the substrate and the pin or nip semiconductor active layer region.

57. A semiconductor device according to claim 47 which includes a reflection promotion layer disposed between the substrate and the pin or nip semiconductor active layer region.

58. A semiconductor device according to claim 47 which includes a collecting electrode.

59. A semiconductor device according to claim 47 which is a solar cell.

60. A semiconductor device according to claim 47 which is a photosensor.

61. A thin film transistor comprising a substrate, a gate electrode, an insulating layer, a semiconductor active layer, a source electrode and a drain electrode, characterized in that said semiconductor active layer is composed of a non-single crystalline semiconductor containing at least one kind of atoms selected from the group consisting of silicon atoms and Germanium atoms as a matrix, and at least one kind of atoms selected from the group consisting of hydrogen atoms and halogen atoms, wherein said non-single crystalline semiconductor has an average radius of 3.5 Å or less and a density of $1 \times 10^{19}$ (cm$^{-3}$) or less for microvoids contained therein.

* * * * *

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

It is certified that error appears in the above-identified patent and that said Letters Patent is hereby corrected as shown below:

ON TITLE PAGE

In [54] Title: "1x10(19)" should read --$1 \times 10^{19}$-- and "(CM-3)" should read --$(CM^{-3})$--.

In [56] References Cited, under U.S. PATENT DOCUMENTS:
"4,615,298  10/1986  Yamazaui" should read
--4,615,298  10/1986  Yamazaki--.

In [56] References Cited, under FOREIGN PATENT DOCUMENTS:
"5948922   3/1984   Japan
4249377   9/1992   Japan
4268721   9/1992   Japan
4318980   11/1992  Japan"   should read --59-48922   3/1984   Japan
4-249377    9/1992   Japan
4-268721    9/1992   Japan
4-318980    11/1992  Japan--.

In [56] References Cited, under OTHER PUBLICATIONS:
"A-SiCiH" should read --A-Si:H--.

COLUMN 1

In Title, "1x10(19)" should read --$1 \times 10^{19}$-- and "(CM-3)" should read --$(CM^{-3})$--.
Line 18, "mirovoids" should read --microvoids--.
Line 34, "mirovoids" should read --microvoids--.

COLUMN 2

Line 28, "of" should read --in--.

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

It is certified that error appears in the above-identified patent and that said Letters Patent is hereby corrected as shown below:

COLUMN 3

Line 38, "provide" should read --to provide--.

COLUMN 4

Line 36, "n-single" should read --non-single--.

COLUMN 5

Line 12, "mirovoids" should read --microvoids--.
Line 22, "cludes" should read --clude--.
Line 27, "mirovoids" should read --microvoids--.
Line 36, "mirovoids" should read --microvoids--.
Line 39, "Germanium" should read --germanium--.
Line 53, "crovoids" should read --crovoid--.

COLUMN 7

Line 25, "microvoides" should read --microvoids--.

COLUMN 9

Line 46, "is" should read --are--.
Line 60, "is hardly occurred" should read --hardly occurs--.

COLUMN 15

Line 10, "equipped" should read --equipped with--.

COLUMN 19

Line 47, "was" should be deleted.

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

Page 3 of 7

It is certified that error appears in the above-identified patent and that said Letters Patent is hereby corrected as shown below:

COLUMN 21

Line 11, "Hewllet Packard" should read --Hewlett-Packard--.

COLUMN 22

Line 55, "was" should be deleted.

COLUMN 23

Line 5, "Gradually" should read --gradually--.
   Line 6, "Gas" (both occurrences) should read --gas--.
   Line 10, "Gases" should read --gases--.
   Line 19, "was" should be deleted.
   Line 47, "501," should read --501, and--.

COLUMN 25

Line 31, "layer," should read --layer were repeated,--.

COLUMN 26

Line 28, "Hewllet" should read --Hewlett--.
   Line 33, "John Willey" should read --John Wiley--.
   Line 62, "Hewllet" should read --Hewlett--.

COLUMN 27

Line 45, "Hewllet" should read --Hewlett--.

COLUMN 32

Line 66, "was" should be deleted.

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

It is certified that error appears in the above-identified patent and that said Letters Patent is hereby corrected as shown below:

COLUMN 34

Line 28, "Hewllet" should read --Hewlett--.
Line 62, "microviod" should read --microvoid--.

COLUMN 36

Line 7, "was" should be deleted.
Line 40, "was" should be deleted.

COLUMN 37

Line 6, "was" should be deleted.

COLUMN 38

Line 50, "layer" should read --layer were repeated--.

COLUMN 39

Line 47, "Hewllet" should read --Hewlett--.
Line 52, "John Willey" should read --John Wiley--.

COLUMN 40

Line 13, "Hewllet" should read --Hewlett--.

COLUMN 43

Line 54, "layer 102" (second occurrence) should read --layer 103--.

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

It is certified that error appears in the above-identified patent and that said Letters Patent is hereby corrected as shown below:

COLUMN 44

Line 38, "Section" should read --section--.

COLUMN 45

Line 29, "angstromes" should read --angstroms--.
Line 60, "cell" should read --cells--.

COLUMN 46

Line 43, "cell" should read --cells--.

COLUMN 47

Line 49, "photosensor" should read --photosensors--.
Line 53, "Germanium" should read --germanium--.
Line 61, "is" should read --are--.

COLUMN 50

Line 20, "was formed" should be deleted.
Line 57, "Hewllet" should read --Hewlett--.

COLUMN 51

Line 10, "are" should read --were--.

COLUMN 52

Line 11, "is" should read --are--.

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

It is certified that error appears in the above-identified patent and that said Letters Patent is hereby corrected as shown below:

COLUMN 53

Line 56, "microviods" should read --microvoids--.
Line 59, "substrate" should read --substrates--.

COLUMN 54

Line 9, "other" should read --another--.
Line 17, "other" should read --another--.

COLUMN 55

Line 50, "chinese" should read --Chinese--.
Line 52, "by eyes" should read --visually--.

COLUMN 59

Line 2, "Hewllet" should read --Hewlett--.

COLUMN 61

Line 12, "simultaneously" should read --and simultaneously--.
Line 42, "microviods" should read --microvoids--.
Line 45, "substrate" should read --substrates--.
Line 65, "other" should read --another--.

COLUMN 62

Line 5, "other" should read --another--.

COLUMN 69

TABLE 15-continued, "$GeH_4$   0.5" should read --$GeH_4$   0.4--.

UNITED STATES PATENT AND TRADEMARK OFFICE
CERTIFICATE OF CORRECTION

PATENT NO. : 5,371,380
DATED : December 6, 1994
INVENTOR(S) : KEISHI SAITO, ET AL.

It is certified that error appears in the above-identified patent and that said Letters Patent is hereby corrected as shown below:

COLUMN 76

Line 46, "2070-2100 cm" should read --2070-2100 $cm^{-1}$--.

COLUMN 78

Line 27, "as" should be deleted.

Signed and Sealed this

Twenty-seventh Day of June, 1995

BRUCE LEHMAN

Attest:

Attesting Officer   Commissioner of Patents and Trademarks